(12) United States Patent
Tokita et al.

(10) Patent No.: US 11,355,506 B2
(45) Date of Patent: Jun. 7, 2022

(54) THROUGH-STACK CONTACT VIA STRUCTURES FOR A THREE-DIMENSIONAL MEMORY DEVICE AND METHODS OF FORMING THE SAME

(71) Applicant: SANDISK TECHNOLOGIES LLC, Addison, TX (US)

(72) Inventors: Hirofumi Tokita, Yokkaichi (JP); Takayuki Maekura, Yokkaichi (JP); Romain Mentek, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/881,346

(22) Filed: May 22, 2020

(65) Prior Publication Data
US 2021/0366920 A1 Nov. 25, 2021

(51) Int. Cl.
*H01L 27/11556* (2017.01)
*H01L 23/528* (2006.01)
(Continued)

(52) U.S. Cl.
CPC .... *H01L 27/11556* (2013.01); *H01L 21/8221* (2013.01); *H01L 23/528* (2013.01);
(Continued)

(58) Field of Classification Search
CPC ......... H01L 27/11556; H01L 27/11519; H01L 27/0207; H01L 27/11524; H01L 21/8221;
(Continued)

(56) References Cited

U.S. PATENT DOCUMENTS 5,915,167 A 6/1999 Leedy
9,673,213 B1 * 6/2017 Yu ........................ H01L 23/535
(Continued)

OTHER PUBLICATIONS

Tokita, H. et al., "Through-Stack Contact Via Structures For A Three-Dimensional Memory Device And Methods Of Forming The Same," U.S. Appl. No. 16/881,401, filed May 22, 2020.
(Continued)

*Primary Examiner* — Galina G Yushina
(74) *Attorney, Agent, or Firm* — The Marbury Law Group PLLC

(57) ABSTRACT

A first-tier structure includes a first vertically alternating sequence of first continuous insulating layers and first continuous sacrificial material layers and a first-tier retro-stepped dielectric material portion overlying first stepped surfaces of the first vertically alternating sequence. A second vertically alternating sequence of second continuous insulating layers and second continuous sacrificial material layers is formed over the first-tier structure. A vertically alternating stack of insulating plates and dielectric material is formed over the first-tier retro-stepped dielectric material portion. Alternatively, dielectric pillar structures may be formed in lieu of the vertically alternating stack. After formation of memory stack structures, electrically conductive layers replace portions of the first and second continuous sacrificial material layers. Contact via structures are formed through the vertically alternating stack or the dielectric pillar structures, through the first retro-stepped dielectric material portion, and directly on a first subset of the electrically conductive layers.

13 Claims, 43 Drawing Sheets

(51) Int. Cl.
*H01L 25/065* (2006.01)
*H01L 23/522* (2006.01)
*H01L 21/822* (2006.01)
*H01L 27/11519* (2017.01)
*H01L 27/11524* (2017.01)

(52) U.S. Cl.
CPC ...... *H01L 23/5226* (2013.01); *H01L 25/0657* (2013.01); *H01L 27/11519* (2013.01); *H01L 27/11524* (2013.01)

(58) Field of Classification Search
CPC ............... H01L 23/528; H01L 23/5226; H01L 25/0657
See application file for complete search history.

(56) References Cited

U.S. PATENT DOCUMENTS

| | | | |
|---|---|---|---|
| 9,806,093 | B2 | 10/2017 | Toyama |
| 9,818,693 | B2 | 11/2017 | Toyama et al. |
| 9,818,759 | B2 | 11/2017 | Kai et al. |
| 9,853,038 | B1 | 12/2017 | Cui et al. |
| 9,881,929 | B1 | 1/2018 | Ravikirthi et al. |
| 9,960,181 | B1 | 5/2018 | Cui et al. |
| 10,038,006 | B2 | 7/2018 | Furihata et al. |
| 10,115,681 | B1 | 10/2018 | Ariyoshi |
| 10,192,784 | B1 | 1/2019 | Cui et al. |
| 10,249,640 | B2 | 4/2019 | Yu et al. |
| 10,269,620 | B2 | 4/2019 | Yu et al. |
| 10,304,852 | B1 | 5/2019 | Cui et al. |
| 10,381,371 | B2 | 8/2019 | Ogawa et al. |
| 10,685,977 | B2 | 6/2020 | Kim et al. |
| 2016/0071876 | A1* | 3/2016 | Mizuno ............. H01L 27/11582 365/185.17 |
| 2016/0307912 | A1 | 10/2016 | Izumi et al. |
| 2017/0179026 | A1 | 6/2017 | Toyama et al. |
| 2017/0179151 | A1 | 6/2017 | Kai et al. |
| 2017/0179152 | A1 | 6/2017 | Toyama et al. |
| 2017/0179153 | A1 | 6/2017 | Ogawa et al. |
| 2017/0179154 | A1 | 6/2017 | Furihata et al. |
| 2017/0236746 | A1 | 8/2017 | Yu et al. |
| 2017/0358593 | A1 | 12/2017 | Yu et al. |
| 2018/0247953 | A1 | 8/2018 | Lee |
| 2019/0043879 | A1* | 2/2019 | Lu .................. H01L 23/5226 |
| 2019/0229125 | A1 | 7/2019 | Zhou et al. |
| 2019/0229127 | A1 | 7/2019 | Dorhout et al. |
| 2019/0237477 | A1* | 8/2019 | Baek .................. G11C 7/18 |
| 2019/0252396 | A1 | 8/2019 | Mushiga et al. |
| 2019/0252403 | A1 | 8/2019 | Kaminaga et al. |
| 2019/0252404 | A1 | 8/2019 | Kaminaga |
| 2019/0378855 | A1* | 12/2019 | Kim .................. H01L 27/11573 |
| 2019/0393240 | A1* | 12/2019 | Kim .................. H01L 27/11573 |
| 2020/0035694 | A1 | 1/2020 | Kaminaga |
| 2020/0365616 | A1 | 11/2020 | Baek |
| 2021/0066282 | A1 | 3/2021 | Kim et al. |
| 2021/0217760 | A1 | 7/2021 | Yang et al. |

OTHER PUBLICATIONS

Endoh et al., "Novel Ultra High Density Memory with a Stacked-Surrounding Gate Transistor (S-SGT) Structured Cell," IEDM Proc. (2001) 33-36.
U.S. Appl. No. 16/251,863, filed Jan. 18, 2019, SanDisk Technologies LLC.
U.S. Appl. No. 16/353,048, filed Mar. 14, 2019, SanDisk Technologies LLC.
U.S. Appl. No. 16/444,125, filed Jun. 18, 2019, SanDisk Technologies LLC.
U.S. Appl. No. 16/444,186, filed Jun. 18, 2019, SanDisk Technologies LLC.
U.S. Appl. No. 16/547,971, filed Aug. 22, 2019, SanDisk Technologies LLC.
U.S. Appl. No. 16/671,561, filed Nov. 1, 2019, SanDisk Technologies LLC.
U.S. Appl. No. 16/675,459, filed Nov. 6, 2019, SanDisk Technologies LLC.
U.S. Appl. No. 16/782,307, filed Feb. 5, 2020, SanDisk Technologies LLC.
U.S. Appl. No. 16/827,990, filed Mar. 24, 2020, SanDisk Technologies LLC.
Notification of Transmittal of the International Search Report and the Written Opinion of the International Searching Authority for International Patent Application No. PCTUS2020/067537, dated May 6, 2021, 11 pages.
USPTO Office Communication, Notice of Allowance and Fee(s) Due for U.S. Appl. No. 16/921,146, dated Jan. 25, 2022, 23 pages.
USPTO Office Communication, Notice of Allowance and Fee(s) Due for U.S. Appl. No. 16/881,401, dated Jan. 4, 2022, 19 pages.

* cited by examiner

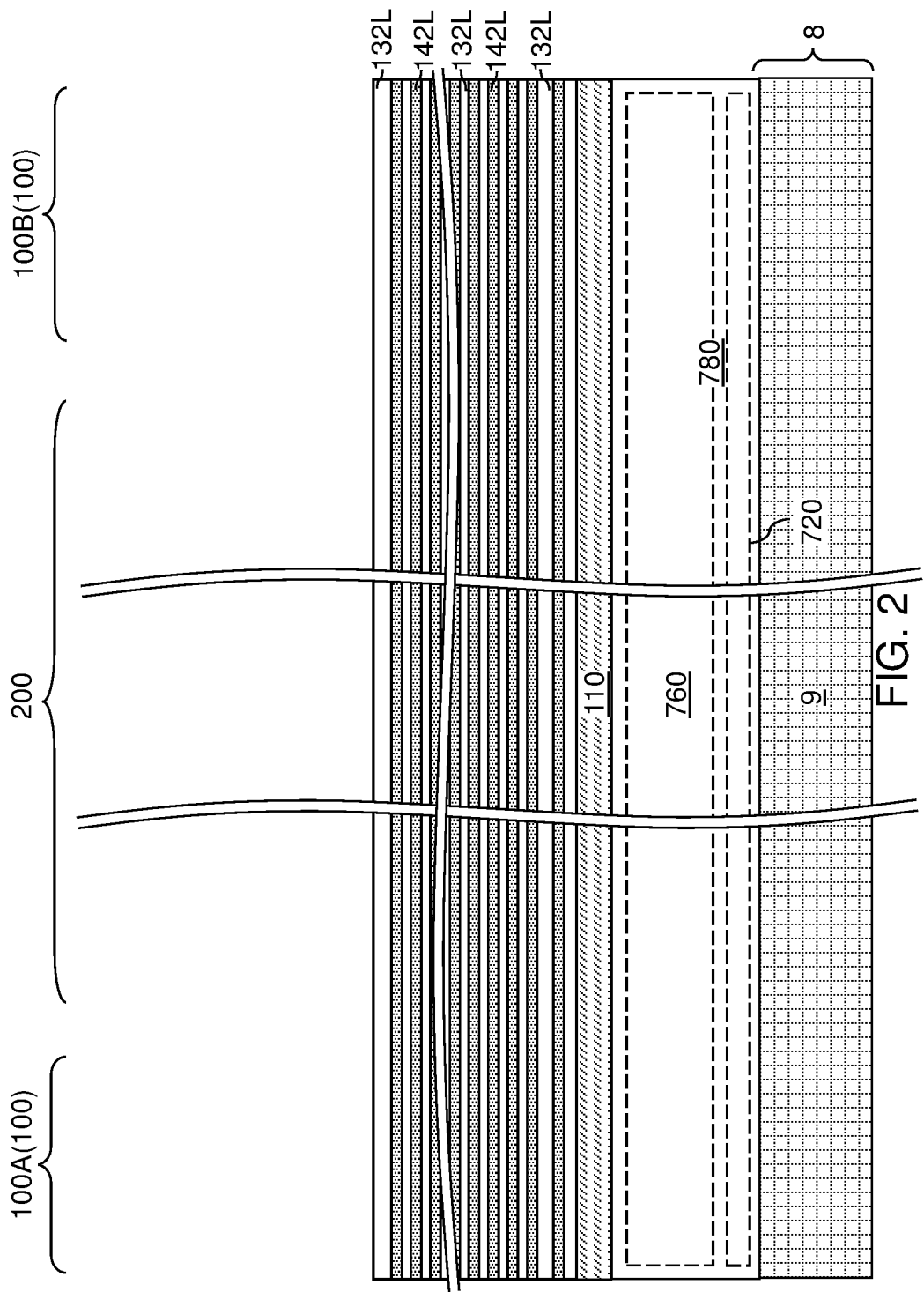

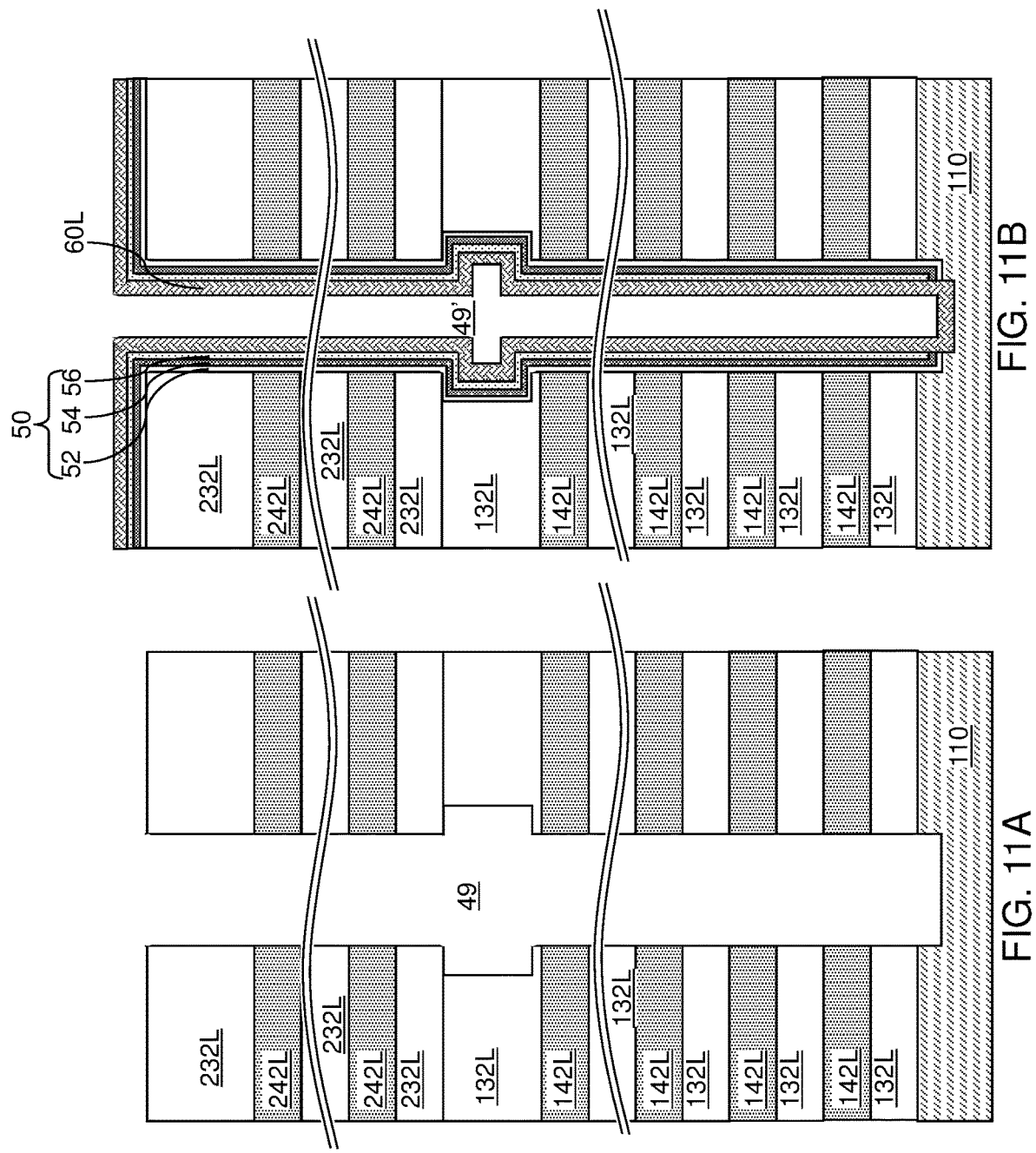

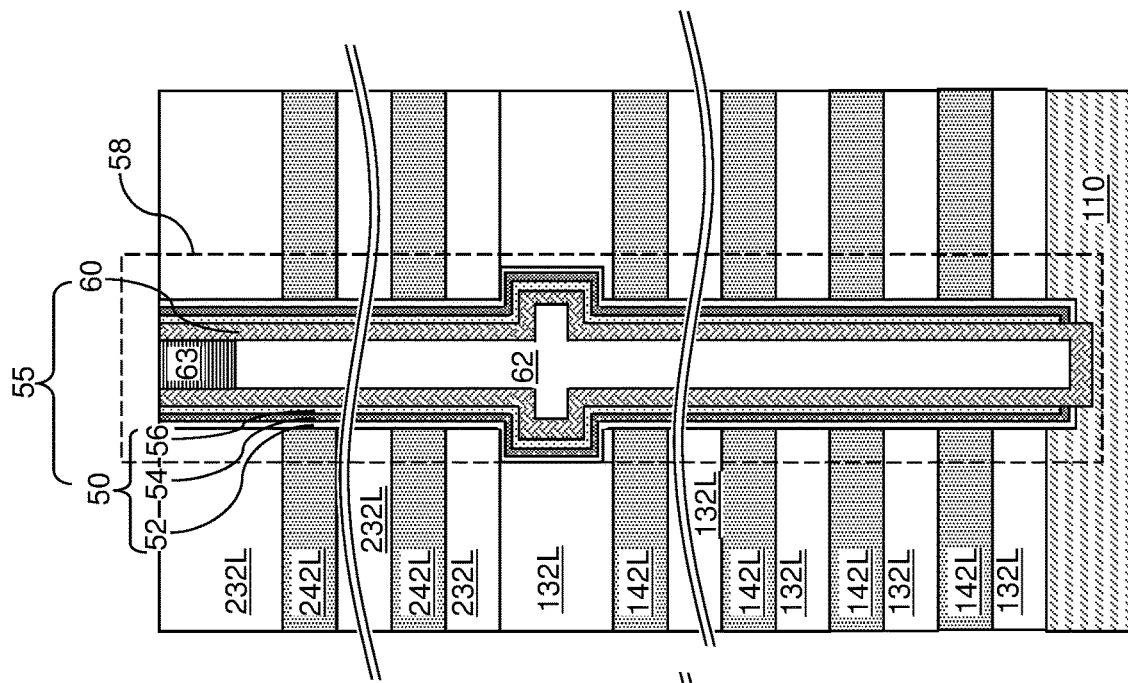
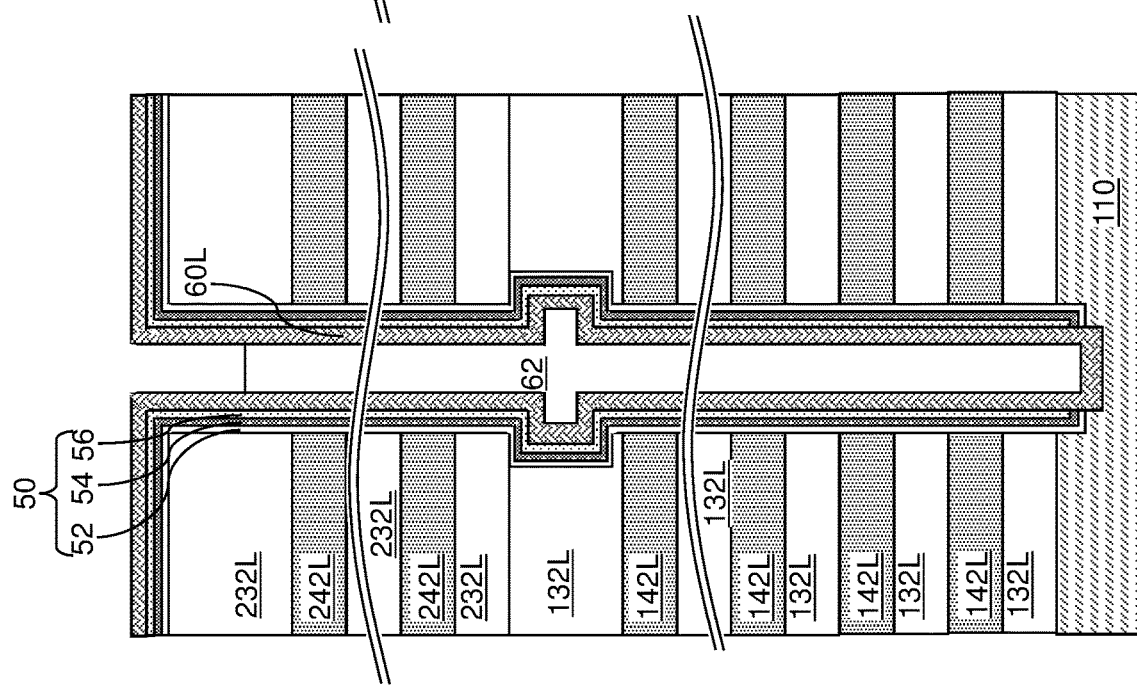

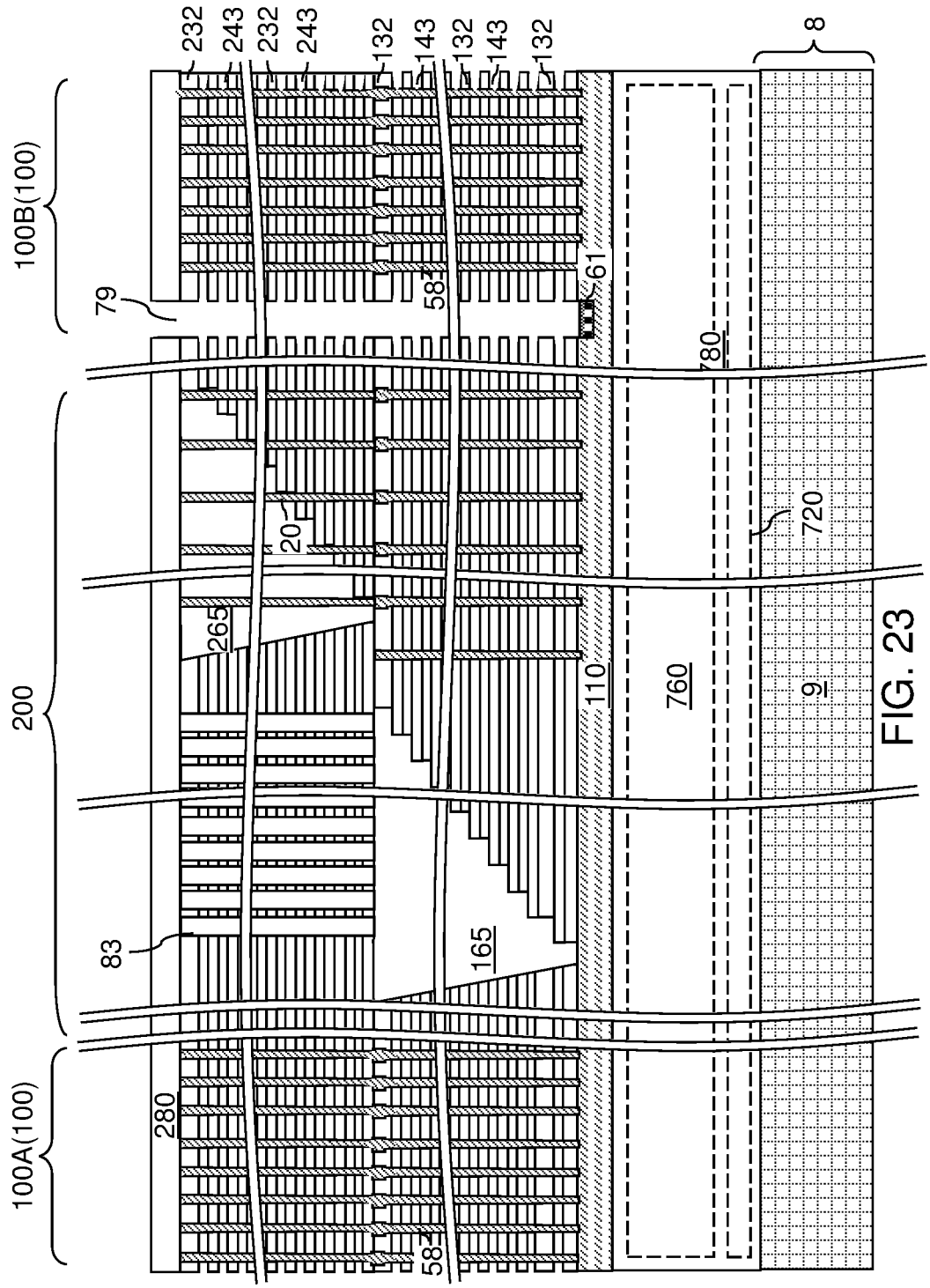

THROUGH-STACK CONTACT VIA STRUCTURES FOR A THREE-DIMENSIONAL MEMORY DEVICE AND METHODS OF FORMING THE SAME

FIELD

The present disclosure relates generally to the field of semiconductor devices, and particularly to a multi-tier three-dimensional memory device including through-stack contact via structures that extend through an upper-tier alternating stack and methods of forming the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device is provided, which comprises: a first-tier alternating stack of first insulating layers and first electrically conductive layers located over a substrate; a first-tier retro-stepped dielectric material portion overlying first stepped surfaces of the first-tier alternating stack; a second-tier alternating stack of second insulating layers and second electrically conductive layers; first memory stack structures located in a first memory region in which each layer of the first-tier alternating stack and each layer of the second-tier alternating stack are present, wherein each of the first memory stack structures comprises a respective memory film and a respective vertical semiconductor channel; a combination of a vertically alternating stack of insulating plates and dielectric material plates and a dielectric wall structure that at least partially laterally surrounds the vertically alternating stack, wherein the combination is located within the contact via region which overlies the first-tier retro-stepped dielectric material portion and which is laterally surrounded by the second-tier alternating stack; and first contact via structures vertically extending through the vertically alternating stack and the first-tier retro-stepped dielectric material portion and contacting a respective one of the first electrically conductive layers.

According to another aspect of the present disclosure, a method of forming a three-dimensional memory device is provided, which comprises: forming a first-tier structure that includes a first vertically alternating sequence of first continuous insulating layers and first continuous sacrificial material layers and a first-tier retro-stepped dielectric material portion overlying first stepped surfaces of the first vertically alternating sequence over a substrate; forming a second vertically alternating sequence of second continuous insulating layers and second continuous sacrificial material layers over the first-tier structure; forming a moat trench through the second vertically alternating sequence, wherein the moat trench at least partially laterally surrounds a vertically alternating stack of insulating plates and dielectric material plates, the insulating plates being patterned portions of the second continuous insulating layers and the dielectric material plates being patterned portions of the second continuous sacrificial material layers; forming a dielectric wall structure in the moat trench; forming memory stack structures in a first memory region in which each layer within the first vertically alternating sequence and the second vertically alternating sequence is present; forming backside trenches through the second vertically alternating sequence and the first vertically alternating sequence; replacing patterned portions of the first continuous sacrificial material layers and the second continuous sacrificial material layers with electrically conductive layers; and forming first contact via structures through the vertically alternating stack and a first portion of the first retro-stepped dielectric material portion and directly on a first subset of the electrically conductive layers.

According to yet another aspect of the present disclosure, a three-dimensional memory device is provided, which comprises: a first-tier alternating stack of first insulating layers and first electrically conductive layers located over a substrate; a first-tier retro-stepped dielectric material portion overlying first stepped surfaces of the first-tier alternating stack; a second-tier alternating stack of second insulating layers and second electrically conductive layers and overlying the first-tier alternating stack and the first-tier retro-stepped dielectric material portion; first memory stack structures located in a first memory region in which each layer of the first-tier alternating stack and each layer of the second-tier alternating stack are present, wherein each of the first memory stack structures comprises a respective memory film and a respective vertical semiconductor channel; and laterally-isolated contact via structures vertically extending through the second-tier alternating stack and the first-tier retro-stepped dielectric material portion and contacting a respective one of the first electrically conductive layers, wherein each of the laterally-isolated contact via structures comprises a first contact via structure and a tubular insulating liner that surrounds the first contact via structure.

According to still another aspect of the present disclosure, a method of forming a three-dimensional memory device is provided, which comprises: forming a first-tier structure that includes a first vertically alternating sequence of first continuous insulating layers and first continuous sacrificial material layers and a first-tier retro-stepped dielectric material portion overlying first stepped surfaces of the first vertically alternating sequence over a substrate; forming a second vertically alternating sequence of second continuous insulating layers and second continuous sacrificial material layers over the first-tier structure; forming dielectric pillar structures through the second vertically alternating sequence over the first-tier retro-stepped dielectric material portion; forming memory stack structures in a first memory region in which each layer within the first vertically alternating sequence and the second vertically alternating sequence is present; forming backside trenches through the second vertically alternating sequence and the first vertically alternating sequence; replacing patterned portions of the first continuous sacrificial material layers and the second continuous sacrificial material layers with electrically conductive layers; and forming first contact via structures through dielectric pillar structures and a first portion of the first retro-stepped dielectric material portion and directly on a first subset of the electrically conductive layers.

BRIEF DESCRIPTION OF THE DRAWINGS

FIG. 2 is a vertical cross-sectional view of a first exemplary structure for forming a semiconductor die after formation of optional semiconductor devices, optional lower level dielectric layers, optional lower metal interconnect structures, a semiconductor material layer, and a first vertically alternating sequence of first continuous insulating layers and first continuous sacrificial material layers according to the first embodiment of the present disclosure.

FIGS. 11A-11D illustrate sequential vertical cross-sectional views of a memory opening during formation of a memory opening fill structure according to the first embodiment of the present disclosure.

FIG. 23 is a vertical cross-sectional view of the second exemplary structure after formation of backside recesses according to the second embodiment of the present disclosure.

DETAILED DESCRIPTION

Figure 1A:
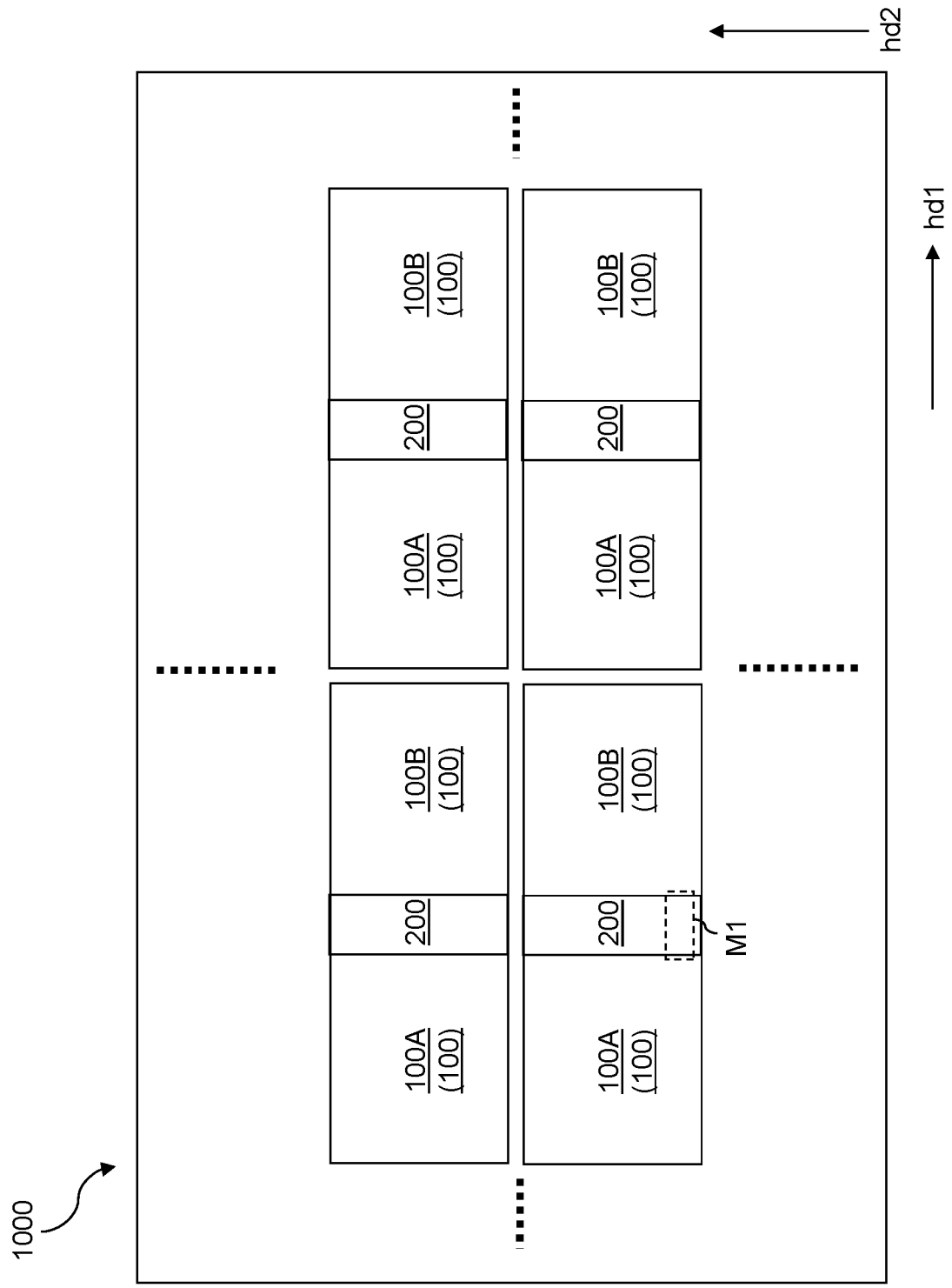
FIG. 1A is a plan view of a first exemplary semiconductor die including multiple three-dimensional memory array regions according to a first embodiment of the present disclosure.
Figure 1B:
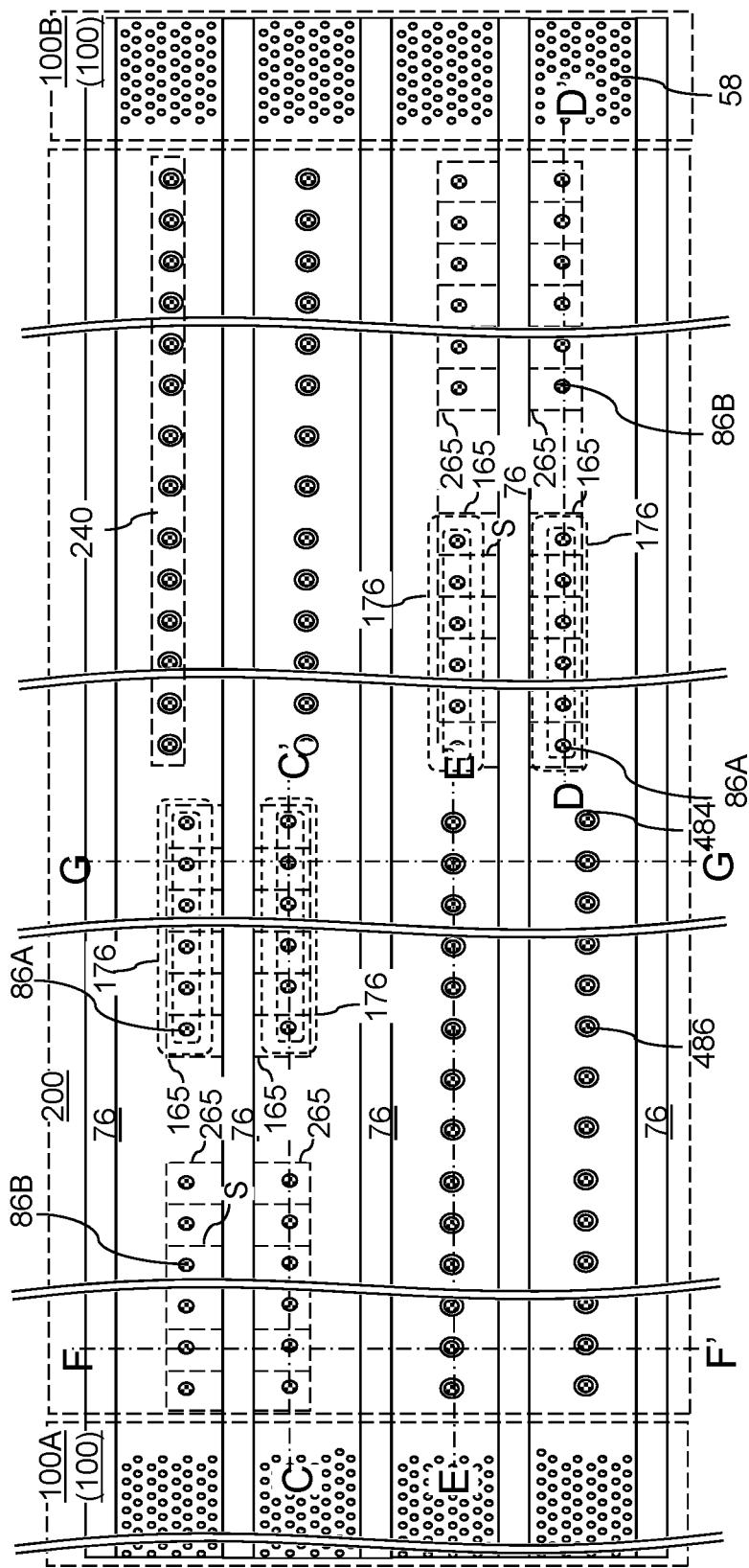
FIG. 1B is a schematic see-through top-down view of region M1 of FIG. 1A.
Figure 1C:
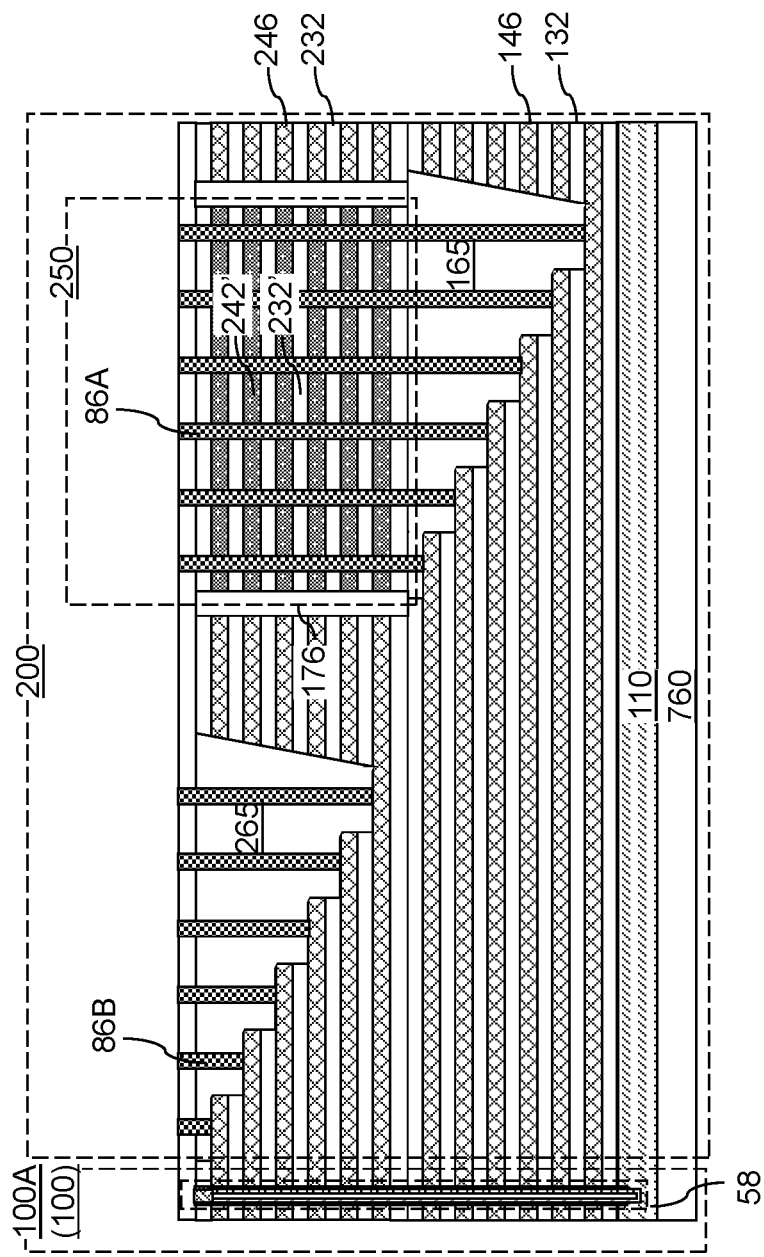
FIG. 1C is a schematic vertical cross-sectional view of a region of the first exemplary semiconductor die along the vertical plane C-C' of FIG. 1B.
Figure 1D:
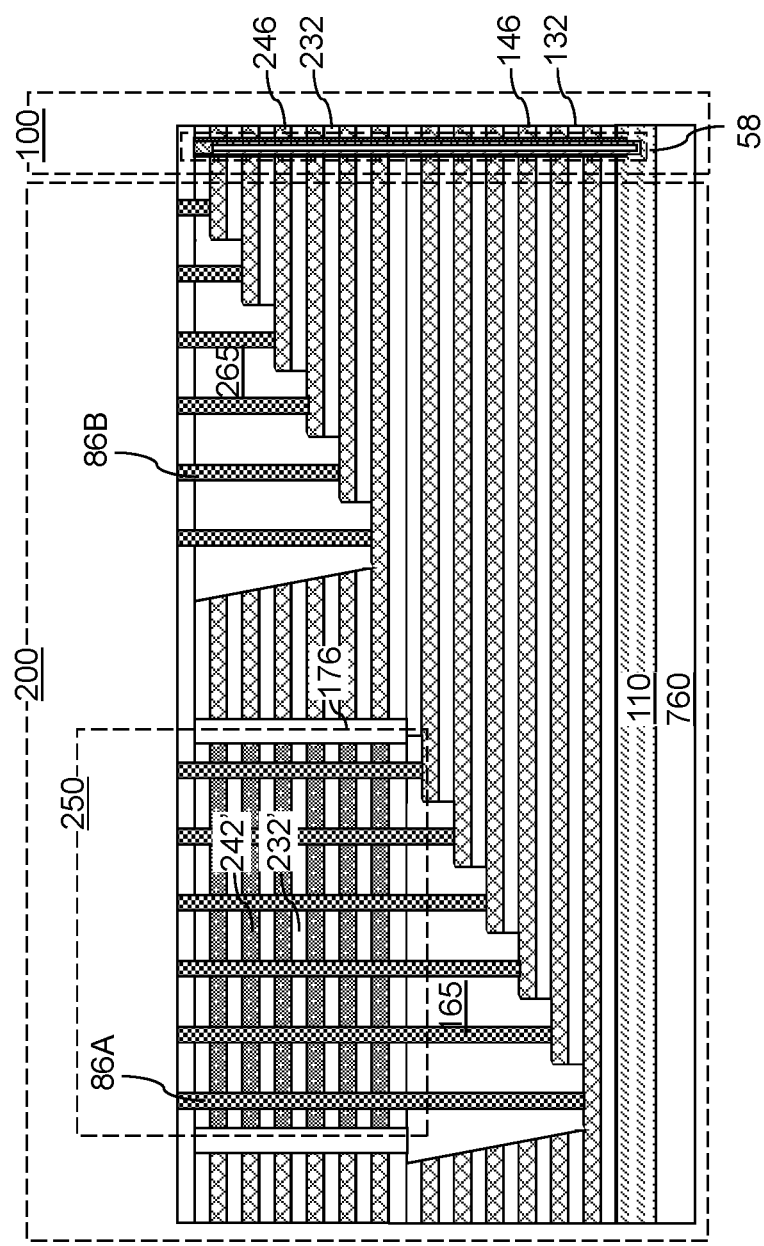
FIG. 1D is a schematic vertical cross-sectional view of a region of the first exemplary semiconductor die along the vertical plane D-D' of FIG. 1B.

As discussed above, the embodiments of the present disclosure are directed to a multi-tier three-dimensional memory device including through-stack contact via structures that extend through an upper-tier alternating stack and methods of forming the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIGS. 1A-1G, a first exemplary semiconductor die 1000 according to a first embodiment of the present disclosure is illustrated. The first exemplary semiconductor die 1000 includes multiple three-dimensional memory array regions and multiple inter-array regions. The first exemplary semiconductor die 1000 can include multiple planes, each of which includes two memory array regions 100, such as a first memory array region 100A and a second memory array region 100B that are laterally spaced apart by a respective inter-array region 200. Generally, a semiconductor die 1000 may include a single plane or multiple planes. The total number of planes in the semiconductor die 1000 may be selected based on performance requirements on the semiconductor die 1000. A pair of memory array regions 100 in a plane may be laterally spaced apart along a first horizontal direction hd1 (which may be the word line direction). A second horizontal direction hd2 (which may be the bit line direction) can be perpendicular to the first horizontal direction hd1.

Each memory array region 100 includes first-tier alternating stacks of first insulating layers 132 and first electrically conductive layers 146 (which function as first word lines) and second-tier alternating stacks of second insulating layers 232 and second electrically conductive layers 246 (which function as second word lines). Each second-tier alternating stack (232, 246) overlies a respective first-tier alternating stack (132, 146), and each first-tier alternating stack (132, 146) underlies a respective second-tier alternating stack (232, 246). Each combination of a first-tier alternating stack (132, 146) and an overlying second-tier alternating stack (232, 246) may be laterally spaced apart from neighboring combinations of a respective first-tier alternating stack (132, 146) and a respective second-tier alternating stack (232, 246) by backside trench fill structures 76 that laterally extend along the first horizontal direction hd1.

In the embodiment illustrated in FIGS. 1A-1G, the neighboring staircases (i.e., adjacent staircases along the second horizontal direction (e.g., bit line direction) hd2) are staggered in opposite directions. In other words, the neighboring staircases rise in opposite directions perpendicular to the second horizontal direction hd2. This means that such staircases do not have to be offset from each other along the first horizontal direction hd1 to avoid the high aspect ratio photoresist layer patterns. This reduces the size of the memory device and of the semiconductor chip containing the memory device. However, it should be understood that the present disclosure is not limited to staggered neighboring staircases. In another embodiment, the neighboring staircases may be non-staggered, and may rise in the same direction (e.g., the first horizontal direction (e.g., word line direction) hd1) perpendicular to the second horizontal direction hd2.

The first exemplary structure can include an optional semiconductor material layer 110 that includes a single crystalline or polycrystalline semiconductor material, such as single crystalline silicon or polysilicon. In one embodiment, the semiconductor material layer 110 may be a substrate. Optionally, underlying dielectric material layers may be provided underneath the semiconductor material layer 110. In this case, the underlying dielectric material layers are referred to as lower-level dielectric material layers 760.

A first-tier alternating stack of first insulating layers 132 and first electrically conductive layers 146 is located over a substrate (which may include the semiconductor material layer 110 or another structure, such as a silicon wafer that underlies the semiconductor material layer 110) between each neighboring pair of backside trench fill structures 76. A first-tier retro-stepped dielectric material portion 165 overlies, and contacts, first stepped surfaces of the first-tier alternating stack (132, 146). A second-tier alternating stack of second insulating layers 232 and second electrically conductive layers 246 overlies the first-tier alternating stack (132, 146), and overlies a horizontal plane including a planar top surface of the first-tier retro-stepped dielectric material portion 165 between each neighboring pair of backside trench fill structures 76. A second-tier retro-stepped dielectric material portion 265 overlies, and contacts, second stepped surfaces of the second-tier alternating stack (232, 246). Vertical steps S of the first stepped surfaces and the second stepped surfaces laterally extend along the second horizontal direction hd2 (e.g., bit line direction).

Memory opening fill structures 58 can be located within each memory array region 100 (which includes a first memory array region 100A and a second memory array region 100B) between each neighboring pair of backside trench fill structures 76. The memory opening fill structures 58 can be located within memory openings that vertically extend through each layer within the first-tier alternating stack (132, 146) and the second-tier alternating stack (232, 246) that are located between a respective neighboring pair of backside trench fill structures 76.

Each memory opening fill structure 58 includes a respective memory stack structure, which includes a respective memory film and a respective vertical semiconductor channel. The memory openings and the memory opening fill structures 58 are formed in region in which each layer of a first-tier alternating stack and each layer of the second-tier alternating stack are present. For each area within which a continuous combination of a first-tier alternating stack (132, 146) and a second-tier alternating stack (232, 246) continuously laterally extends, first memory stack structures can be located within a respective first memory array region 100A and second memory stack structures can be located within a respective second memory array region 100B. The second memory array region 100B can be connected to the first memory array region 100A through a respective inter-array region 200, in which a first-tier retro-stepped dielectric material portion 165, a second-tier retro-stepped dielectric material portion 265, and a dielectric wall structure 176 are located.

A first-tier retro-stepped dielectric material portion 165 can be located between each neighboring pair of backside trench fill structures 76. Each first-tier retro-stepped dielectric material portion 165 overlies first stepped surfaces of a respective first-tier alternating stack (132, 146). Each first-tier retro-stepped dielectric material portion 165 can have a sidewall that laterally extends along the first horizontal direction hd1 and contacts a respective backside trench fill structure 76. The first stepped surfaces comprise vertical steps of the first-tier alternating stack (132, 146) that are laterally spaced apart along the first horizontal direction hd1 and vertically offset from each other.

A second-tier retro-stepped dielectric material portion 265 can be located between each neighboring pair of backside trench fill structures 76. Each second-tier retro-stepped dielectric material portion 265 overlies second stepped surfaces of a respective second-tier alternating stack (232, 246). Each second-tier retro-stepped dielectric material portion 265 can have a sidewall that laterally extends along the second horizontal direction hd1 and contacts a respective backside trench fill structure 76. The second stepped surfaces comprise vertical steps of the second-tier alternating stack (232, 246) that are laterally spaced apart along the first horizontal direction hd1 and vertically offset from each other. In one embodiment, the second-tier retro-stepped dielectric material portion 265 does not contact the first-tier retro-stepped dielectric material portion 165 or the dielectric wall structure 176.

Backside trenches can laterally extend along the first horizontal direction hd1. Each backside trench can be filled with a backside trench fill structure 76, which may include a combination of a backside contact via structure and an insulating spacer that laterally surround the backside contact via structure. Alternatively, each backside trench fill structure 76 may consist of an insulating fill structure. Each contiguous combination of a first-tier alternating stack (132, 146) and an overlying second-tier alternating stack (232, 246) can be located between a neighboring pair of backside trench fill structure 76.

For each contiguous combination of a first-tier alternating stack (132, 146) and an overlying second-tier alternating stack (232, 246), a respective first backside trench fill structure 76 laterally extends along the first horizontal direction hd1 (e.g., word line direction) and contacts first sidewalls of the first-tier alternating stack (132, 146) and first sidewalls of the second-tier alternating stack (232, 246), and a second backside trench fill structure 76 laterally extends along the first horizontal direction hd1 and contacts second sidewalls of the first-tier alternating stack (132, 146) and second sidewalls of the second-tier alternating stack (232, 246). The first backside trench fill structure 76 can contact each layer within the first-tier alternating stack (132, 146) and the second-tier alternating stack (232, 246), and can contact a sidewall of the first-tier retro-stepped dielectric material portion 165. The second backside trench fill structure 76 can contact each layer within the first-tier alternating stack (132, 146) and the second-tier alternating stack (232, 246), and can be laterally spaced from the first-tier retro-stepped dielectric material portion 165. The dielectric wall structure 176 can be laterally offset along the second horizontal direction hd2 from each of the first backside trench fill structure 76 and the second backside trench fill structure 76.

According to an aspect of the present disclosure, each second-tier alternating stack (232, 246) can include a contact via region 250 in which the second electrically conductive layers 246 are absent. The contact via region 250 overlies an underlying first-tier retro-stepped dielectric material portion 165. The contact via region 250 vertically extends through an opening within the second-tier alternating stack (232, 246) through each layer within the second-tier alternating stack (232, 246), is surrounded by the second alternating stack, and has an area that overlaps with the area of the underlying first-tier retro-stepped dielectric material portion 165. A combination of a vertically alternating stack of insulating plates 232' and dielectric material plates 242' and a dielectric wall structure 176 that at least partially laterally surrounds the vertically alternating stack (232', 242') are located in this contact via region 250. The dielectric wall structure 176 can have a tubular configuration, and can vertically extend from a top surface of the underlying first-tier retro-stepped dielectric material portion 165 to a horizontal plane including a topmost surface of the second-tier alternating stack (232, 246). Thus, a bottom surface of the dielectric wall structure 176 can contact a top surface of the underlying first-tier retro-stepped dielectric material portion 165. While the dielectric wall structure 176 is illustrated as a continuous tubular structure which completely surrounds the vertically alternating stack of insulating plates 232' and dielectric material plates 242', in another embodiment, the dielectric wall structure 176 may be discontinuous and may partially surround the vertically alternating stack of insulating plates 232' and dielectric material plates 242'.

In one embodiment, the dielectric wall structure 176 can have a pair of first inner sidewalls that laterally extend along the first horizontal direction hd1, a pair of first outer sidewalls that laterally extend along the first horizontal direction hd1, a pair of second inner sidewalls that laterally extend along a second horizontal direction hd2 that is perpendicular to the first horizontal direction hd1, and a pair of second outer sidewalls that laterally extend along the second horizontal direction hd2. In one embodiment, the dielectric wall structure 176 can have a horizontal cross-sectional shape having a closed inner periphery and a closed outer periphery. The closed inner periphery can have a shape of a rectangle or a rounded rectangle. The closed outer periphery can have a shape of a rectangle or a rounded rectangle, and can be laterally offset outward from the closed inner periphery. The sidewalls of the dielectric wall structure 176 may be substantially vertical or vertical, and/or may have a taper angle in a range from 0.1 degree to 20 degrees, such as from 3 degrees to 15 degrees (such as from 5 degrees to 10 degrees) with respect to the vertical direction.

In one embodiment, the entirety of each inner sidewall of the dielectric wall structure 176 can be in contact with the vertically alternating stack (232', 242') of the insulating plates 232' and the dielectric material plates 242'. The entirety of each outer sidewall of the dielectric wall structure 176 can be in contact with the second-tier alternating stack (232, 246). In one embodiment, each of the insulating plates 232' has a horizontal surface within a same horizontal plane including a horizontal surface of a respective second insulating layer 232 within the second-tier alternating stack (232, 246).

The insulating plates 232' and the second insulating layers 232 can be formed by patterning continuous second insulating layers. As such, each insulating plate 232' can have the same thickness and the same material composition as a second insulating layer 232 located at a same level, i.e., vertically spaced from the semiconductor material layer 110 by a same vertical spacing. Each of the insulating plates 232' can have a horizontal surface within a same horizontal plane including a horizontal surface of a respective second insulating layer 232 within the second-tier alternating stack (232, 246). Specifically, each of the insulating plates 232' can have a horizontal top surface within a same horizontal plane including a horizontal top surface of a respective second insulating layer 232 within the second-tier alternating stack (232, 246), and can have a horizontal bottom surface within a same horizontal plane including a horizontal bottom surface of a respective second insulating layer 232 within the second-tier alternating stack (232, 246).

A contact-level dielectric layer 280 can be provided over each second-tier alternating stack (232, 246). In one embodiment, first contact via structures 86A vertically extend through the vertically alternating stack (232', 242') and the first-tier retro-stepped dielectric material portion 165, and contact a respective one of the first electrically conductive layers 146. Second contact via structures 86B vertically extend through the second-tier retro-stepped dielectric material portion 265 and contact a respective one of the second electrically conductive layers 246.

For each contiguous combination of a first-tier alternating stack (132, 146) and an overlying second-tier alternating stack (232, 246), first contact via structures 86A vertically extend through a vertically alternating stack (232', 242') and an underlying first-tier retro-stepped dielectric material portion 165, and contact a respective one of the first electrically conductive layers 146. In one embodiment, each of the first contact via structures 86A contacts sidewalls of the insulating plates 232' and sidewalls of the dielectric material plates 242'. In one embodiment, each of the first contact via structures 86A contacts a respective sidewall of the first retro-stepped dielectric material portion 165. In one embodiment, a bottommost surface of the vertically alternating stack (232', 242') of the insulating plates 232' and the dielectric material plates 243' contacts a top surface of the first-tier retro-stepped dielectric material portion 165.

For each contiguous combination of a first-tier alternating stack (132, 146) and an overlying second-tier alternating stack (232, 246), a second-tier retro-stepped dielectric material portion 265 overlies second stepped surfaces of the second-tier alternating stack (232, 246), and second contact via structures 86B vertically extend through the second-tier retro-stepped dielectric material portion 265 and contact a respective one of the second electrically conductive layers 246.

For each contiguous combination of a first-tier alternating stack (132, 146) and an overlying second-tier alternating stack (232, 246), first memory opening fill structures 58 can be located within a first memory array region 100A in which each layer of the first-tier alternating stack and each layer of the second-tier alternating stack are present. Second memory opening fill structures 58 can be located within a second memory array region 100B that is laterally offset along the first horizontal direction hd1 from the first memory array region 100A by the first-tier retro-stepped dielectric material portion 165 and the second-tier retro-stepped dielectric material portion 265. Each layer of the first-tier alternating stack (132, 146) and each layer of the second-tier alternating stack (232, 246) are present within the second memory array region 100B. At least a portion of the first electrically conductive layers 146 and at least a portion of the second electrically conductive layers 246 continuously extend from the first memory array region 100A to the second memory array region 100B through an array interconnection region 240 (which is also referred to as a "bridge" region) located between a backside trench fill structures 76 and the second-tier retro-stepped dielectric material portion 265, and between the backside trench fill structure 76 and the first-tier retro-stepped dielectric material portion 165.

Each combination of a first-tier alternating stack (132, 146) and an overlying second-tier alternating stack (232, 246) can be located between a respective neighboring pair of backside trench fill structures 76. Thus, for each combination of a first-tier alternating stack (132, 146) and an overlying second-tier alternating stack (232, 246), a neighboring combination of an additional first-tier alternating stack (132, 146) and an additional second-tier alternating stack (232, 246) may be provided. A structure that is adjacent to each combination of a first-tier alternating stack (132, 146) and an overlying second-tier alternating stack (232, 246) can include an additional first-tier alternating stack of additional first insulating layers 132 and additional first electrically conductive layers 146 located over the substrate, an additional first-tier retro-stepped dielectric material portion 165 overlying additional first stepped surfaces of the additional first-tier alternating stack (132, 146), an additional second-tier alternating stack of additional second insulating layers 232 and additional second electrically conductive layers 246, additional memory opening fill structures 58 located within an additional memory array region 100B and vertically extending through each layer within the additional first-tier alternating stack (132, 146) and the additional second-tier alternating stack (232, 246), an additional second-tier retro-stepped dielectric material portion 265 overlying additional second stepped surfaces of the additional second-tier alternating stack (232, 246), and a backside trench fill structure 76 laterally extending along the first horizontal direction hd1 and contacting sidewalls of the first-tier alternating stack (132, 146), sidewalls of the second-tier alternating stack (232, 246), sidewalls of the additional first-tier alternating stack (132, 146), and sidewalls of the additional second-tier alternating stack (232, 246). The additional second-tier alternating stack (232, 246) overlies the additional first-tier alternating stack (132, 146) and overlies a horizontal plane including the planar top surface of the first-tier retro-stepped dielectric material portion 165.

Staircases including the first stepped surfaces and the second stepped surfaces of combinations of a first-tier alternating stack (132, 146) and an overlying second-tier alternating stack (232, 246) can rise from the substrate along the first horizontal direction hd1, or along the opposite direction of the first horizontal direction hd1. In one embodiment, the direction of rise of the staircases can change for every other pair of combinations of a respective first-tier alternating stack (132, 146) and a respective second-tier alternating stack (232, 246). In other words, the direction of rise is staggered in adjacent alternating stacks that are separated along the second horizontal direction. For example, upon sequentially numbering each combination of a respective first-tier alternating stack (132, 146) and a respective second-tier alternating stack (232, 246) with positive integers N starting with 1, each (4N+1)-th combination and each (4N+2)-th combination of a respective first-tier alternating stack (132, 146) and a respective second-tier alternating stack (232, 246) can have stairs that rise along the first horizontal direction hd1, and each (4N+3)-th combination and each (4N+4)-th combination of a respective first-tier alternating stack (132, 146) and a respective second-tier alternating stack (232, 246) can have stairs that rise along the opposite direction of the first horizontal direction hd1. In this embodiment, a vertical distance between the first stepped surfaces and the substrate increases along the first horizontal direction hd1, a vertical distance between the second stepped surfaces and the substrate increases along the first horizontal direction hd1, a vertical distance between the additional first stepped surfaces and the substrate decreases along the first horizontal direction hd1, and a vertical distance between the additional second stepped surfaces and the substrate decreases along the first horizontal direction hd1.

In an alternative embodiment, the direction of rise of the staircases does not change for every other pair of combinations of a respective first-tier alternating stack (132, 146) and a respective second-tier alternating stack (232, 246). In other words, the direction of rise is the same (i.e., non-staggered) in adjacent alternating stacks that are separated along the second horizontal direction.

The array interconnection region 240 (i.e., bridge region) including strips of the first insulating layers 132, the first electrically conductive layers 146, the second insulating layers 232, and the second electrically conductive layers 246 can be located between a laterally neighboring pair of backside trench fill structures 76 and adjacent to a respective first-tier retro-stepped dielectric material portion 165, a dielectric wall structure 176, and a second-tier retro-stepped dielectric material portion 265. Each layer within the first-tier alternating stack (132, 146) and the second-tier alternating stack (232. 246) comprises a respective strip portion located within the inter-array region 200 and laterally extending continuously from the first memory array region 100A to the second memory array region 100B. Thus, each strip of the first insulating layers 132, the first electrically conductive layers 146, the second insulating layers 232, and the second electrically conductive layers 246 can continuously extend from the first memory array region 100A to the second memory array region 100B.

Figure 1E:
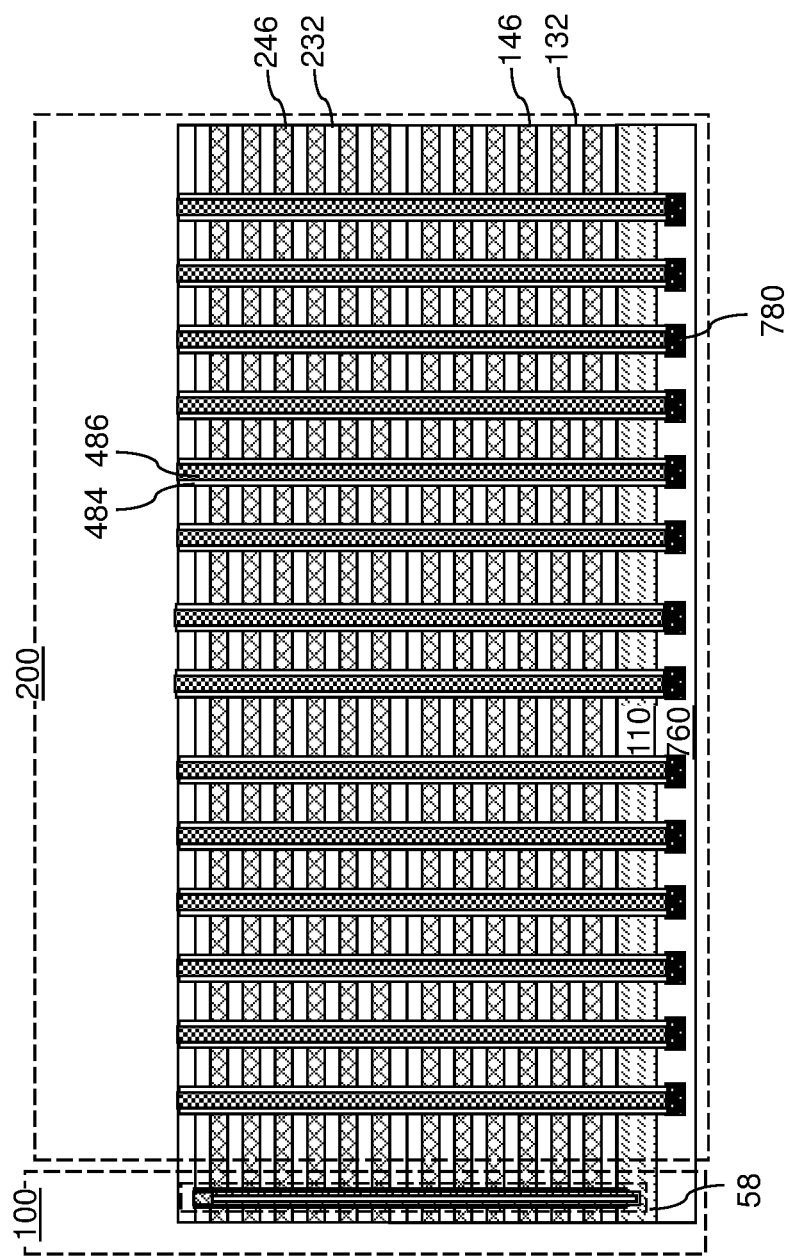
FIG. 1E is a schematic vertical cross-sectional view of a region of the first exemplary semiconductor die along the vertical plane E-E' of FIG. 1B.
Figure 1F:
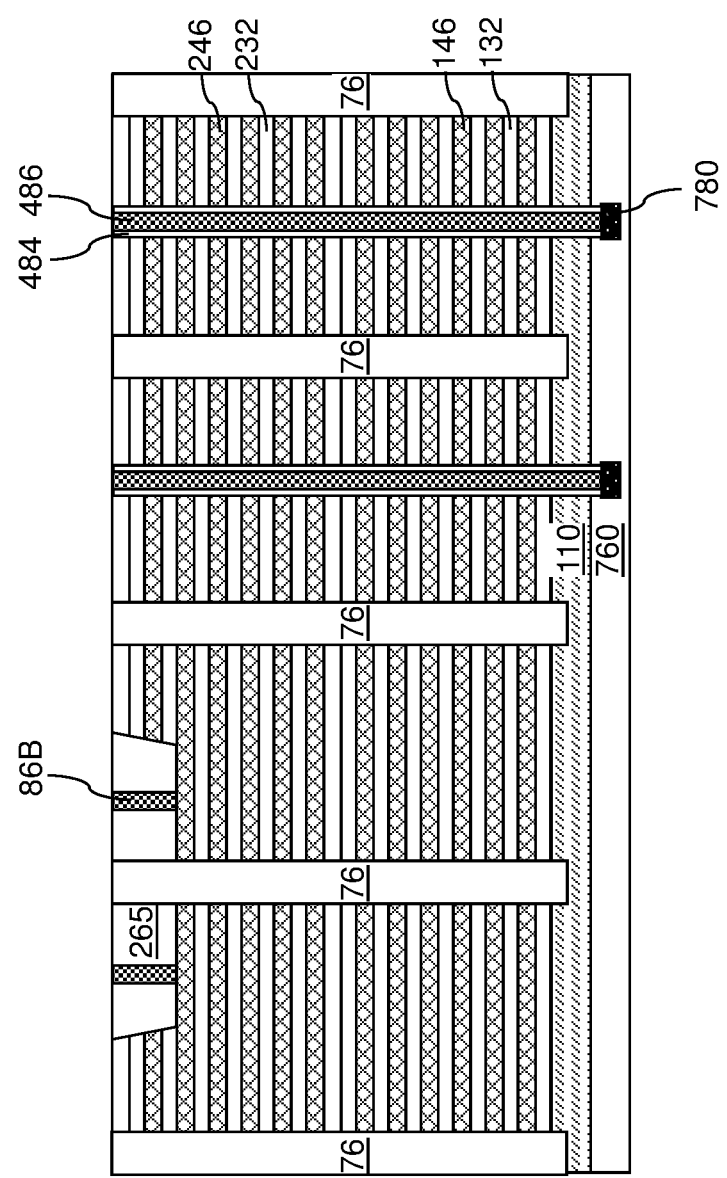
FIG. 1F is a schematic vertical cross-sectional view of a region of the first exemplary semiconductor die along the vertical plane F-F' of FIG. 1B.
Figure 1G:
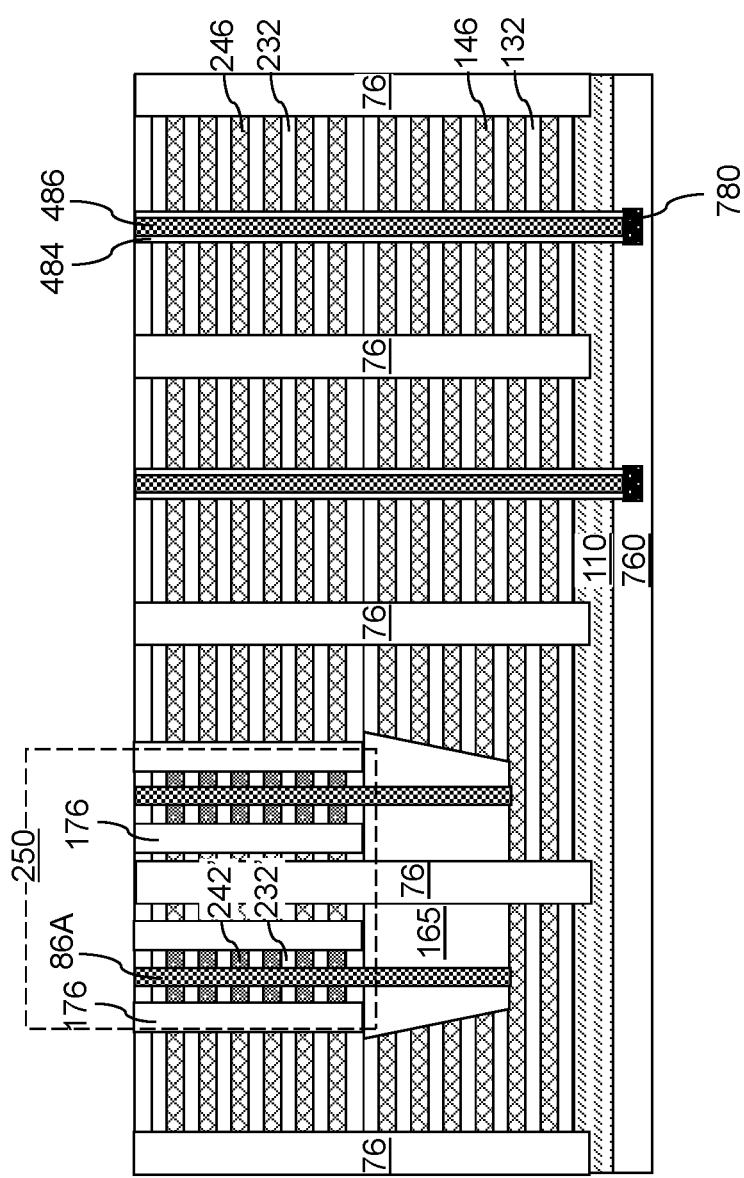
FIG. 1G is a schematic vertical cross-sectional view of a region of the first exemplary semiconductor die along the vertical plane G-G' of FIG. 1B.

Laterally-isolated vertical interconnection structures (484, 486) can be formed through the array interconnection region 240. Each laterally-isolated vertical interconnection structure (484, 486) can include a through-memory-level conductive via structure 486 and a tubular insulating spacer 484 that laterally surrounds the conductive via structure 486. Each through-memory-level conductive via structure 486 can contact a lower-level metal interconnect structure 780 located in the lower-level dielectric material layers 760, as shown in FIG. 1E. The lower-level metal interconnect structures 780 can be embedded in the lower-level dielectric material layers 760, which are located between the first-tier alternating stack (132, 146) and a substrate (not shown) that can be provided underneath the lower-level dielectric material layers 760. The laterally-isolated vertical interconnection structures (484, 486) vertically extend through the strip portions of the first-tier alternating stack (132, 146) and the second-tier alternating stack (232, 246), and contact a respective one of the lower-level metal interconnect structures 780.

Drain contact via structures (shown in FIG. 15) can extend through the contact-level dielectric layer 280, and can contact an upper portion of a respective memory opening fill structure 58 (such as a drain region within the respective memory opening fill structure 58). Bit lines (not shown) can laterally extend along the second horizontal direction hd2, and can contact top surfaces of a respective subset of the drain contact via structures. Additional metal interconnect structures embedded in overlying dielectric material layers (not shown) may be employed to provide electrical connection among the various nodes of the three-dimensional memory device located in the semiconductor die 1000.

The first exemplary semiconductor die 1000 of FIGS. 1A-1G can be manufactured employing a sequence of processing steps. Referring to FIG. 2, a first exemplary structure for formation of the structure of FIGS. 1A-1G is illustrated in a vertical cross sectional view along the first horizontal direction (e.g., word line direction) hd1 according to a first embodiment of the present disclosure. The structure shown in FIG. 2 is provided after formation of semiconductor devices 720 on a substrate semiconductor layer 9 (which is provided at least within an upper portion of a substrate 8), lower level dielectric layers 760, lower-level metal interconnect structures 780 (schematically represented by a dotted area including physical implementations of the lower level metal interconnect structures) that are embedded in the lower-level dielectric layers 760, a semiconductor material layer 110, and a first vertically alternating sequence of first continuous insulating layers 132L and first continuous sacrificial material layers 142L. The substrate semiconductor layer 9 may comprise a top portion (e.g., a doped well) of a substrate 8, such as silicon wafer, or a semiconductor layer located over a substrate, such as a silicon on insulator substrate or a semiconductor substrate. The semiconductor devices 720 may include field effect transistors that are formed over a top surface of the substrate 8. The lower-level dielectric layers 760 may be interconnect-level dielectric material layers that embed the lower-level metal interconnect structures 780.

As used herein, a vertically alternating sequence refers to a sequence of multiple instances of a first element and multiple instances of a second element that is arranged such that an instance of a second element is located between each vertically neighboring pair of instances of the first element, and an instance of a first element is located between each vertically neighboring pair of instances of the second element.

The first continuous insulating layers 132L can be composed of the first material, and the first continuous sacrificial material layers 142L can be composed of the second material, which is different from the first material. Each of the first continuous insulating layers 132L is an insulating layer that continuously extends over the entire area of the substrate 8, and may have a uniform thickness throughout. Each of the first sacrificial material layers 142L includes is a sacrificial material layer that includes a dielectric material and continuously extends over the entire area of the substrate 8, and may have a uniform thickness throughout. Insulating materials that may be used for the first continuous insulating layers 132L include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first continuous insulating layers 132L may be silicon oxide.

The second material of the first continuous sacrificial material layers 142L is a dielectric material, which is a sacrificial material that may be removed selective to the first material of the first continuous insulating layers 132L. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The second material of the first continuous sacrificial material layers 142L may be subsequently replaced with electrically conductive electrodes which may function, for example, as control gate electrodes of a vertical NAND device. In one embodiment, the first continuous sacrificial material layers 142L may be material layers that comprise silicon nitride.

Figure 3:
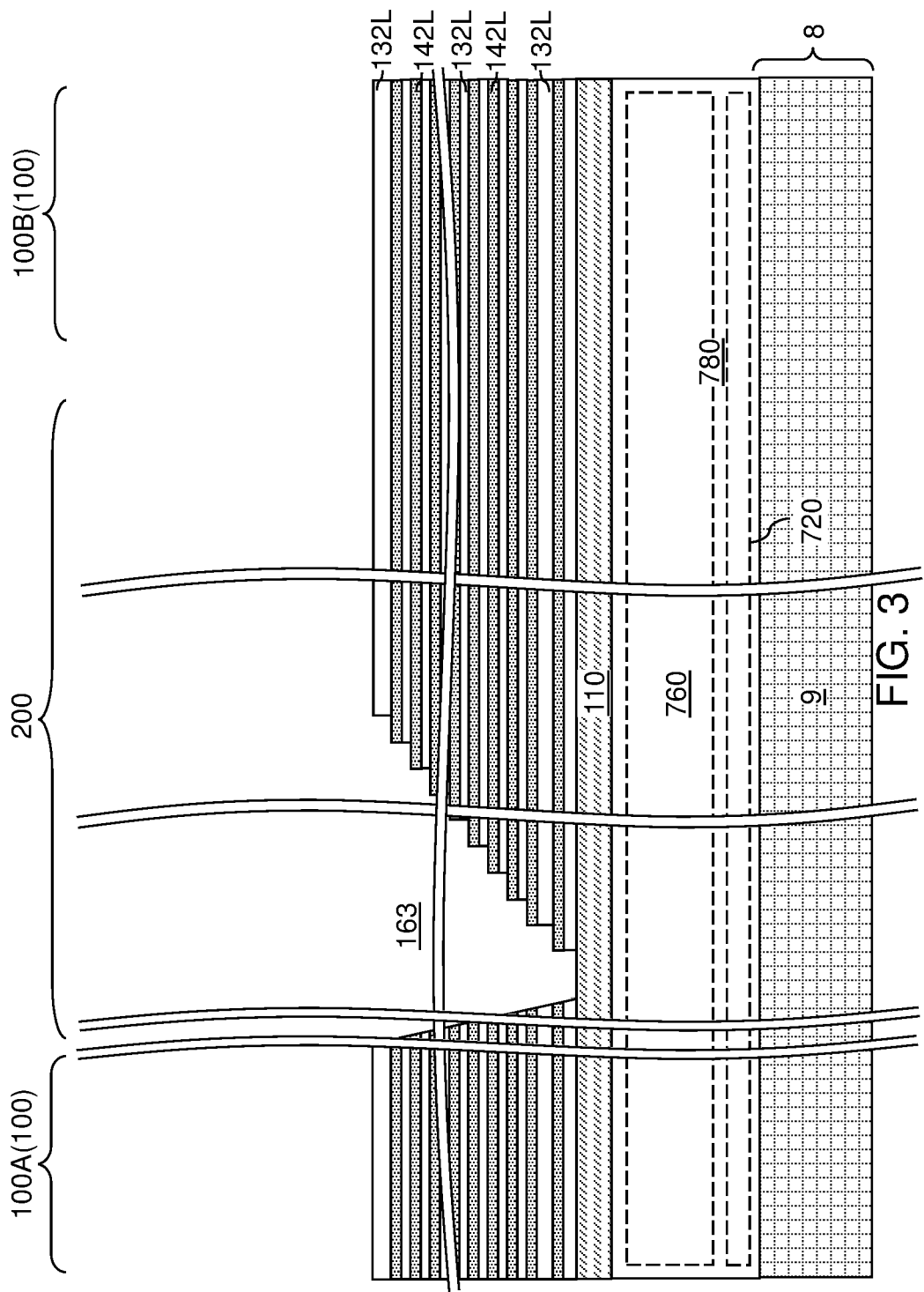
FIG. 3 is a vertical cross-sectional view of the first exemplary structure after formation of first stepped surfaces in the inter-array region according to the first embodiment of the present disclosure.

Referring to FIG. 3, first stepped surfaces can be formed within the inter-array region 200 simultaneously. A hard mask layer (not shown) such as a metallic or dielectric mask material layer can be formed over the first vertically alternating sequence, and can be patterned to form multiple rectangular openings. The areas of openings within the hard mask layer correspond to areas in which first stepped surfaces are to be subsequently formed. Each opening through the hard mask layer may be rectangular, and may have a pair of sides that are parallel to the first horizontal direction hd1 and a pair of sides that are parallel to the second horizontal direction hd2. The rectangular openings through the hard mask layer may be arranged along the second horizontal direction hd2, and may be alternately staggered along the first horizontal direction hd1. Thus, upon sequentially numbering the rectangular openings along the second horizontal direction hd2, every odd-numbered rectangular openings through the hard mask layer can be formed as a first one-dimensional array arranged along the second horizontal direction hd2 aligned along the first horizontal direction hd1 (i.e., having a same lateral extent along the first horizontal direction), and every even-numbered rectangular openings through the hard mask layer can be formed as a second one-dimensional array arranged along the second horizontal direction hd2 aligned along the first horizontal direction hd1.

A trimmable mask layer (not shown) can be applied over the first vertically alternating sequence. The trimmable mask layer can include a trimmable photoresist layer that can be controllably trimmed by a timed ashing process. The trimmable mask layer can be patterned with an initial pattern such that a segment of each rectangular opening in the hard mask layer that is most proximal to the memory array regions 100 is not masked by the trimmable mask layer, while the rest of each rectangular opening is covered by the trimmable mask layer. For example, the trimmable mask layer can have a rectangular shape having straight edges that are parallel to the second horizontal direction hd2, such that the straight edges are located over a vertical step S of respective first stepped surfaces that is most proximal to one of the memory array regions 100.

The first stepped surfaces can be formed within the rectangular openings in the hard mask layer by iteratively performing a set of layer patterning processing steps as many times as the total number of first continuous sacrificial material layers 142L within the first vertically alternating sequence less 1. The set of layer patterning processing steps comprises an anisotropic etch process that etches unmasked portions of a pair of a first continuous insulating layer 132L and a first continuous sacrificial material layer 142L, and a mask trimming process in which the trimmable mask layer is isotropically trimmed to provide shifted sidewalls that are shifted away from the most proximal memory array region 100. A final anisotropic etch process can be performed after the last mask trimming process, and the trimmable mask layer can be removed, for example, by ashing. The hard mask layer can be removed selective to the materials of the first vertically alternating sequence (132L, 142L), for example, by an isotropic etch process (such as a wet etch process).

A first stepped cavity 163 can be formed within each area of the rectangular opening in the hard mask layer. Each first stepped cavity 163 can include a cliff region in which a tapered sidewall of the first vertically alternating sequence vertically extends from the bottommost layer of the first vertically alternating sequence (132L, 142L) to the topmost layer of the first vertically alternating sequence (132L, 142L). Each first stepped cavity 163 has respective first stepped surfaces as stepped bottom surfaces. Each first stepped cavity 163 has a pair of stepped sidewalls that laterally extend along the first horizontal direction hd1. Each stepped sidewall of the first stepped cavity adjoins the first stepped surfaces at the bottom edge, and extends to the top surface of the topmost layer of the first vertically alternating sequence (132L, 142L).

The array of first staircase regions can be arranged along the second horizontal direction hd2 with an alternating lateral offsets along the first horizontal direction hd1 to provide a staggered configuration for the first staircase regions. In other words, upon sequentially numerically labeling the first staircase regions with positive integers starting with 1 along the second horizontal direction hd2, every odd-numbered first staircase region may be closer to the first memory array region 100A than to the second memory array region 100B, and every even-numbered first staircase region may be closer to the second memory array region 100B than to the first memory array region 100A.

Figure 4:
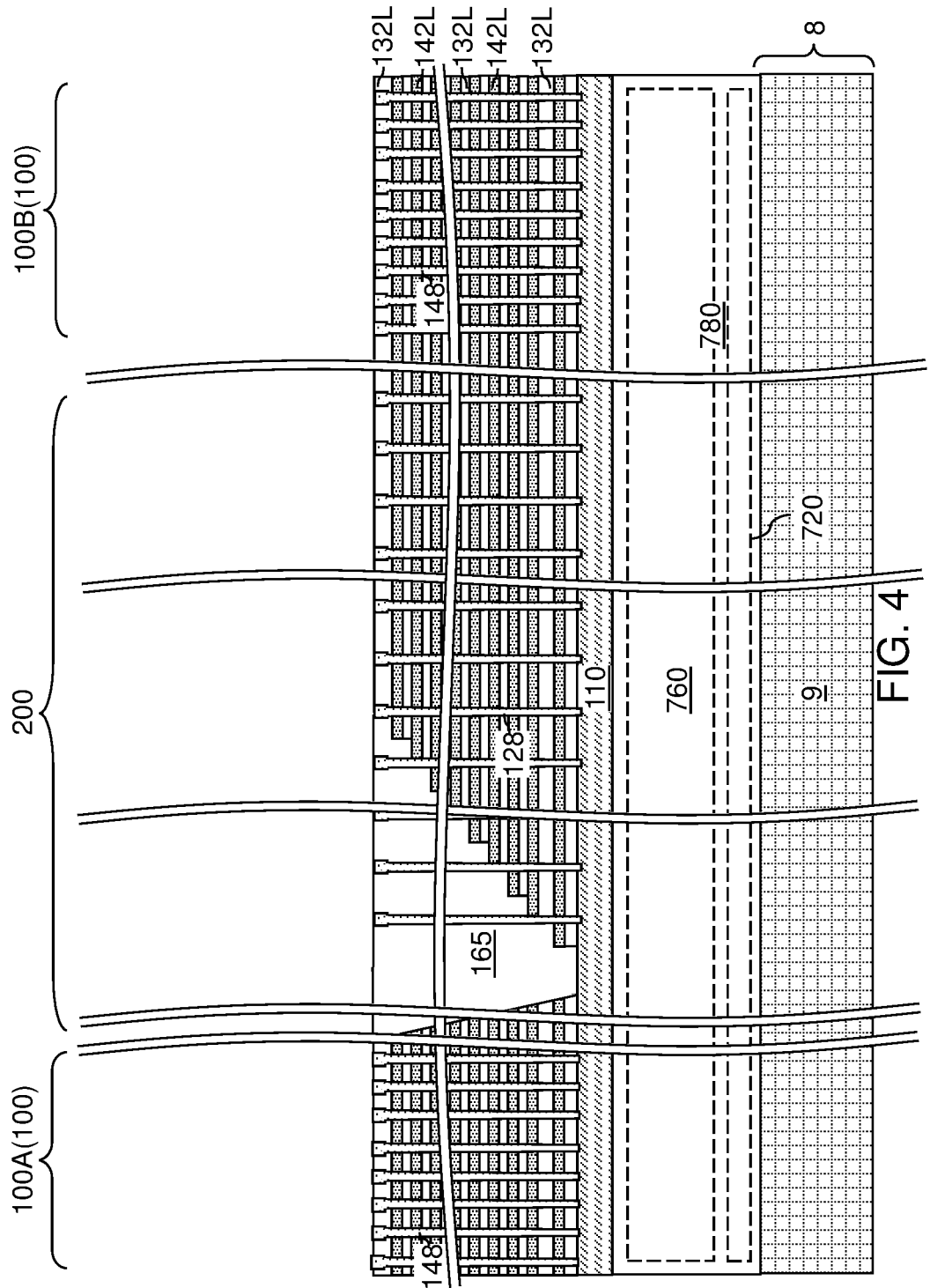
FIG. 4 is a vertical cross-sectional view of the first exemplary structure after formation of first-tier retro-stepped dielectric material portions, first-tier openings, and sacrificial first-tier opening fill portions according to the first embodiment of the present disclosure.

Referring to FIG. 4, a first dielectric fill material (such as undoped silicate glass (i.e., silicon oxide) or a doped silicate glass) can be deposited in each first stepped cavity 163. The first dielectric fill material can be planarized to remove excess portions of the first dielectric fill material from above the horizontal plane including the topmost surface of the first vertically alternating sequence (132L, 142L). Each remaining portion of the first dielectric fill material that fills a respective first stepped cavity constitutes a first-tier retro-stepped dielectric material portion 165.

Various first-tier openings may be formed through the first vertically alternating sequence (132L, 142L) and into the semiconductor material layer 110. A photoresist layer (not shown) may be applied over the first vertically alternating sequence (132L, 142L), and may be lithographically patterned to form various openings therethrough. The pattern of openings in the photoresist layer may be transferred through the first vertically alternating sequence (132L, 142L) and into the semiconductor material layer 110 by a first anisotropic etch process to form the various first-tier openings concurrently, i.e., during the first isotropic etch process. The various first-tier openings may include first-tier memory openings formed in the memory array regions 100 and first-tier support openings formed in the inter-array region 200. Each cluster of first-tier memory openings may be formed as a two-dimensional array of first-tier memory openings. The first-tier support openings are openings that are formed in the inter-array region 200, and are subsequently employed to form support pillar structures. A subset of the first-tier support openings may be formed through a respective horizontal surface of the first stepped surfaces.

Sacrificial first-tier opening fill portions (148, 128) may be formed in the various first-tier openings. For example, a sacrificial first-tier fill material is deposited concurrently deposited in each of the first-tier openings. The sacrificial first-tier fill material includes a material that may be subsequently removed selective to the materials of the first continuous insulating layers 132L and the first continuous sacrificial material layers 142L. In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first continuous insulating layers 132L. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include carbon-containing material (such as amorphous carbon or diamond-like carbon) that may be subsequently removed by ashing, or a silicon-based polymer that may be subsequently removed selective to the materials of the first vertically alternating sequence (132L, 142L).

Portions of the deposited sacrificial material may be removed from above the topmost layer of the first vertically alternating sequence (132L, 142L), such as from above the topmost first continuous insulating layer 132L. For example, the sacrificial first-tier fill material may be recessed to a top surface of the topmost first continuous insulating layer 132L using a planarization process. The planarization process may include a recess etch, chemical mechanical planarization (CMP), or a combination thereof. The top surface of the topmost first continuous insulating layer 132L may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening constitutes a sacrificial first-tier memory opening fill portion 148. Each remaining portion of the sacrificial material in a first-tier support opening constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first vertically alternating sequence (132L, 142L) (such as from above the top surface of the topmost first continuous insulating layer 132L). The top surfaces of the sacrificial first-tier opening fill portions (148, 128) may be coplanar with the top surface of the topmost first continuous insulating layer 132L. Each of the sacrificial first-tier opening fill portions (148, 128) may, or may not, include cavities therein. The set of all structures located between the bottommost surface of the first vertically alternating sequence (132L, 142L) and the topmost surface of the first vertically alternating sequence (132L, 142L) or embedded within the first vertically alternating sequence (132L, 142L) constitutes a first-tier structure.

Figure 5:
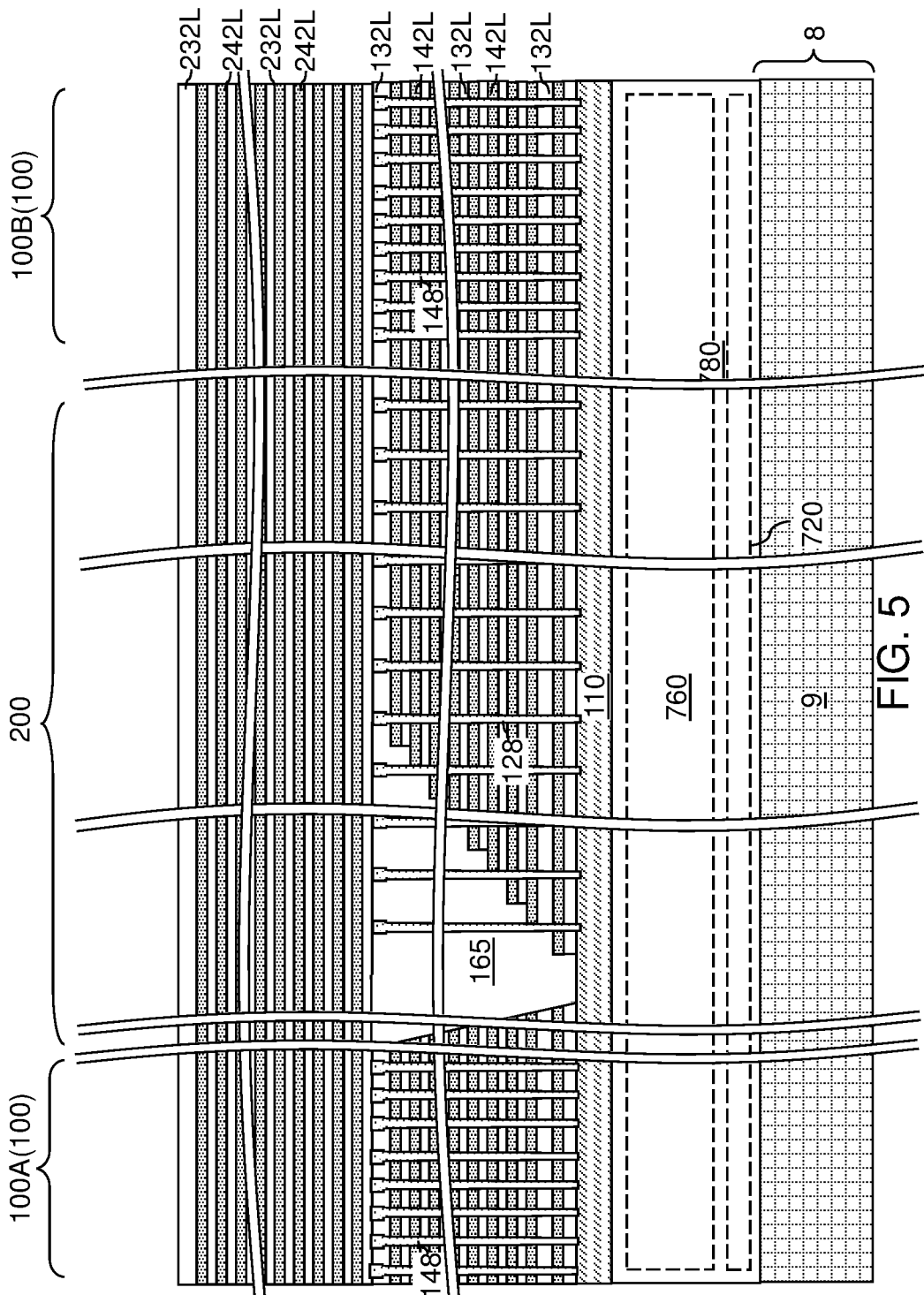
FIG. 5 is a vertical cross-sectional view of the first exemplary structure after formation of a second vertically alternating sequence of second continuous insulating layers and second continuous sacrificial material layers according to the first embodiment of the present disclosure.

Referring to FIG. 5, a second vertically alternating sequence of second continuous insulating layers 232L and second continuous sacrificial material layers 242L can be formed. Each of the second continuous insulating layers 232L is an insulating layer that continuously extends over the entire area of the substrate 8, and may have a uniform thickness throughout. Each of the second sacrificial material layers 242L includes is a sacrificial material layer that includes a dielectric material and continuously extends over the entire area of the substrate 8, and may have a uniform thickness throughout. The second continuous insulating layers 232L can have the same material composition and the same thickness as the first continuous insulating layers 132L. The second sacrificial material layers 242L can have the same material composition and the same thickness as the first sacrificial material layers 142L.

Generally, at least one additional vertically alternating sequence of additional continuous insulating layers and additional continuous sacrificial material layers can be optionally formed over the first vertically alternating sequence (132L, 142L) and the first-tier retro-stepped dielectric material portions 165.

Figure 6:
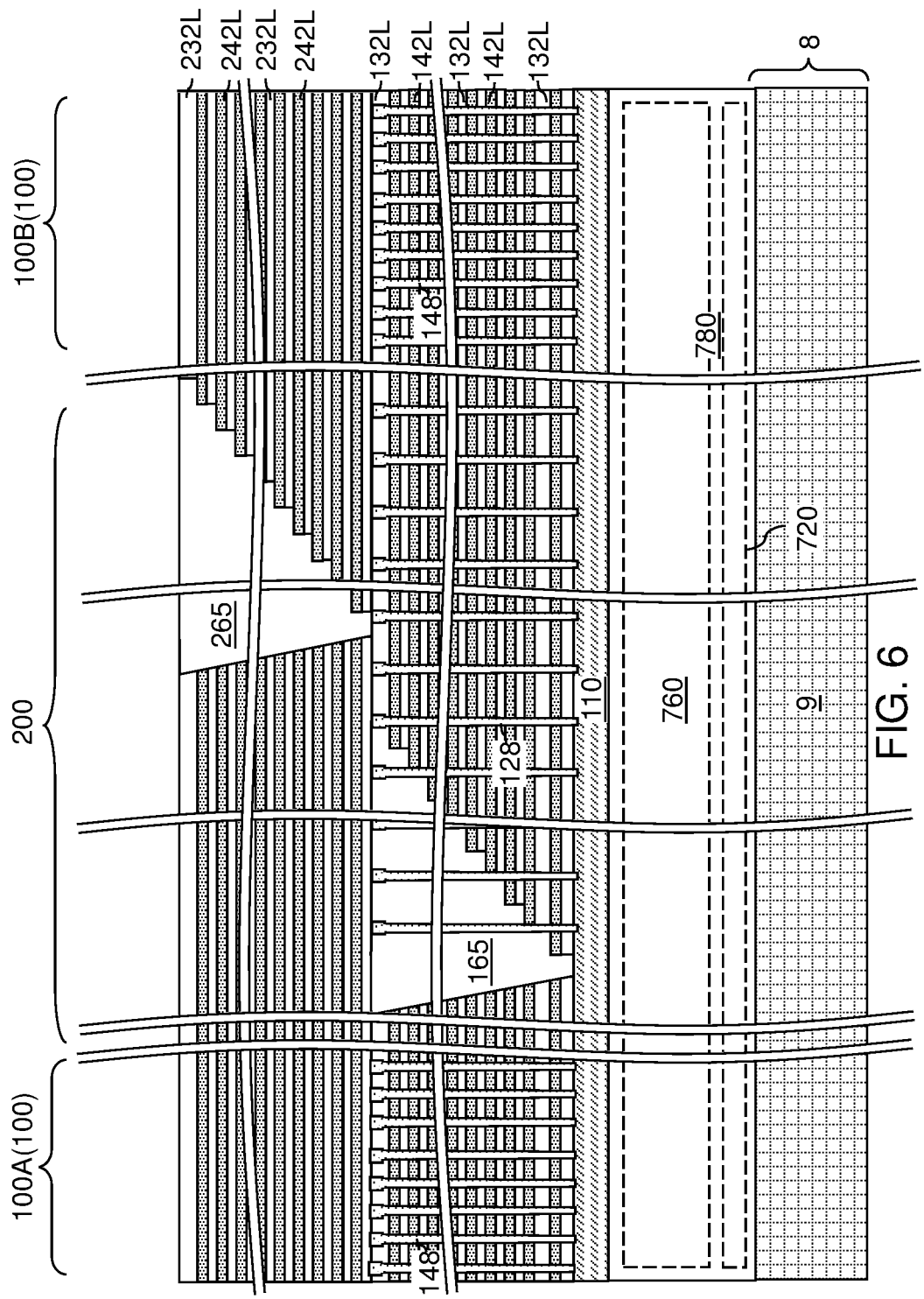
FIG. 6 is a vertical cross-sectional view of the first exemplary structure after formation of second-tier retro-stepped dielectric material portions according to the first embodiment of the present disclosure.

Referring to FIG. 6, second stepped surfaces can be formed within the inter-array region 200 simultaneously. The areas of the second stepped surfaces are laterally offset from respective proximal first stepped surfaces along the first horizontal direction hd1 so that a set of first stepped surfaces and a set of second stepped surfaces that are laterally spaced along the first horizontal direction hd1 and are not offset along the second horizontal direction hd2 can provide a continuously ascending staircase or a continuously descending staircase. For example, a hard mask layer (not shown) such as a metallic or dielectric mask material layer can be formed over the second vertically alternating sequence, and can be patterned to form multiple rectangular openings that are laterally offset from a respective first-tier retro-stepped dielectric material portion 165 along the first horizontal direction hd1 and are aligned to (i.e., not laterally offset from) the respective first-tier retro-stepped dielectric material portion 165 along the second horizontal direction hd2. The areas of openings within the hard mask layer correspond to areas in which second stepped surfaces are to be subsequently formed. Each opening through the hard mask layer may be rectangular, and may have a pair of sides that are parallel to the first horizontal direction hd1 and a pair of sides that are parallel to the second horizontal direction hd2. The rectangular openings through the hard mask layer may be arranged along the second horizontal direction hd1, and may be alternately staggered along the second horizontal direction hd2. Thus, upon sequentially numbering the rectangular openings along the second horizontal direction hd2, every odd-numbered rectangular opening through the hard mask layer can be formed as a first one-dimensional array arranged along the second horizontal direction hd2 and aligned along the first horizontal direction hd1 (i.e., having a same lateral extent along the first horizontal direction), and every even-numbered rectangular openings through the hard mask layer can be formed as a second one-dimensional array arranged along the second horizontal direction hd2 aligned along the first horizontal direction hd1.

A trimmable mask layer (not shown) can be applied over the second vertically alternating sequence. The trimmable mask layer can include a trimmable photoresist layer that can be controllably trimmed by a timed ashing process. The trimmable mask layer can be patterned with an initial pattern such that a segment of each rectangular opening in the hard mask layer that is most distal from the memory array regions 100 is not masked by the trimmable mask layer, while the rest of each rectangular opening is covered by the trimmable mask layer. For example, the trimmable mask layer can have a rectangular shape having straight edges that are parallel to the second horizontal direction hd2, such that the straight edges are located over a vertical step S of respective second stepped surfaces that is most distal from one of the memory array regions 100.

The second stepped surfaces can be formed within the rectangular openings in the hard mask layer by iteratively performing a set of layer patterning processing steps as many times as the total number of second continuous sacrificial material layers 242L within the second vertically alternating sequence less 1. The set of layer patterning processing steps comprises an anisotropic etch process that etches unmasked portions of a pair of a second continuous insulating layer 232L and a second continuous sacrificial material layer 242L, and a mask trimming process in which the trimmable mask layer is isotropically trimmed to provide shifted sidewalls that are shifted away from the most proximal memory array region 100. A final anisotropic etch process can be performed after the last mask trimming process, and the trimmable mask layer can be removed, for example, by ashing. The hard mask layer can be removed selective to the materials of the second vertically alternating sequence (232L, 242L), for example, by an isotropic etch process (such as a wet etch process).

A second stepped cavity can be formed within each area of the rectangular opening in the hard mask layer. Each second stepped cavity can include a cliff region in which a tapered sidewall of the second vertically alternating sequence vertically extends from the bottommost layer of the second vertically alternating sequence (232L, 242L) to the topmost layer of the second vertically alternating sequence (232L, 242L). Each second stepped cavity has respective second stepped surfaces as stepped bottom surfaces. Each second stepped cavity has a pair of stepped sidewalls that laterally extend along the first horizontal direction hd1. Each stepped sidewall of the second stepped cavity adjoins the second stepped surfaces at the bottom edge, and extends to the top surface of the topmost layer of the second vertically alternating sequence (232L, 242L). Each second stepped cavity defines the lateral extent of respective second stepped surfaces.

The array of second staircase regions can be arranged along the second horizontal direction hd2 with an alternating lateral offsets along the first horizontal direction hd1 to provide a staggered configuration for the second staircase regions. In other words, upon sequentially numerically labeling the second staircase regions with positive integers starting with 1 along the second horizontal direction hd2, every even-numbered second staircase region may be closer to the first memory array region 100A than to the second memory array region 100B, and every odd-numbered second staircase region may be closer to the second memory array region 100B than to the first memory array region 100A. The second stepped cavities can extend through each layer within the second vertically alternating sequence (232L, 242L).

A second dielectric fill material (such as undoped silicate glass or a doped silicate glass) can be deposited in each second stepped cavity 263 and in each well. The second dielectric fill material can be planarized to remove excess portions of the second dielectric fill material from above the horizontal plane including the topmost surface of the second vertically alternating sequence (232L, 242L). Each remaining portion of the second dielectric fill material that fills a respective second stepped cavity 263 constitutes a second-tier retro-stepped dielectric material portion 265. Thus, the second-tier retro-stepped dielectric material portions 265 are formed through the second vertically alternating sequence (232L, 242L).

Figure 7A:
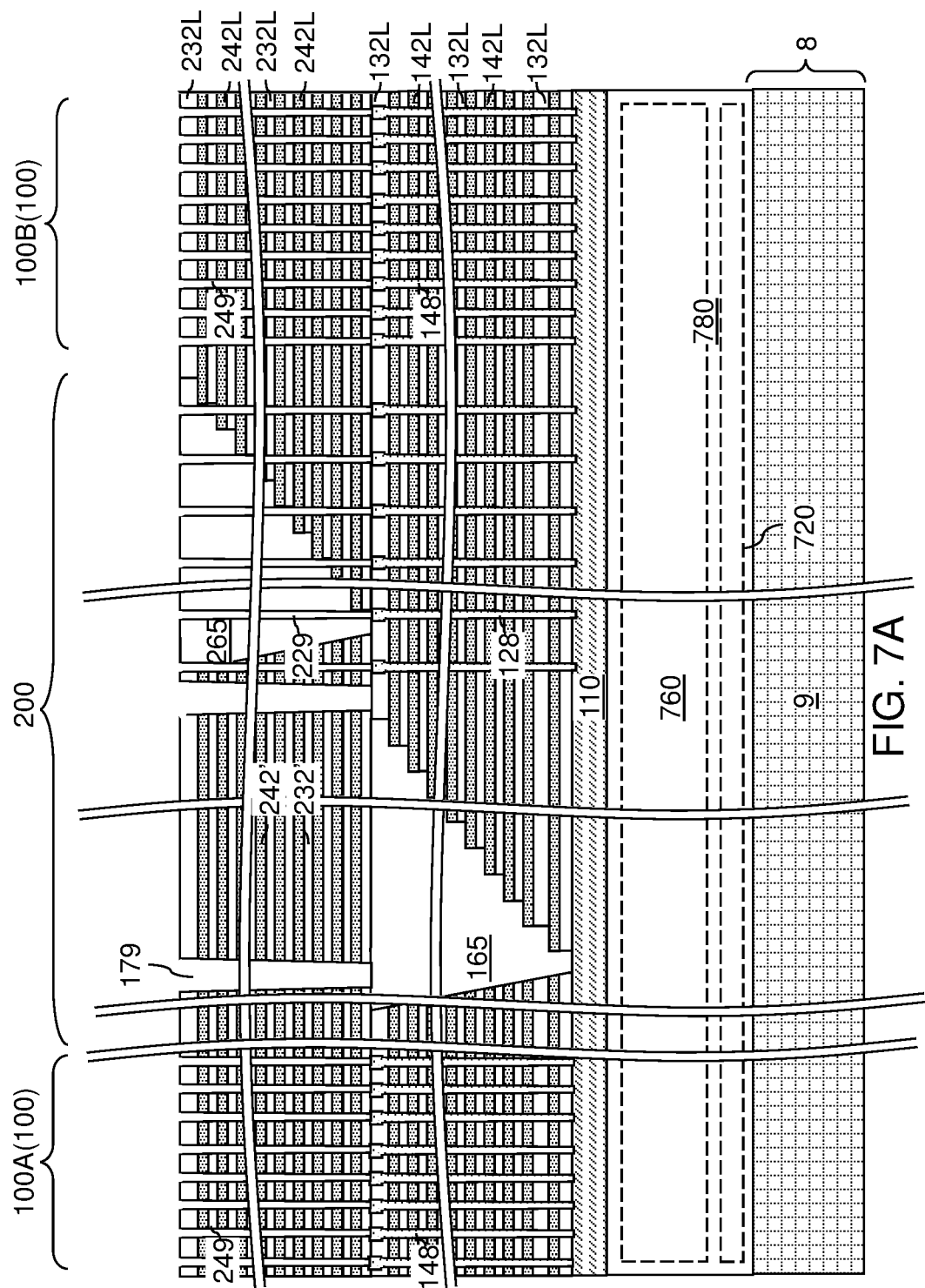
FIG. 7A is a vertical cross-sectional view of the first exemplary structure after formation of second-tier openings and moat trenches through the second vertically alternating sequence according to the first embodiment of the present disclosure.
Figure 7B:
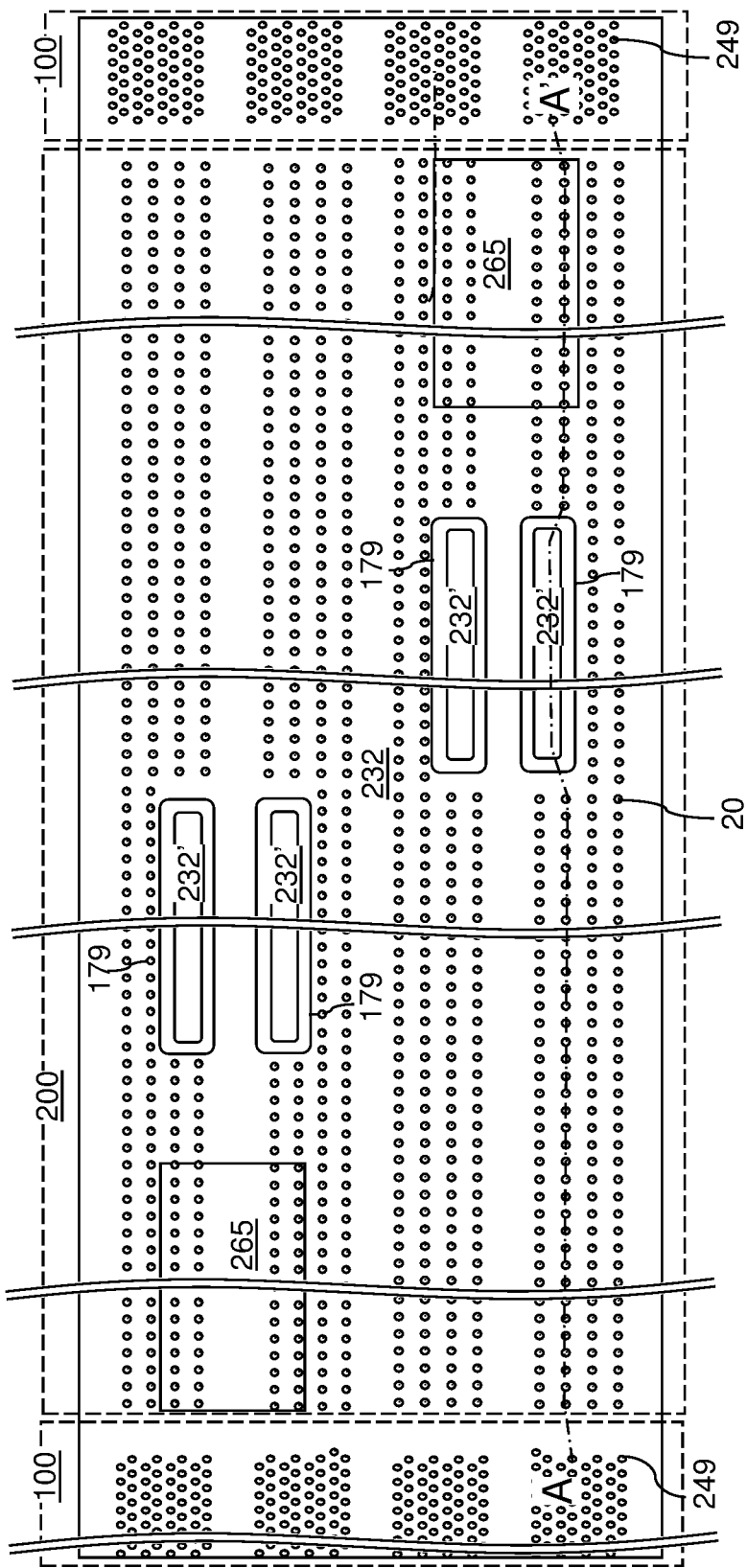
FIG. 7B is a top-down view of the first exemplary structure of FIG. 7A. The hinged vertical plane A-A' is the plane of the vertical cross-sectional view of FIG. 7A.

Referring to FIGS. 7A-7B, various second-tier openings (249, 229) may be formed through the second vertically alternating sequence (232L, 242L) and over the sacrificial first-tier opening fill portions (148, 128). A photoresist layer (not shown) may be applied over the second vertically alternating sequence (232L, 242L), and may be lithographically patterned to form various openings therethrough. The pattern of openings in the photoresist layer may be transferred through the second vertically alternating sequence (232L, 242L) to form the various second-tier openings (249, 229) concurrently, i.e., during the second isotropic etch process.

The various second-tier openings (249, 229) may include second-tier memory openings 249 formed in the memory array regions 100 and second-tier support openings 229 formed in the inter-array region 200. Each second-tier opening (249, 229) may be formed within the area of a respective one of the sacrificial first-tier opening fill portions (148, 128). Thus, a top surface of a sacrificial first-tier opening fill portion (148, 128) can be physically exposed at the bottom of each second-tier opening (249, 229). Specifically, each second-tier memory openings 249 can be formed directly over a respective sacrificial first-tier memory opening fill portion 148, and each second-tier support opening 229 can be formed directly over a respective sacrificial first-tier support opening fill portion 128. Each cluster of second-tier memory openings 249 may be formed as a two-dimensional array of second-tier memory openings 249. The second-tier support openings 229 are openings that are formed in the inter-array region 200, and are subsequently employed to form support pillar structures. A subset of the second-tier support openings may be formed through a respective horizontal surface of the second stepped surfaces.

According to an aspect of the present disclosure, a moat trench 179 can be formed above each first-tier retro-stepped dielectric material portion 165 through the second vertically alternating sequence (232L, 242L). The photoresist layer may be patterned with an additional pattern of moat-shaped openings over each area of the first-tier retro-stepped dielectric material portions 165, and the moat trenches 179 can be formed through the second vertically alternating sequence (232L, 242L) during the anisotropic etch process that forms the second-tier opening (249, 229). Each moat trench 179 laterally surrounds a vertically alternating stack of insulating plates 232' and dielectric material plates 242'. Each insulating plate 232' can be patterned portions of the second continuous insulating layers 232L formed inside a respective moat trench 179, and each dielectric material plate 142' can be patterned portions of the second continuous sacrificial material layers 242L.

In one embodiment, each moat trench 179 can have a pair of first inner sidewalls that laterally extend along the first horizontal direction hd1, a pair of first outer sidewalls that laterally extend along the first horizontal direction hd1, a pair of second inner sidewalls that laterally extend along a second horizontal direction hd2 that is perpendicular to the first horizontal direction hd1, and a pair of second outer sidewalls that laterally extend along the second horizontal direction hd2. In one embodiment, each moat trench 179 can have a horizontal cross-sectional shape having a closed inner periphery and a closed outer periphery. The closed inner periphery can have a shape of a rectangle or a rounded rectangle. The closed outer periphery can have a shape of a rectangle or a rounded rectangle, and can be laterally offset outward from the closed inner periphery. The sidewalls of each moat trench 179 may be substantially vertical or vertical, and/or may have a taper angle in a range from 0.1 degree to 20 degrees, such as from 3 degrees to 15 degrees (such as from 5 degrees to 10 degrees) with respect to the vertical direction. A top surface of a first-tier retro-stepped dielectric material portion 165 can be physically exposed at the bottom of each moat trench 179. In one embodiment, the entire bottom surface of a moat trench 179 can be a portion of a top surface of a respective first-tier retro-stepped dielectric material portion 165.

The photoresist layer can be subsequently removed, for example, by ashing. The set of all structures located between the bottommost surface of the second vertically alternating sequence (232L, 242L) and the topmost surface of the second vertically alternating sequence (232L, 242L) or embedded within the second vertically alternating sequence (232L, 242L) constitutes a second-tier structure.

Figure 8:
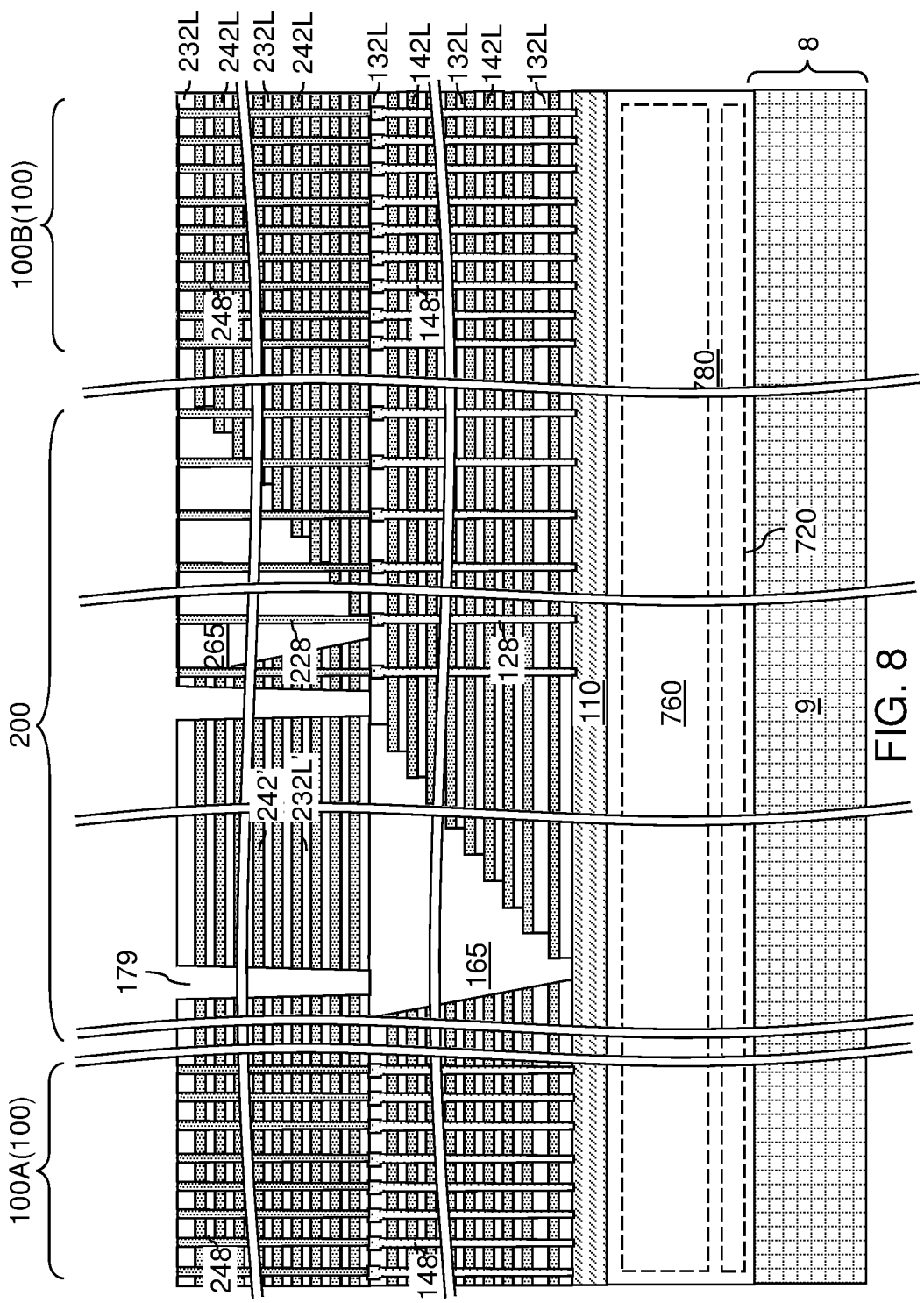
FIG. 8 is a vertical cross-sectional view of the first exemplary structure after formation of sacrificial second-tier opening fill structures according to the first embodiment of the present disclosure.

Referring to FIG. 8, sacrificial second-tier opening fill portions (248, 228) may be formed in the various second-tier openings (249, 229). For example, a sacrificial second-tier fill material is deposited concurrently deposited in each of the second-tier openings (249, 229) and in the moat trenches 179. The sacrificial second-tier fill material includes a material that may be subsequently removed selective to the materials of the second continuous insulating layers 232L and the second continuous sacrificial material layers 242L. In one embodiment, the sacrificial second-tier fill material may be the same as, or may be different from, the sacrificial first-tier fill material of the sacrificial first-tier opening fill portions (148, 128).

In one embodiment, the sacrificial second-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 2 nm to 3 nm) may be used prior to depositing the sacrificial second-tier fill material. The sacrificial second-tier fill material may be formed by a non-conformal deposition or a conformal deposition method.

In another embodiment, the sacrificial second-tier fill material may include a silicon oxide material having a higher etch rate than the materials of the second continuous insulating layers 232L. For example, the sacrificial second-tier fill material may include borosilicate glass or porous or non-porous organosilicate glass having an etch rate that is at least 200 times higher than the etch rate of densified TEOS oxide (i.e., a silicon oxide material formed by decomposition of tetraethylorthosilicate glass in a chemical vapor deposition process and subsequently densified in an anneal process) in a 200:2 dilute hydrofluoric acid. In this case, a thin etch stop liner (such as a silicon nitride layer having a thickness in a range from 2 nm to 3 nm) may be used prior to depositing the sacrificial second-tier fill material. The sacrificial second-tier fill material may be formed by a non-conformal deposition or a conformal deposition method.

In yet another embodiment, the sacrificial second-tier fill material may include carbon-containing material (such as amorphous carbon or diamond-like carbon) that may be subsequently removed by ashing, or a silicon-based polymer that may be subsequently removed selective to the materials of the second vertically alternating sequence (232L, 242L).

Portions of the deposited sacrificial material may be removed from above the topmost layer of the second vertically alternating sequence (232L, 242L), such as from above the topmost second continuous insulating layer 232L. For example, the sacrificial second-tier fill material may be recessed to a top surface of the topmost second continuous insulating layer 232L using a planarization process. The planarization process may include a recess etch, chemical mechanical planarization (CMP), or a combination thereof. The top surface of the topmost second continuous insulating layer 232L may be used as an etch stop layer or a planarization stop layer.

Remaining portions of the sacrificial second-tier fill material comprise sacrificial second-tier opening fill portions (248, 228). Specifically, each remaining portion of the sacrificial material in a second-tier memory opening constitutes a sacrificial second-tier memory opening fill portion 248. Each remaining portion of the sacrificial material in a second-tier support opening constitutes a sacrificial second-tier support opening fill portion 228. The various sacrificial second-tier opening fill portions (248, 228) are concurrently formed, i.e., during a same set of processes including the deposition process that deposits the sacrificial second-tier fill material and the planarization process that removes the second-tier deposition process from above the second vertically alternating sequence (232L, 242L) (such as from above the top surface of the topmost second continuous insulating layer 232L). The top surfaces of the sacrificial second-tier opening fill portions (248, 228) may be coplanar with the top surface of the topmost second continuous insulating layer 232L. Each of the sacrificial second-tier opening fill portions (248, 228) may, or may not, include cavities therein.

Each moat trench 179 can be filled with a respective portion of the sacrificial second-tier fill material. An additional photoresist layer (not shown) can be applied over the second vertically alternating sequence (232L, 242L), and can be lithographically patterned to form openings over each area of the moat trenches 179. An etch process can be performed to etch the portions of the sacrificial second-tier fill material from the moat trenches 179 selective to the materials of the second vertically alternating sequence (232L, 242L) and the first-tier retro-stepped dielectric material portion 165. The etch process may include an isotropic etch process (such as a wet etch process) or an anisotropic etch process. (such as a reactive ion etch process). Each moat trench 179 contains a respective tubular void after removal of the sacrificial second-tier fill material from inside each moat trench 179.

In an alternative embodiment, each moat trench 179 is formed after formation of the sacrificial second-tier opening fill portions (248, 228). In this alternative embodiment, the additional photoresist layer can be applied over the second vertically alternating sequence (232L, 242L) containing the sacrificial second-tier opening fill portions (248, 228), and can be lithographically patterned to form openings over each area of where the moat trenches are to be located. An etch process can be performed to etch the unmasked portions of the second vertically alternating sequence (232L, 242L) to form the moat trenches 179. The additional photoresist layer can then be removed by ashing.

The set of all structures located between the bottommost surface of the second vertically alternating sequence (232L, 242L) and the topmost surface of the second vertically alternating sequence (232L, 242L) or embedded within the second vertically alternating sequence (232L, 242L) constitutes a second-tier structure.

Figure 9:
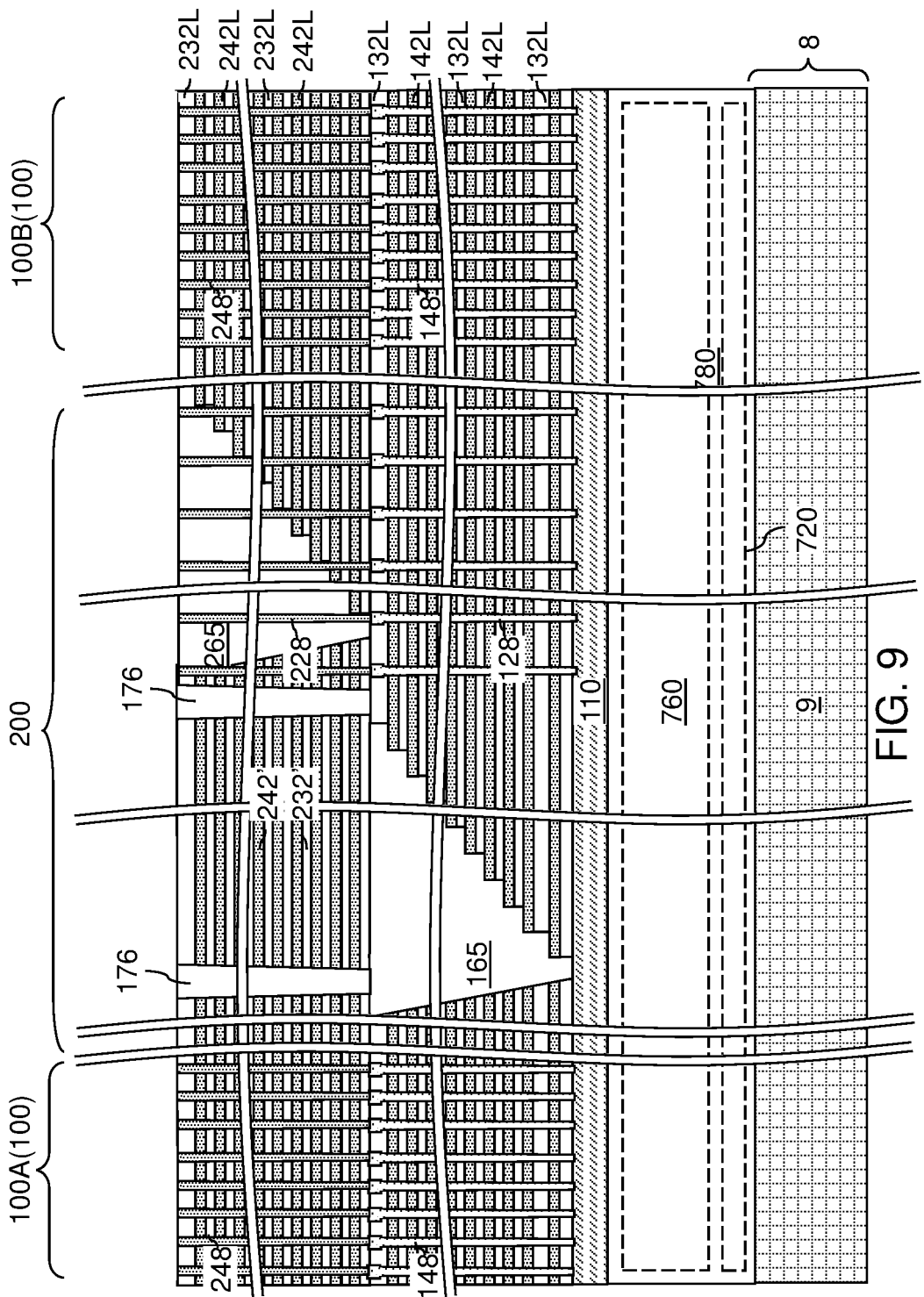
FIG. 9 is a vertical cross-sectional view of the first exemplary structure after formation of dielectric wall structures according to the first embodiment of the present disclosure.

Referring to FIG. 9, a dielectric fill material such as undoped silicate glass or doped silicate glass can be deposited in the moat trenches 179. The dielectric fill material may be deposited by chemical vapor deposition or by spin-coating. Excess portions of the dielectric fill material may be removed from above the horizontal plane including the top surface of the second vertically alternating sequence (232L, 242L). Each remaining portion of the dielectric fill material that fills a moat trench 179 constitutes a dielectric wall structure 176.

In one embodiment, each dielectric wall structure 176 can have a horizontal cross-sectional shape having a closed inner periphery and a closed outer periphery. The closed inner periphery can have a shape of a rectangle or a rounded rectangle. The closed outer periphery can have a shape of a rectangle or a rounded rectangle, and can be laterally offset outward from the closed inner periphery. The sidewalls of the dielectric wall structure 176 may be substantially vertical or vertical, and/or may have a taper angle in a range from 0.1 degree to 20 degrees, such as from 3 degrees to 15 degrees (such as from 5 degrees to 10 degrees) with respect to the vertical direction.

Figure 10:
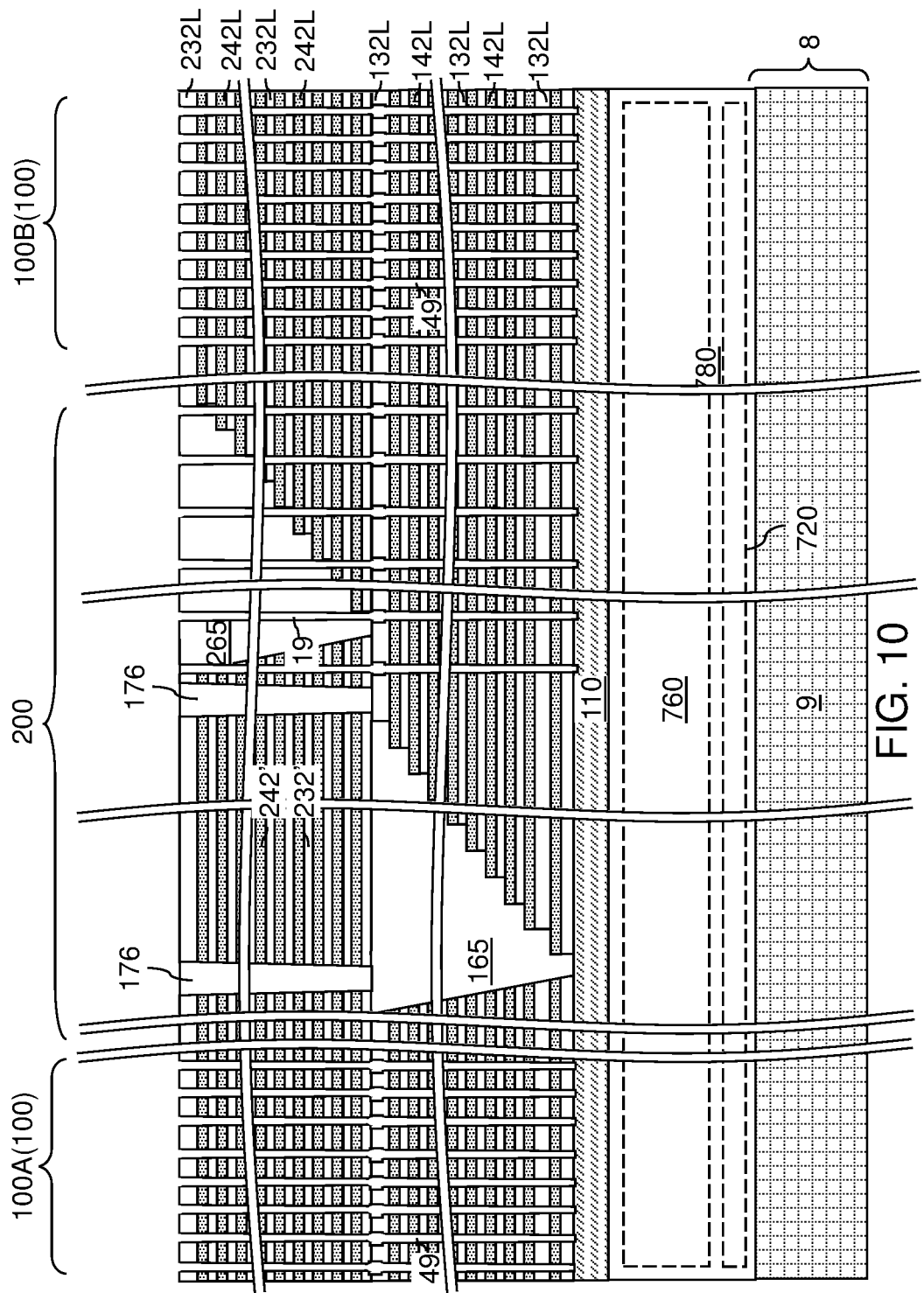
FIG. 10 is a vertical cross-sectional view of the first exemplary structure after formation of inter-tier memory openings and inter-tier support openings according to the first embodiment of the present disclosure.

Referring to FIGS. 10 and 11A, the sacrificial first-tier fill material of the sacrificial first-tier opening fill portions (148, 128) may be removed using an etch process that etches the sacrificial first-tier fill material selective to the materials of the first and second continuous insulating layers (132L, 232L) and the first and second continuous sacrificial material layers (142L, 242L). A memory opening, which is also referred to as an inter-tier memory opening 49, is formed in each combination of a second-tier memory openings and a volume from which a sacrificial first-tier memory opening fill portion 148 is removed. A support opening, which is also referred to as an inter-tier support opening 19, is formed in each combination of a second-tier support openings and a volume from which a sacrificial first-tier support opening fill portion 128 is removed. The inter-tier memory opening 49 extends through the first-tier structure and the second-tier structure. Generally, memory openings 49 can be formed within each memory array region 100, in which each layer of the first vertically alternating sequence (132L, 142L) and each layer within the second vertically alternating sequence (232L, 242L) are present.

Referring to FIG. 11B, a stack of layers including a blocking dielectric layer 52, a charge storage layer 54, a tunneling dielectric layer 56, and a semiconductor channel material layer 60L may be sequentially deposited in the inter-tier memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into continuous sacrificial material layers (142L, 242L). In one embodiment, the charge storage layer 54 includes a silicon nitride layer. In one embodiment, the continuous sacrificial material layers (142L, 242L) and the continuous insulating layers (132L, 232L) may have vertically coincident sidewalls, and the charge storage layer 54 may be formed as a single continuous layer. Alternatively, the continuous sacrificial material layers (142L, 242L) may be laterally recessed with respect to the sidewalls of the continuous insulating layers (132L, 232L), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each inter-tier memory opening 49 that is not filled with the deposited material layers (52, 54, 56, 60L).

Referring to FIG. 11C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the top second continuous insulating layer 232L may be removed, for example, by a recess etch. The recess etch continues until top surfaces of the remaining portions of the dielectric core layer are recessed to a height between the top and bottom surfaces of the topmost second insulating layer 232L. Each remaining portion of the dielectric core layer constitutes a dielectric core 62.

Referring to FIG. 11D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the topmost second continuous insulating layer 232L may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within an inter-tier memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. The memory stack structures 55 can be formed through memory array regions 100 of the first and second vertically alternating sequences in which all layers of the first and second vertically alternating sequences are present. Each combination of a memory stack structure 55, a dielectric core 62, and a drain region 63 within an inter-tier memory opening 49 constitutes a memory opening fill structure 58. Generally, memory opening fill structures 58 are formed within the memory openings 49. Each of the memory opening fill structures 58 comprises a respective memory film 50 and a respective vertical semiconductor channel 60.

Each inter-tier support opening can be filled with a respective set of material portions having the same material composition as a corresponding component in a memory opening fill structure 58. Each set of material portions filling an inter-tier support opening is herein referred to as a support pillar structure 20. It is noted that memory opening fill structures 58 located in the memory array regions 100 are illustrated in FIGS. 1B-1E, and the support pillar structures 20 are not illustrated in FIGS. 1A-1G for the purpose of clarity. The semiconductor material layer 110, the first-tier structure (132L, 142L, 165), the second-tier structure (232L, 242L, 265), the memory opening fill structures 58, and the support pillar structures 20 collectively constitute a memory-level assembly.

Generally, the support pillar structures 20 are formed in the inter-array region 200. The support pillar structures 20 include first support pillar structures 20 that vertically extend through the second vertically alternating sequence (232L, 242L), a first-tier retro-stepped dielectric material portion 165, and a portion of the first vertically alternating sequence (132L, 142L) that underlies the first-tier retro-stepped dielectric material portion 165. The support pillar structures 20 further include second support pillar structures 20 that vertically extend through a second-tier retro-stepped dielectric material portion 265, a portion of the second vertically alternating sequence (232L, 242L) that underlies the second-tier retro-stepped dielectric material portion 265, and each layer within the first vertically alternating sequence (132L, 142L).

Figure 12A:
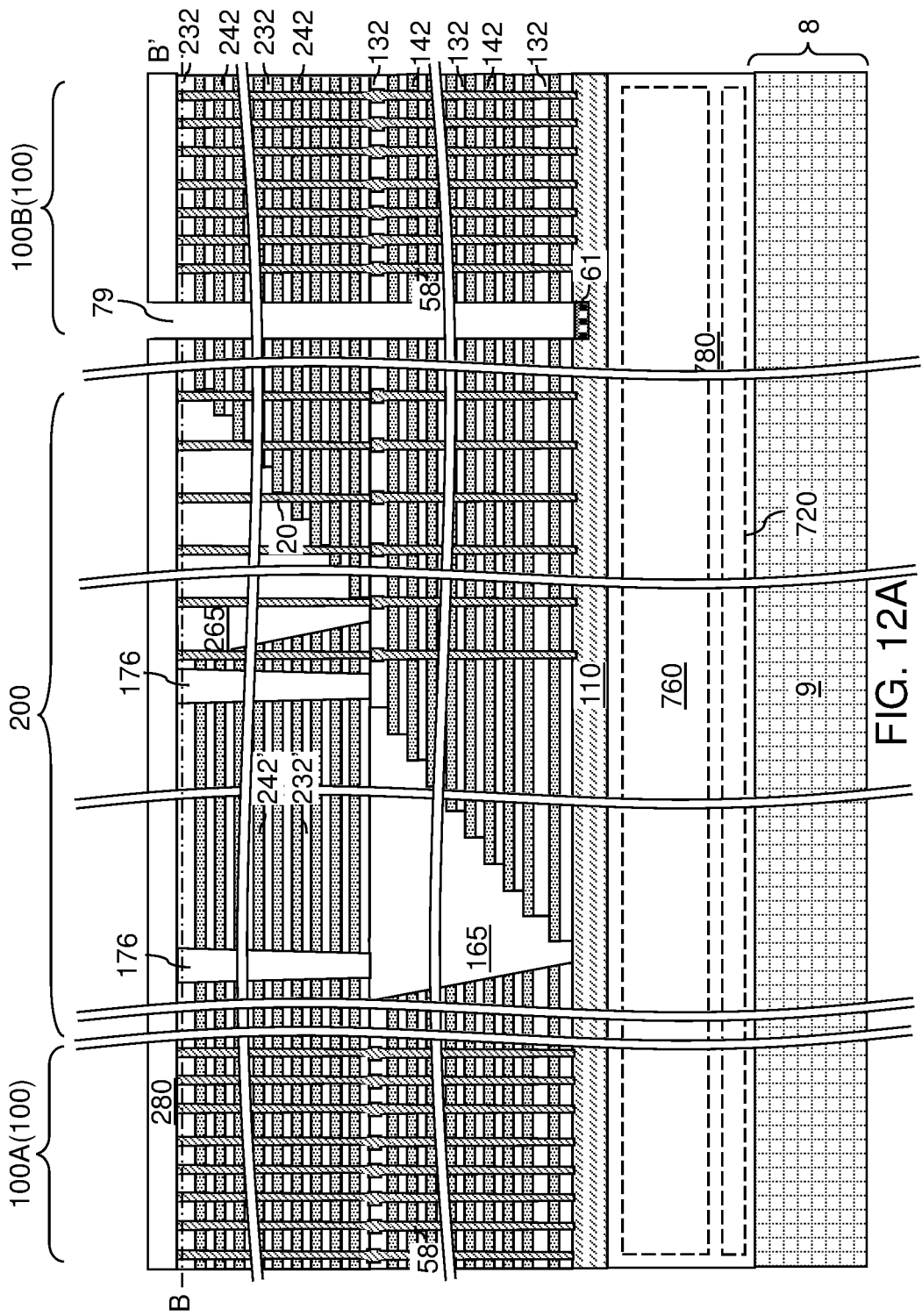
FIG. 12A is a vertical cross-sectional view of the first exemplary structure after formation of memory opening fill structures, support pillar structures, a contact-level dielectric layer, backside trenches, and source regions according to the first embodiment of the present disclosure.
Figure 12B:
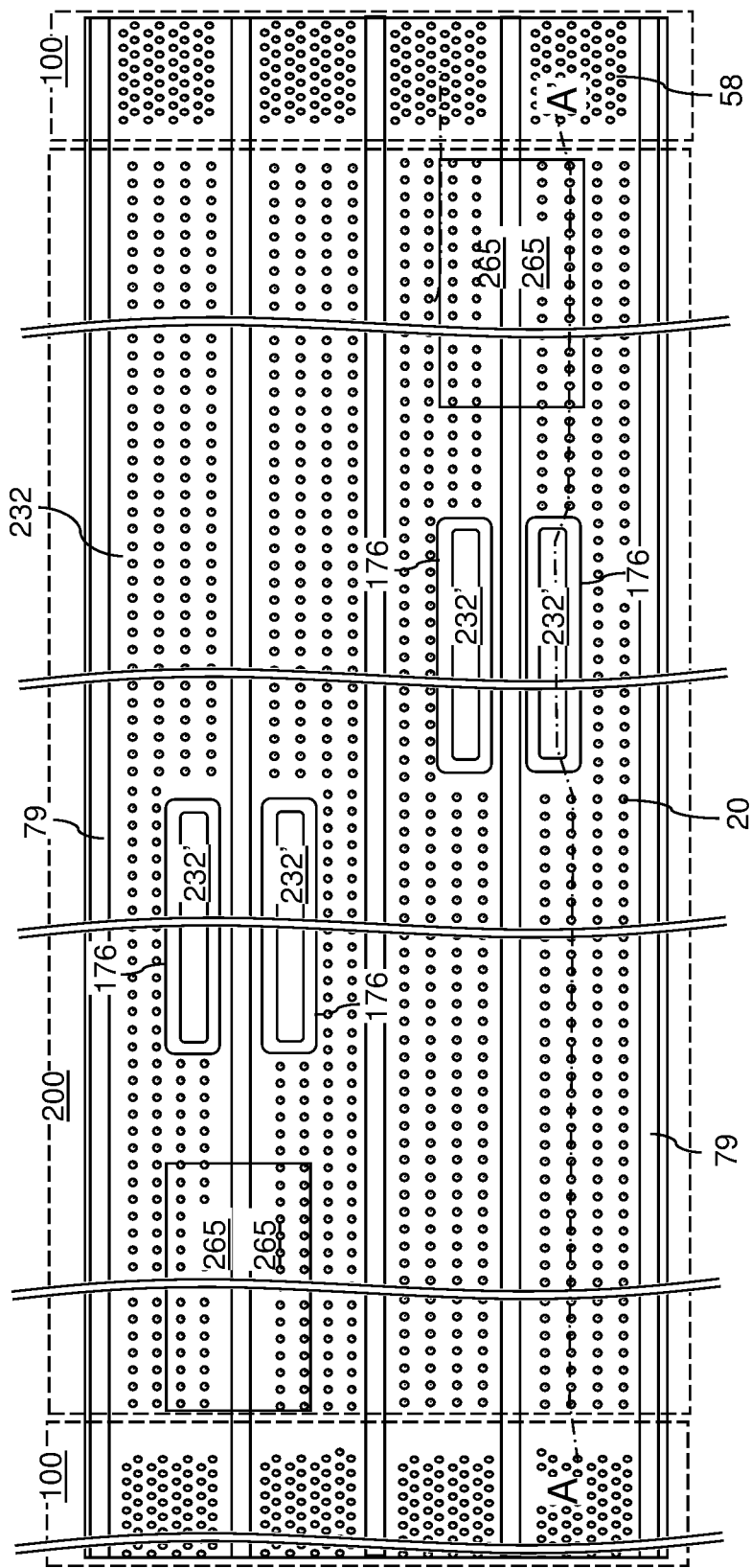
FIG. 12B is a horizontal cross-sectional view along the horizontal plane B-B' of the first exemplary structure of FIG. 12A.

Referring to FIGS. 12A and 12B, contact-level dielectric layer 280 may be formed over the second vertically alternating sequence (232L, 242L). The contact-level dielectric layer 280 includes a dielectric material such as silicon oxide, and may be formed by a conformal or non-conformal deposition process. For example, the contact-level dielectric layer 280 may include undoped silicate glass and may have a thickness in a range from 100 nm to 600 nm, although lesser and greater thicknesses may also be used.

A photoresist layer (not shown) may be applied over the contact-level dielectric layer 280, and may be lithographically patterned to form linear openings laterally extending along the first horizontal direction hd1 and laterally spaced apart along the second horizontal direction hd2. The pattern of the linear openings in the photoresist layer can be identical to the pattern of the backside trench fill structures 76 illustrated in FIGS. 1B-1G. The linear openings in the photoresist layer can be formed within areas in which memory opening fill structures 58 or the support pillar structures 20 are not present.

Backside trenches 79 be formed by transferring the pattern in the photoresist layer (not shown) through the contact-level dielectric layer 280, the second-tier structure (232L, 242L, 265, 176, 232', 242'), and the first-tier structure (132L, 142L, 165), and into the semiconductor material layer 110. The pattern of the backside trenches 79 can be identical to the pattern of the backside trench fill structures 76 illustrated in FIGS. 1B-1G. Portions of the contact-level dielectric layer 280, the second-tier structure (232L, 242L, 265, 176, 232', 242'), the first-tier structure (132L, 142L, 165), and the semiconductor material layer 110 that underlie the linear openings in the photoresist layer may be removed by an anisotropic etch process to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

The backside trenches 79 can be formed as a periodic one-dimensional array with a periodicity along the second horizontal direction hd2. The backside trenches 79 can be sequentially numerically numbered with positive integers from one side to another along the second horizontal direction hd2. In one embodiment, every odd-numbered backside trench 79 can extend through the second vertically alternating sequence (232L, 242L) and the first vertically alternating sequence (132L, 142L) without etching through the first-tier retro-stepped dielectric material portions 165, the second-tier retro-stepped dielectric material portions 265 and the dielectric wall structures 176. Every even-numbered backside trench 79 can extend through the second vertically alternating sequence (232L, 242L) and the first vertically alternating sequence (132L, 142L) and cut through a respective first-tier retro-stepped dielectric material portion 165, and a respective second-tier retro-stepped dielectric material portion 265 without etching through the dielectric wall structures 176.

Each vertically alternating sequence {(132L, 142L), (232L, 242L)} is divided into a plurality of alternating stacks of insulating layers (132 or 232) and sacrificial material layers (142, 242) (which correspond to volumes of memory blocks) by the backside trenches 79. Each backside trench 79 can laterally extend along the first horizontal direction hd1 through am inter-array region 200 and a pair of memory array regions 100 that are adjoined to inter-array region 200. Further, each backside trench 79 can vertically extend through an entire thickness of the vertically alternating sequences {(132L, 142L), (232L, 242L)}. Each patterned portion of the first vertically alternating sequence (132L, 142L) located between a neighboring pair of backside trenches 79 constitutes a first-tier alternating stack of first insulating layers 132 and first sacrificial material layers 142. Each patterned portion of the second vertically alternating sequence located between a neighboring pair of backside trenches 79 constitutes a second-tier alternating stack of second insulating layers 232L and second sacrificial material layers 242. A plurality of alternating stacks of insulating layers (132 or 232) and sacrificial material layers (which may be first sacrificial material layers 142 or second sacrificial material layers 242) can be formed.

Each first-tier retro-stepped dielectric material portion 165 may be divided into two disjoined first-tier retro-stepped dielectric material portions 165 by a backside trench 79. Each second-tier retro-stepped dielectric material portion 265 may be divided into two disjoined second-tier retro-stepped dielectric material portions 265 by a backside trench 79. Each contiguous combination of a first-tier alternating stack (132, 142) and a second-tier alternating stack (232, 242) can be laterally bounded by a neighboring pair of backside trenches 79. One of the neighboring pair of backside trenches 79 can divide a first-tier retro-stepped dielectric material portion 165 into two discrete dielectric material portions, such as a first portion of the first-tier retro-stepped dielectric material portion 165 and a second portion of the first-tier retro-stepped dielectric material portion 165. Further, one of the neighboring pair of backside trenches 79 can divide a second-tier retro-stepped dielectric material portion 265 into two discrete dielectric material portions, such as a first portion of the second-tier retro-stepped dielectric material portion 265 and a second portion of the second-tier retro-stepped dielectric material portion 265.

In one embodiment, the semiconductor material layer 110 can have a doping of the same conductivity type as the vertical semiconductor channels 60, i.e., a first conductivity type, and a source region 61 having a doping of a second conductivity type (which is the same conductivity type as the doping of the drain regions 63) can be formed underneath each backside trench 79 by implantation of dopants of the second conductivity type.

Figure 13:
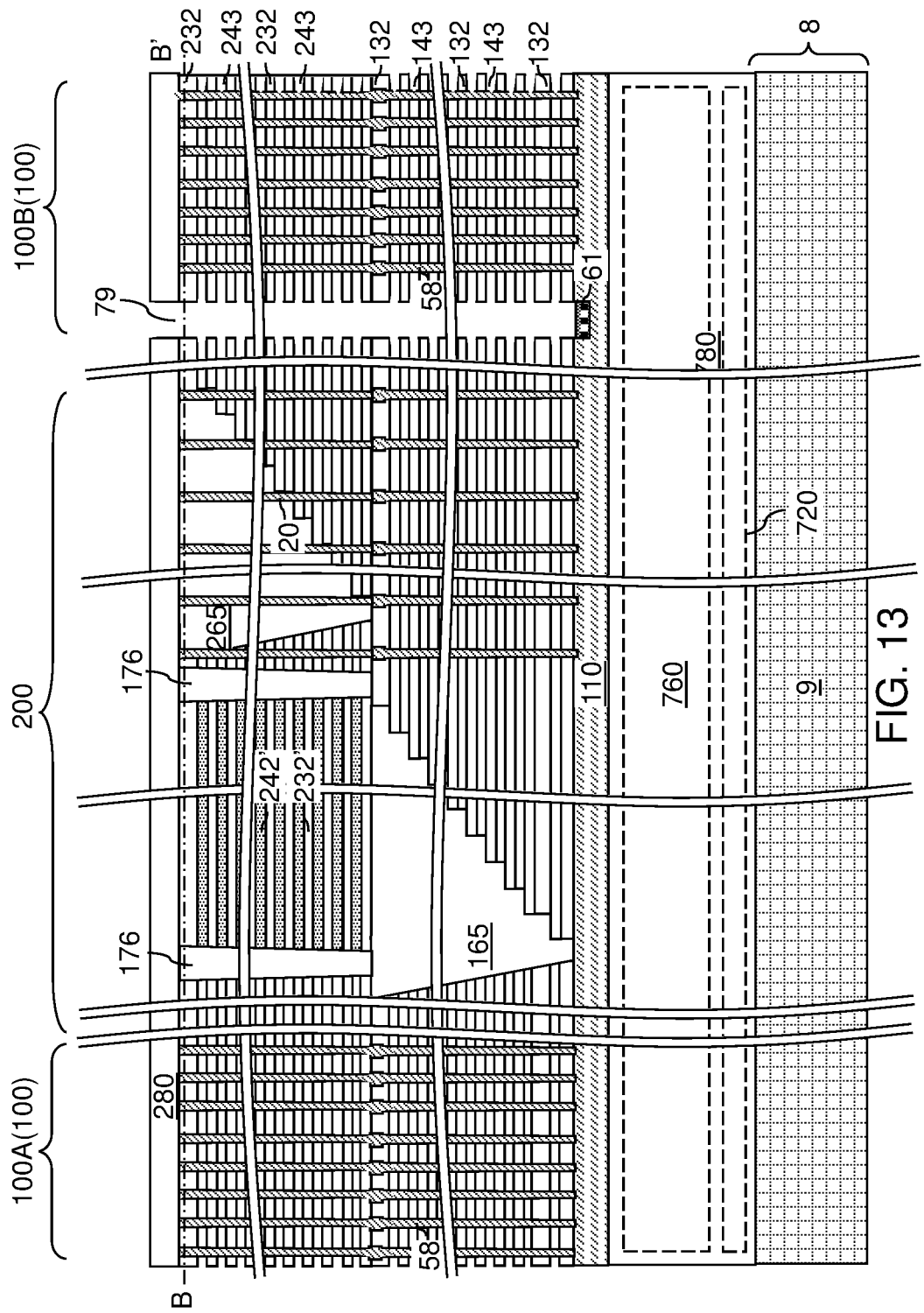
FIG. 13 is a vertical cross-sectional view of the first exemplary structure after formation of backside recesses according to the first embodiment of the present disclosure.

Referring to FIG. 13, the sacrificial material layers (142, 242) are removed selective to the insulating layers (132, 232), the contact-level dielectric layer 280, and the semiconductor material layer 110. For example, an etchant that selectively etches the materials of the sacrificial material layers (142, 242) with respect to the materials of the insulating layers (132, 232), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the first exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess. A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Generally, the backside recesses (143, 243) can be formed by removing the patterned portions of the first continuous sacrificial material layers 142L and the second sacrificial material layers 242L selective to patterned portions of the first continuous insulating layers 132L and the second continuous insulating layers 232L after formation of the backside trenches 79. The backside recesses (143, 243) can be formed by performing an isotropic etch process that supplies an isotropic etchant that etches the patterned portions of the first continuous sacrificial material layers 142L and the second continuous sacrificial material layers 242L selective to patterned portions of the first continuous insulating layers 132L and the second continuous insulating layers 232L and selective to the dielectric wall structures 176. Surfaces of the dielectric wall structures 176 are physically exposed to a subset of the backside recesses, i.e., the second backside recesses 243, after the isotropic etch process.

An optional backside blocking dielectric layer (not shown) may be optionally deposited in the backside recesses (143, 243) and the backside trenches 79 and over the contact-level dielectric layer 280. The backside blocking dielectric layer includes a dielectric material such as a dielectric metal oxide (e.g., aluminum oxide), silicon oxide, or a combination thereof.

At least one conductive material may be deposited in the plurality of backside recesses (143, 243), on the sidewalls of the backside trenches 79, and over the contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive layers 146 and the second electrically conductive layers 246 may be physically exposed to a respective backside trench 79. The backside trenches 79 may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20.

A subset of the electrically conductive layers (146, 246) may comprise word lines for the memory elements. The semiconductor devices in the underlying semiconductor devices 720 may comprise word line switch devices configured to control a bias voltage to respective word lines, and/or bit line driver devices, such as sense amplifiers. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the memory stack structures 55 comprises a vertical stack of memory elements located at each level of the electrically conductive layers (146, 246).

Generally, the patterned portions of the first continuous sacrificial material layers 142L and the second continuous sacrificial material layers 242L are replaced with the electrically conductive layers (146, 246). A first-tier alternating stack of first insulating layers 132 and first electrically conductive layers 146 can be formed between each neighboring pair of backside trenches 79. The first insulating layers 132 comprise patterned portions of the first continuous insulating layers 132L, and the first electrically conductive layers 146 comprise the first subset of the electrically conductive layers (146, 246) and are interlaced with the first insulating layers 132. A second-tier alternating stack of second insulating layers 232 and second electrically conductive layers 246 is formed between the neighboring pair of backside trenches 79. The second insulating layers 232 comprise patterned portions of the second continuous insulating layers 232L, and the second electrically conductive layers 246 comprise a second subset of the electrically conductive layers (146, 246) that is interlaced with the second insulating layers 246.

Figure 14:
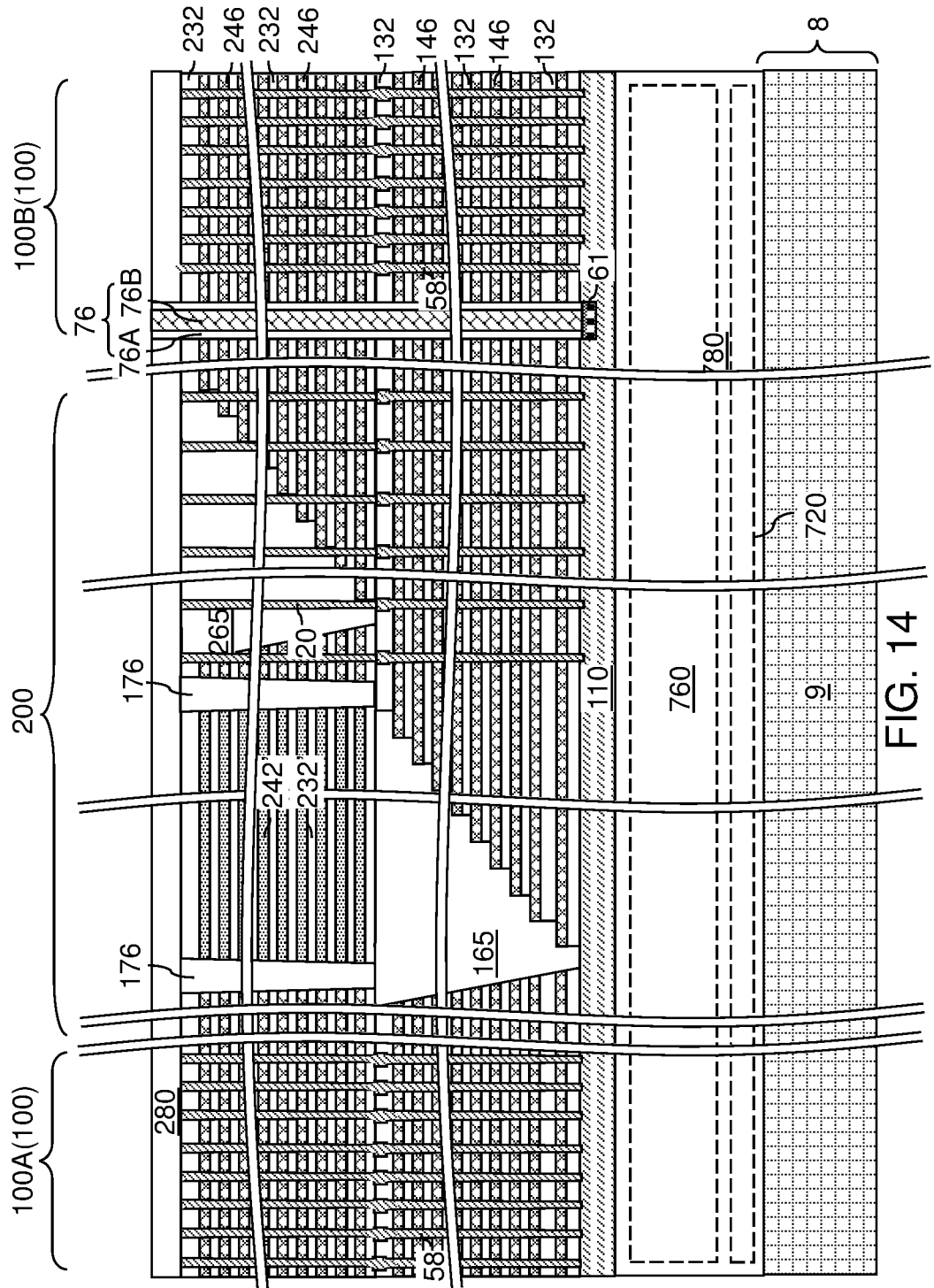
FIG. 14 is a vertical cross-sectional view of the first exemplary structure after formation of electrically conductive layers and backside trench fill structures according to the first embodiment of the present disclosure.

Referring to FIG. 14, a backside trench fill structure 76 can be formed in each backside trench 79. In one embodiment, a dielectric liner layer including a dielectric material (such as silicon oxide) can be conformally deposited at a periphery of each backside trench 79, and can be anisotropically etched to form a dielectric spacer 76A within each backside trench 79. At least one conductive material can be deposited in remaining volumes of the backside trenches 79, and excess portions of the at least one conductive material can be removed from above the top surface of the contact-level dielectric layer 280 by a planarization process. Each remaining portion of the at least one conductive material contacting a source region 61 and laterally surrounded by a respective dielectric spacer 76A constitutes a backside contact via structure 76B, which laterally extends along the first horizontal direction hd1. Each contiguous combination of a dielectric spacer 76A and a backside contact via structure 76B that fills a backside trench 79 constitutes a backside trench fill structure 76.

Alternatively, at least one dielectric material, such as silicon oxide, may be conformally deposited in the backside trenches 79 by a conformal deposition process. Each portion of the deposited dielectric material that fills a backside trench 79 constitutes a backside trench fill structure 76. In this case, each backside trench fill structure may fill the entire volume of a backside trench 79 and may consist essentially of at least one dielectric material. In this alternative embodiment, the source region 61 may be omitted, and a horizontal source line (e.g., a direct strap contact layer) may contact a side of the lower portion of the semiconductor channel 60.

The backside trench fill structures 76 can be arranged in a configuration illustrated in FIGS. 1B-1G. In one embodiment, each first-tier retro-stepped dielectric material portion 165, each second-tier retro-stepped dielectric material portion 265, and each dielectric wall structure 176 can be located between a neighboring pair of the backside trench fill structures 76.

Figure 15:
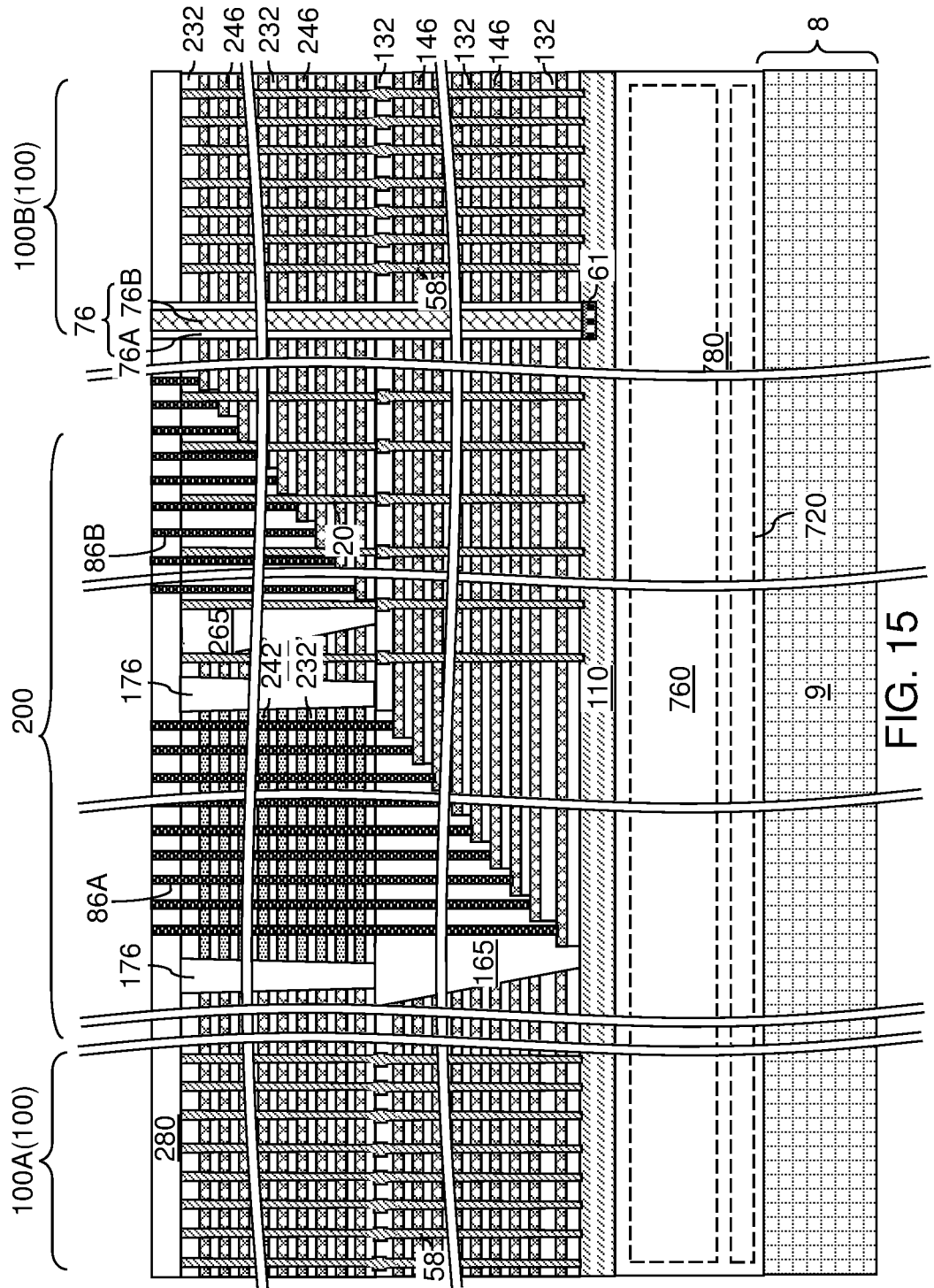
FIG. 15 is a vertical cross-sectional view of the first exemplary structure after formation of various contact via structures according to the first embodiment of the present disclosure.
Figure 16A:
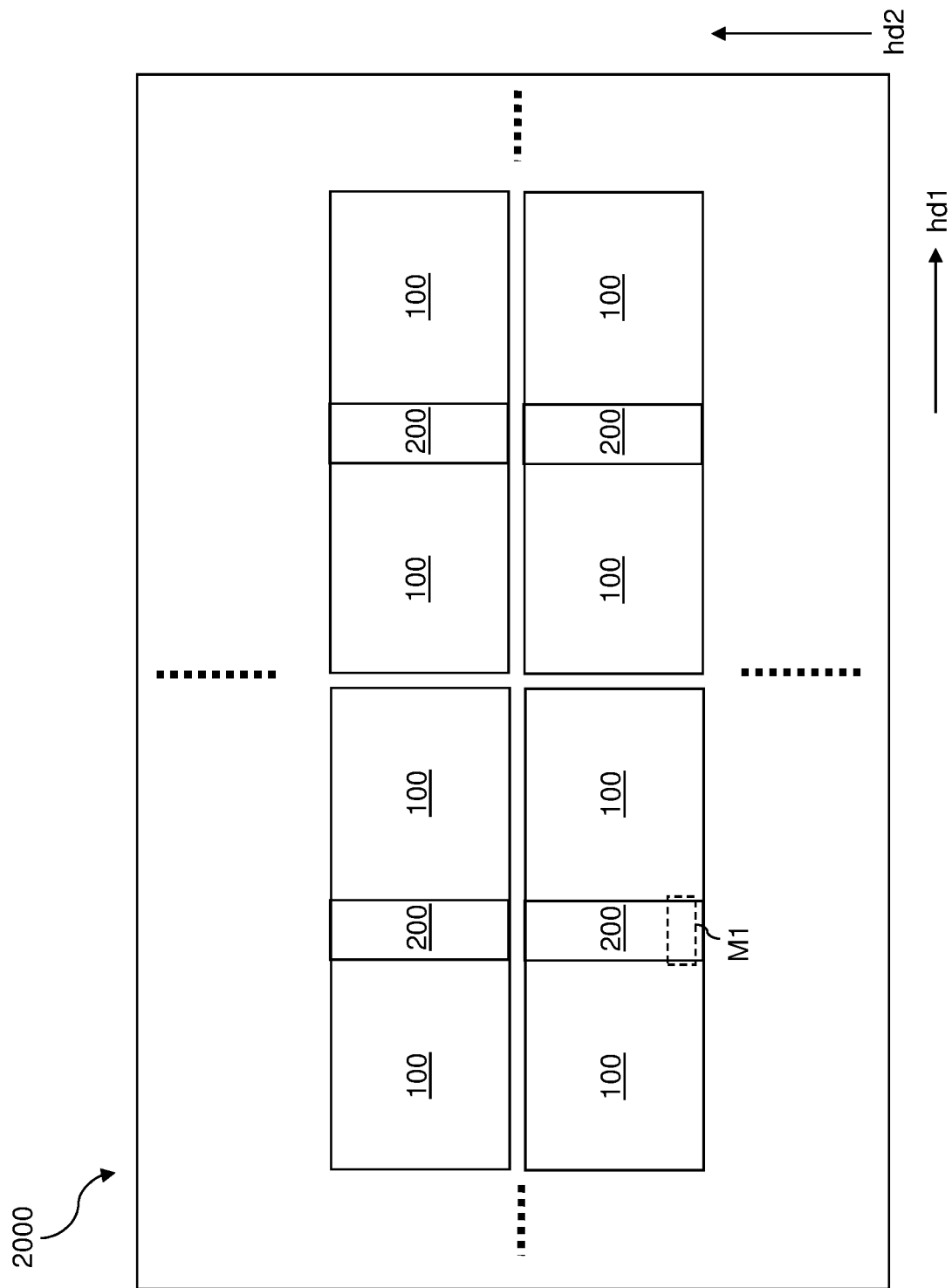
FIG. 16A is a plan view of a second exemplary semiconductor die including multiple three-dimensional memory array regions according to a second embodiment of the present disclosure.
Figure 16B:
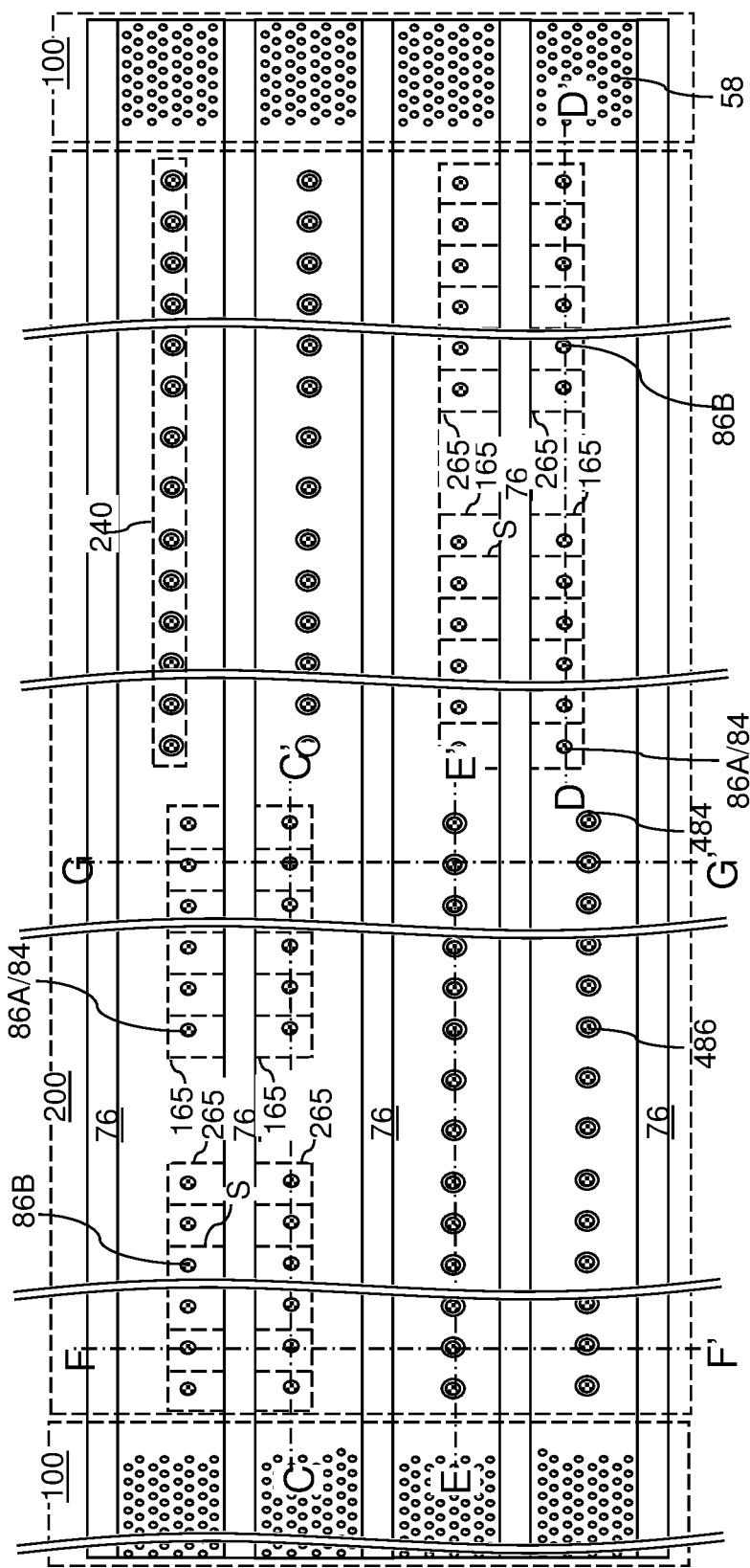
FIG. 16B is a schematic see-through top-down view of region M1 of FIG. 16A.
Figure 16C:
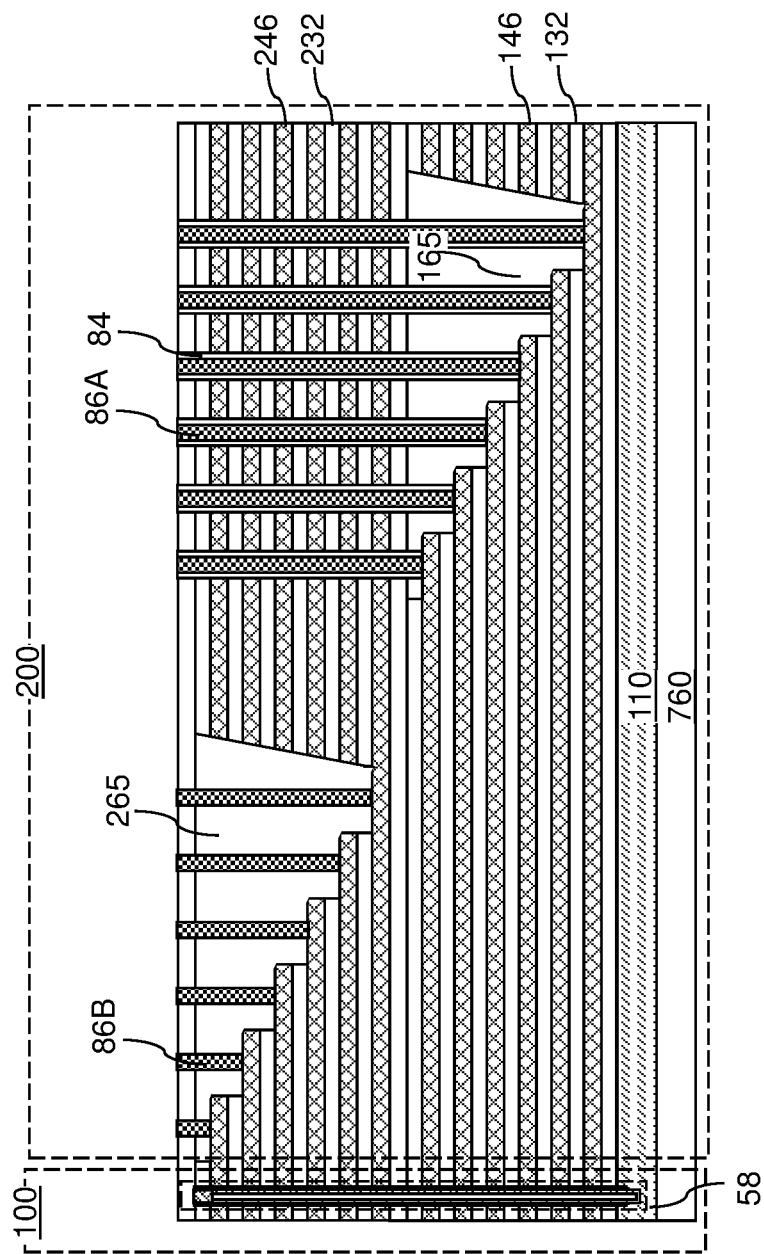
FIG. 16C is a schematic vertical cross-sectional view of a region of the second exemplary semiconductor die along the vertical plane C-C' of FIG. 16B.
Figure 16D:
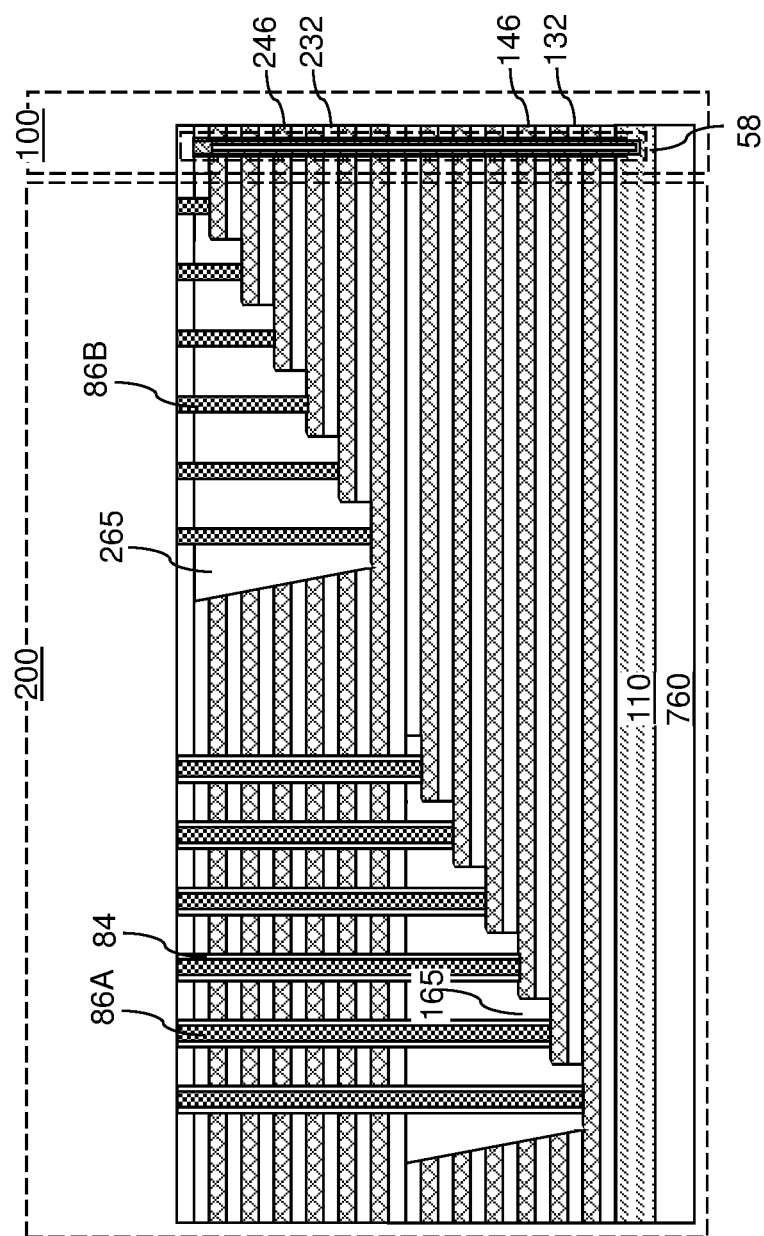
FIG. 16D is a schematic vertical cross-sectional view of a region of the second exemplary semiconductor die along the vertical plane D-D' of FIG. 16B.
Figure 16E:
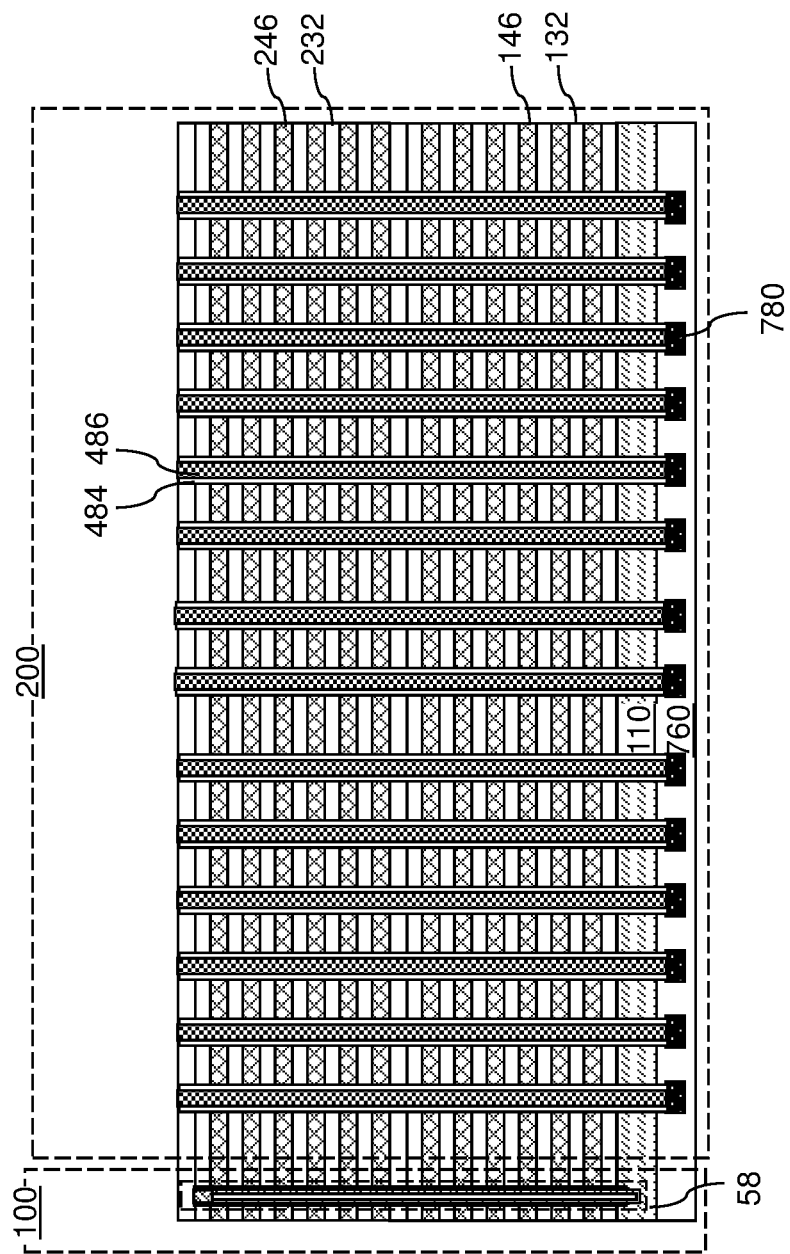
FIG. 16E is a schematic vertical cross-sectional view of a region of the second exemplary semiconductor die along the vertical plane E-E' of FIG. 16B.
Figure 16F:
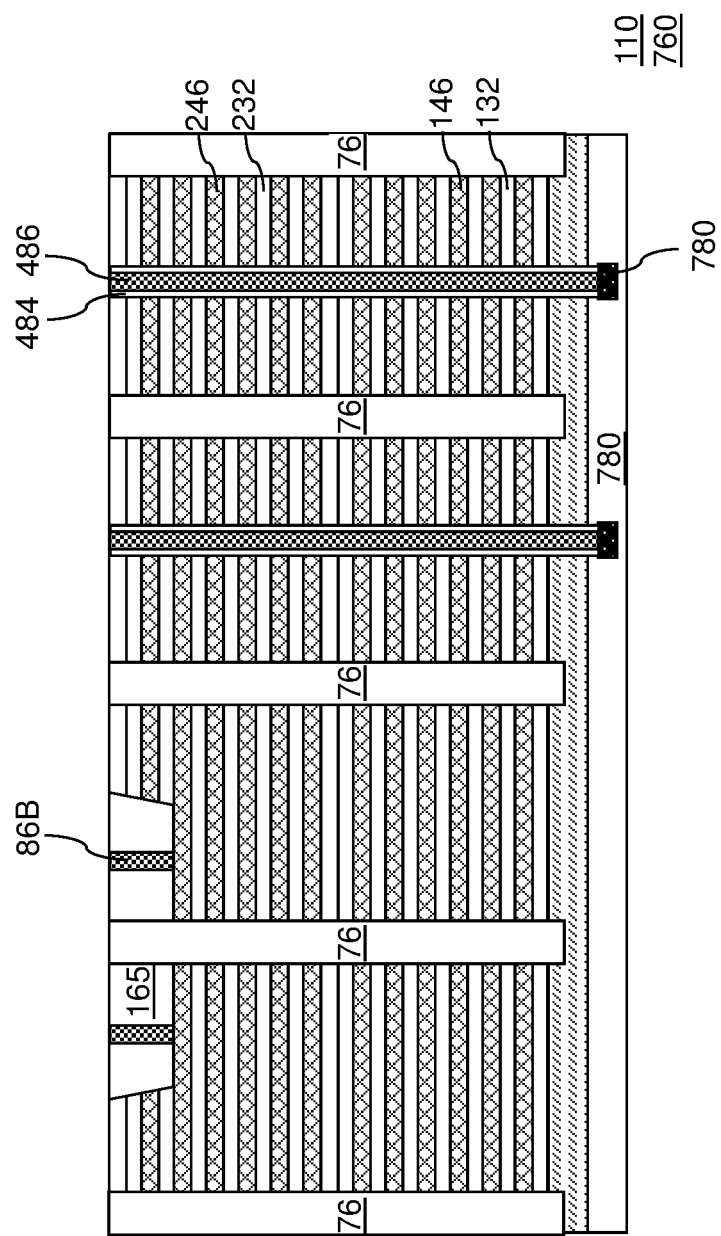
FIG. 16F is a schematic vertical cross-sectional view of a region of the second exemplary semiconductor die along the vertical plane F-F' of FIG. 16B.
Figure 16G:
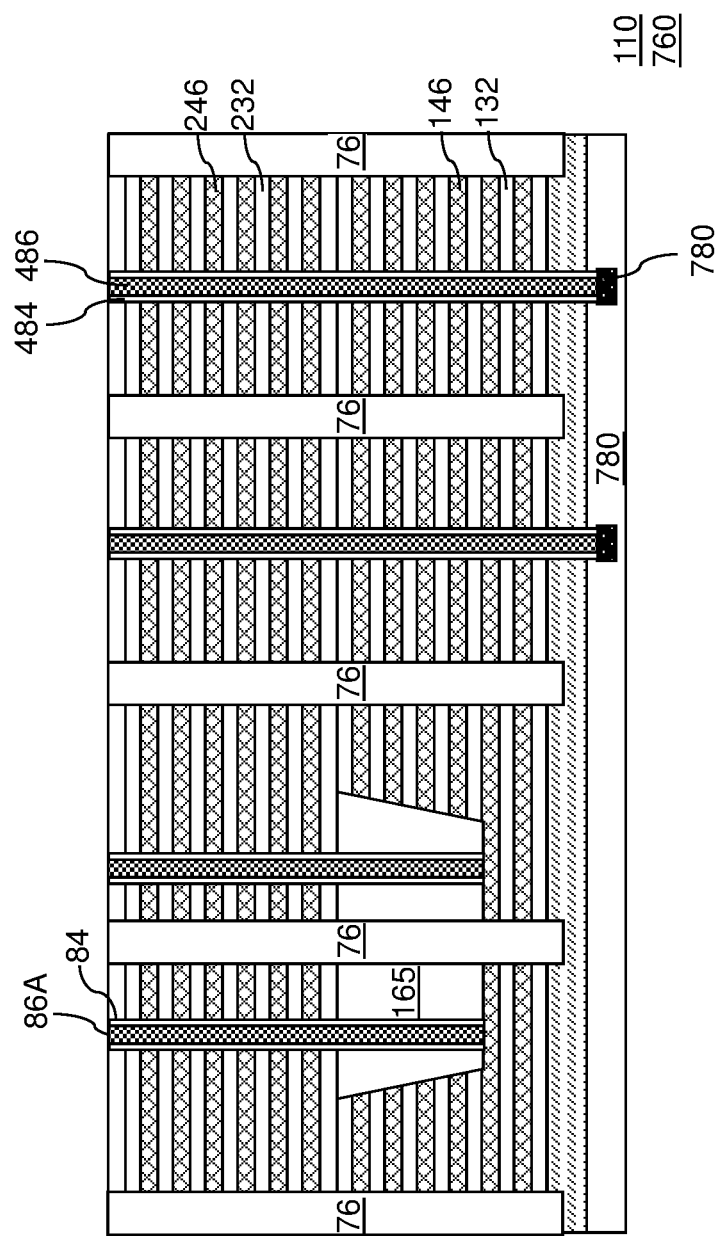
FIG. 16G is a schematic vertical cross-sectional view of a region of the second exemplary semiconductor die along the vertical plane G-G' of FIG. 16B.

Referring to FIG. 15, various contact via structures (88, 86A, 86B, 486) can be formed through the contact-level dielectric layer 280 and optionally through underlying material portions onto a respective underlying conductive structure. The various contact via structures (88, 86A, 86B, 486) can include drain contact via structures (e.g., drain electrodes) 88 that are formed in the memory array regions 100 through the contact-level dielectric layer 280 on a top surface of a respective drain region 63. The various contact via structures (88, 86A, 86B, 486) can include layer contact via structures (86A, 86B) that are formed in the inter-array region 200. The layer contact via structures (86A, 86B) can include first contact via structures 86A that contact a respective first electrically conductive layer 146 and second contact via structures 86B that contact a respective second electrically conductive layer 246.

For example, a photoresist layer (not shown) can be applied over the second-tier alternating stacks (232, 246), and can be lithographically patterned to form openings within areas of the memory opening fill structures 58, areas of the vertically alternating stacks of insulating plates 232' and the dielectric material plates 242', and the second retro-stepped dielectric material portion 265 which is located over the horizontal surfaces of the second stepped surfaces of the second-tier alternating stacks (232, 246). An anisotropic etch process can be performed to transfer the pattern of the openings in the photoresist layer through the contact-level dielectric layer 280, the vertically alternating stacks of insulating plates 232' and the dielectric material plates 242', the first-tier retro-stepped dielectric material portions 165, and the second-tier retro-stepped dielectric material portions 265.

First contact via cavities can be formed through each vertically alternating stack of insulating plates 232' and dielectric material plates 242' and through underlying portions of the first-tier retro-stepped dielectric material portions 165 and directly on a respective horizontal surface of the first stepped surfaces of the first electrically conductive layers 146 of the first-tier alternating stacks (132, 146). Each of the first contact via cavities comprises a sidewall including cylindrical surfaces of the insulating plates 232' and the dielectric material plates 242', and a sidewall including a cylindrical surface of a first-tier retro-stepped dielectric material portion 165. Second contact via cavities can be formed through each second-tier retro-stepped dielectric material portion 265 and directly on a respective horizontal surface of the second stepped surfaces of the second electrically conductive layers 246 of the second-tier alternating stacks (232, 246). The first electrically conductive layers 146 and the second electrically conductive layers 246 can be employed as etch stop structures during the anisotropic etch process. The photoresist layer can be subsequently removed, for example, by ashing.

Drain contact via cavities can be formed over each memory opening fill structure 58. Top portions of the memory opening fill structures 58, such as the drain regions 63, may be employed as etch stop structures during the anisotropic etch process. In one embodiment, the drain contact via cavities may be formed concurrently with formation of the first contact via cavities and the second contact via cavities. Alternatively, the drain contact via cavities may be formed prior to, or after, formation of the first contact via cavities and the second contact via cavities employing an additional lithographic patterning process and an additional anisotropic etch process.

At least one conductive material can be deposited in each of the first contact via cavities, the second contact via cavities, and the drain contact via cavities. The at least one conductive material can include, for example, a metallic barrier material (such as TiN, TaN, and/or WN) and a metallic fill material (such as W, Cu, Mo, Co, Ru, etc.). Excess portions of the at least one conductive material can be removed from above the horizontal plane including the top surface of the contact-level dielectric layer employing a planarization process (such as a chemical mechanical planarization process). Each remaining portion of the at least one conductive material filling the first contact via cavities comprises a first contact via structure 86A. Each remaining portion of the at least one conductive material filling the second contact via cavities comprise a second contact via structure 86B. Each remaining portion of the at least one conductive material filling the drain contact via cavities comprises drain contact via structures 88.

The first contact via structures 86A can be formed through a respective vertically alternating stack of insulating plates 232' and dielectric material plates 242' and through a portion of a respective first retro-stepped dielectric material portion 165 and directly on a first subset of the electrically conductive layers, i.e., the first electrically conductive layers 146. The second contact via structures 86B can be formed through a portion of a respective second retro-stepped dielectric material portion 265 and directly on a second subset of the electrically conductive layers (i.e., the second electrically conductive layers 246) that is located over a horizontal plane including top surfaces of the first-tier retro-stepped dielectric material portions 165.

Further, laterally-isolated vertical interconnection structures (484, 486) can be formed through the alternating stacks (132, 146, 232, 246) in the array interconnection region 240. Each laterally-isolated vertical interconnection structures (484, 486) can include a through-memory-level conductive via structure 486 and a tubular insulating spacer 484 that laterally surrounds the conductive via structure 486. Each through-memory-level conductive via structure 486 can contact a respective one of the lower-level metal interconnect structure 780 embedded within the lower-level dielectric material layers 760.

Bit lines (not shown) are then formed in a manner that provides electrical contact with the drain contact via structures 88. The bit lines may directly contact top surfaces of a respective subset of the drain contact via structures 88, or intermediate contact via structures (not shown) may be employed between the drain contact via structures 88 and the bit lines.

Referring to FIGS. 16A-16G, a second exemplary semiconductor die 2000 according to a second embodiment of the present disclosure is illustrated. The second exemplary semiconductor die 2000 can be derived from the first exemplary semiconductor die 1000 illustrated in FIGS. 1A-1G by omitting formation of the dielectric wall structures 176 and the vertical stacks of insulating plates 232' and the dielectric material plates 242'. In the second embodiment, a row of laterally-isolated contact via structures (86A, 84) is formed in place of the dielectric wall structures 176 and the vertical stacks of insulating plates 232' and the dielectric material plates 242'. The row of laterally-isolated contact via structures (86A, 84) is formed by forming an array of dielectric pillar and forming first contact via cavities through the dielectric pillar structures such that each remaining portion of the dielectric pillar structures comprise a tubular insulating liner 84. Each first contact via structure 86A can be formed through a respective one of the tubular insulating liners 84 directly on a respective first electrically conductive layer 146.

Otherwise, the second exemplary semiconductor die 2000 according to the second embodiment is the same as the first exemplary semiconductor die 1000 according to the first embodiment, and the elements of the second exemplary semiconductor die 2000 according to the second embodiment which are the same as the corresponding elements of the first exemplary semiconductor die 1000 will not be described again for brevity.

In the second embodiment illustrated in FIGS. 16A-16G, the neighboring staircases (i.e., adjacent staircases along the second horizontal direction (e.g., bit line direction) hd2) are staggered in opposite directions. In other words, the neighboring staircases rise in opposite directions perpendicular to the second horizontal direction hd2. However, it should be understood that the present disclosure is not limited to staggered neighboring staircases. In an alternative embodiment, the neighboring staircases may be non-staggered, and may rise in the same direction (e.g., the first horizontal direction (e.g., word line direction) hd1) perpendicular to the second horizontal direction hd2.

In the second embodiment, a contiguous combination of the tubular insulating liner 84 and the first contact via structure 86A constitutes the laterally-isolated contact via structure (86A, 84). The laterally-isolated contact via structures (86A, 84) vertically extend through a respective second-tier alternating stack (232, 246) and a respective first-tier retro-stepped dielectric material portion 165, and contact a respective one of the first electrically conductive layers 146. Each of the laterally-isolated contact via structures (86A, 84) comprises a first contact via structure 86A and a tubular insulating liner 84 that surrounds the first contact via structure 86A.

In one embodiment, each of the tubular insulating liners 84 comprises an annular bottom surface that contacts a top surface of the first retro-stepped dielectric material portion 165. In one embodiment, an inner periphery of the annular bottom surface may be off-centered from an outer periphery of the annular bottom surface. Thus, a radial distance between the inner periphery of the annular bottom surface and the outer periphery of the annular bottom surface may vary as a function of an azimuthal angle around a vertical axis passing through a geometrical center of the first contact via structure 86A that is laterally surrounded by the tubular insulating liner 84. Generally, each tubular insulating liner 84 can be provided by forming a pillar cavity through a second vertically alternating sequence of second continuous insulating layers 232L and second continuous sacrificial material layers 242L, by forming a dielectric pillar structure including a dielectric material (such as silicon oxide) in the pillar cavity, and by forming a first contact via cavity through a center portion of the dielectric pillar structure. The remaining tubular portion of the dielectric pillar structure constitutes the tubular insulating liner 84.

In one embodiment, each of the tubular insulating liners 84 contacts a cylindrical sidewall of each second insulating layer 232 within a second-tier alternating stack (232, 246). In one embodiment, each of the first contact via structures 84 contacts a respective cylindrical sidewall of a respective first-tier retro-stepped dielectric material portion 165.

A contact-level dielectric layer 280 can overlie each second-tier alternating stack of second insulating layers 232 and second electrically conductive layers 246. In one embodiment, annular top surfaces of the tubular insulating liners 84 contact a bottom surface of the contact-level dielectric layer 280. In one embodiment, top surfaces of the first contact via structures 86A can be located within a same horizontal plane as a top surface of the contact-level dielectric layer 280.

In one embodiment, each of the tubular insulating liners 84 comprises an inner cylindrical sidewall that extends from a bottommost surface of a second-tier alternating stack (232, 246) to a topmost surface of the second-tier alternating stack (232, 246). Furthermore, each of the tubular insulating liners 84 comprises an outer cylindrical sidewall that extends from the bottommost surface of the second-tier alternating stack (232, 246) to the topmost surface of the second-tier alternating stack (232, 246).

Figure 17A:
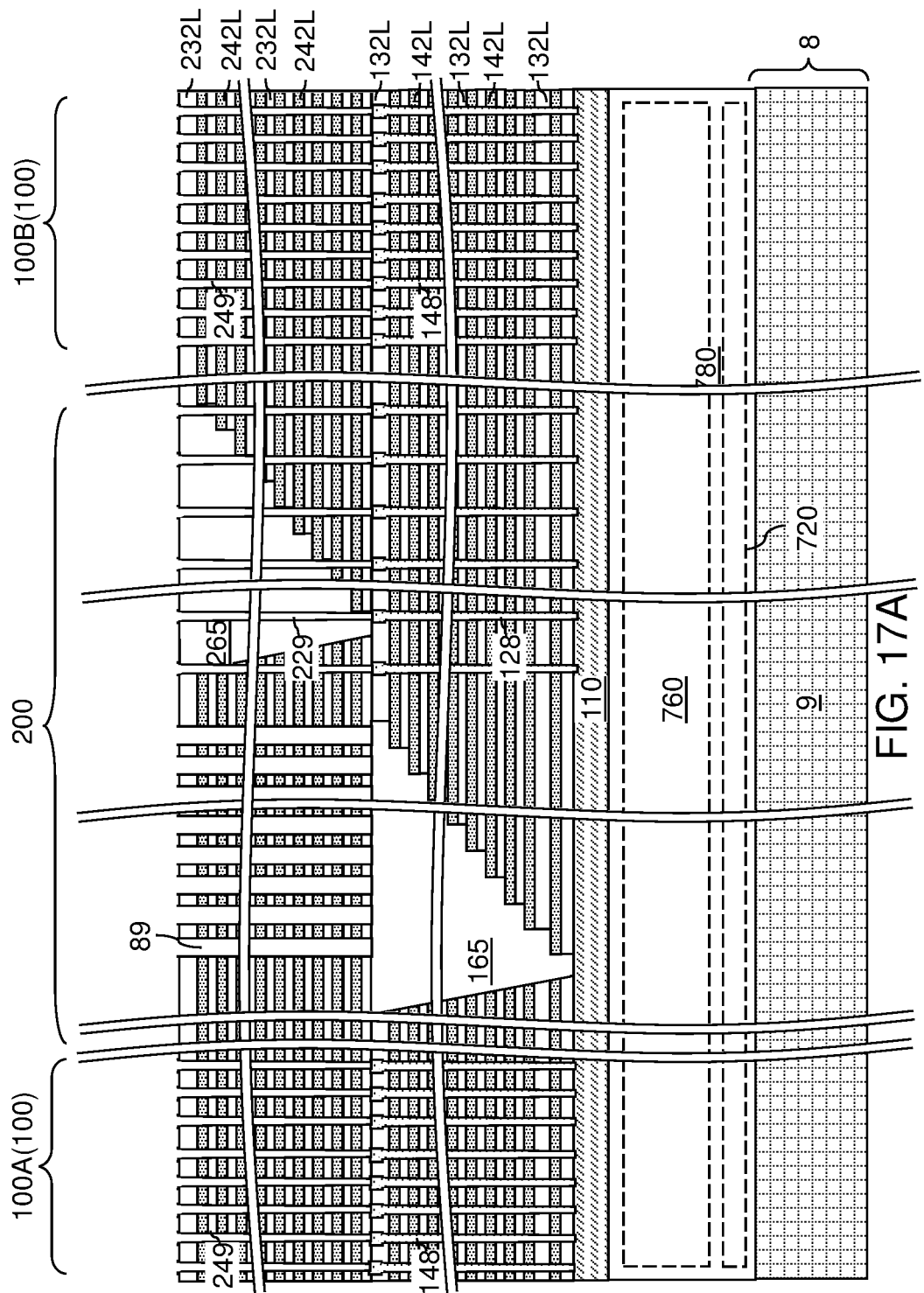
FIG. 17A is a vertical cross-sectional view of the second exemplary structure after formation of second-tier openings and pillar cavities through the second vertically alternating sequence according to the second embodiment of the present disclosure.
Figure 17B:
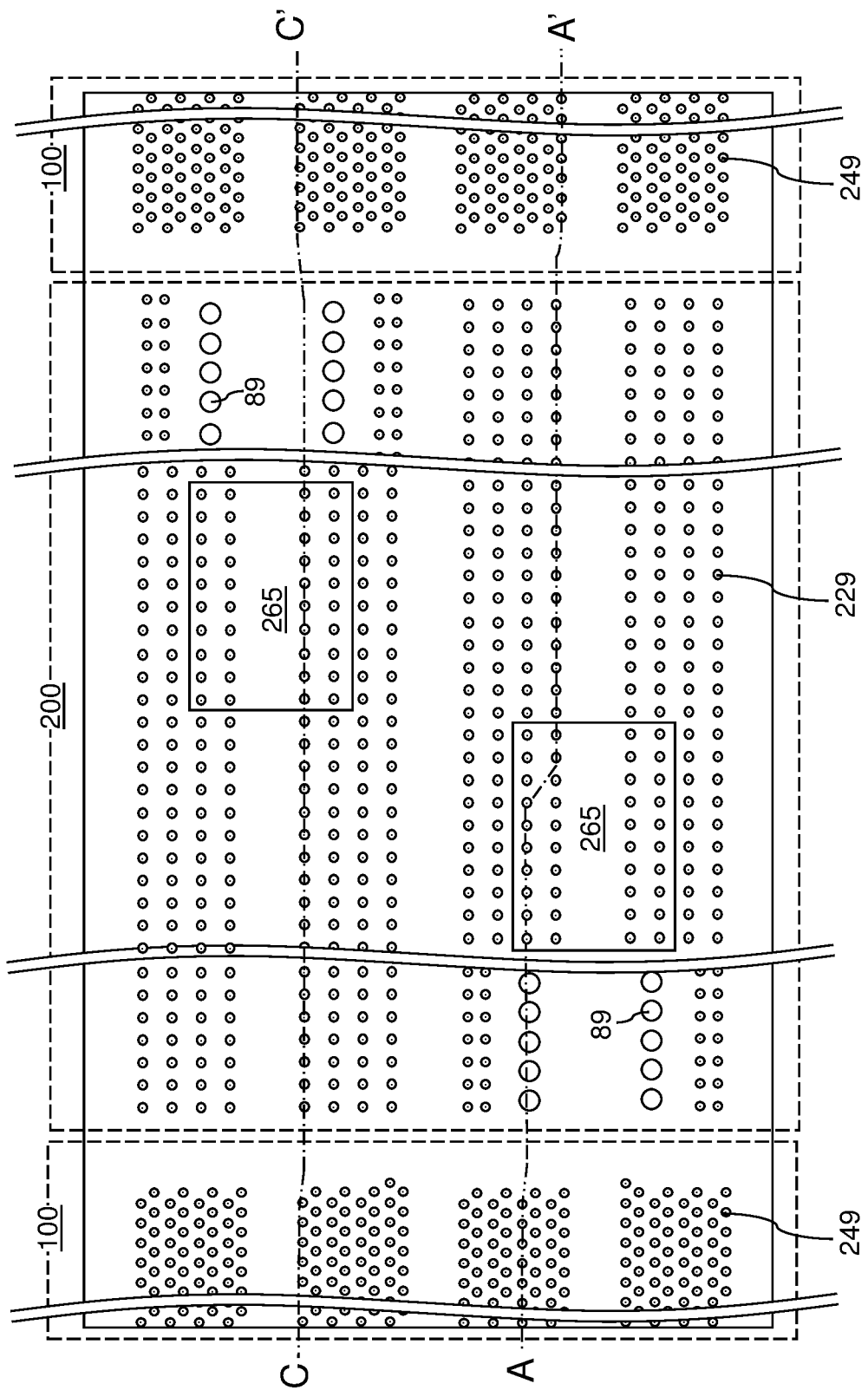
FIG. 17B is a top-down view of the second exemplary structure of FIG. 17A. The hinged vertical plane A-A' is the plane of the vertical cross-sectional view of FIG. 17A.
Figure 17C:
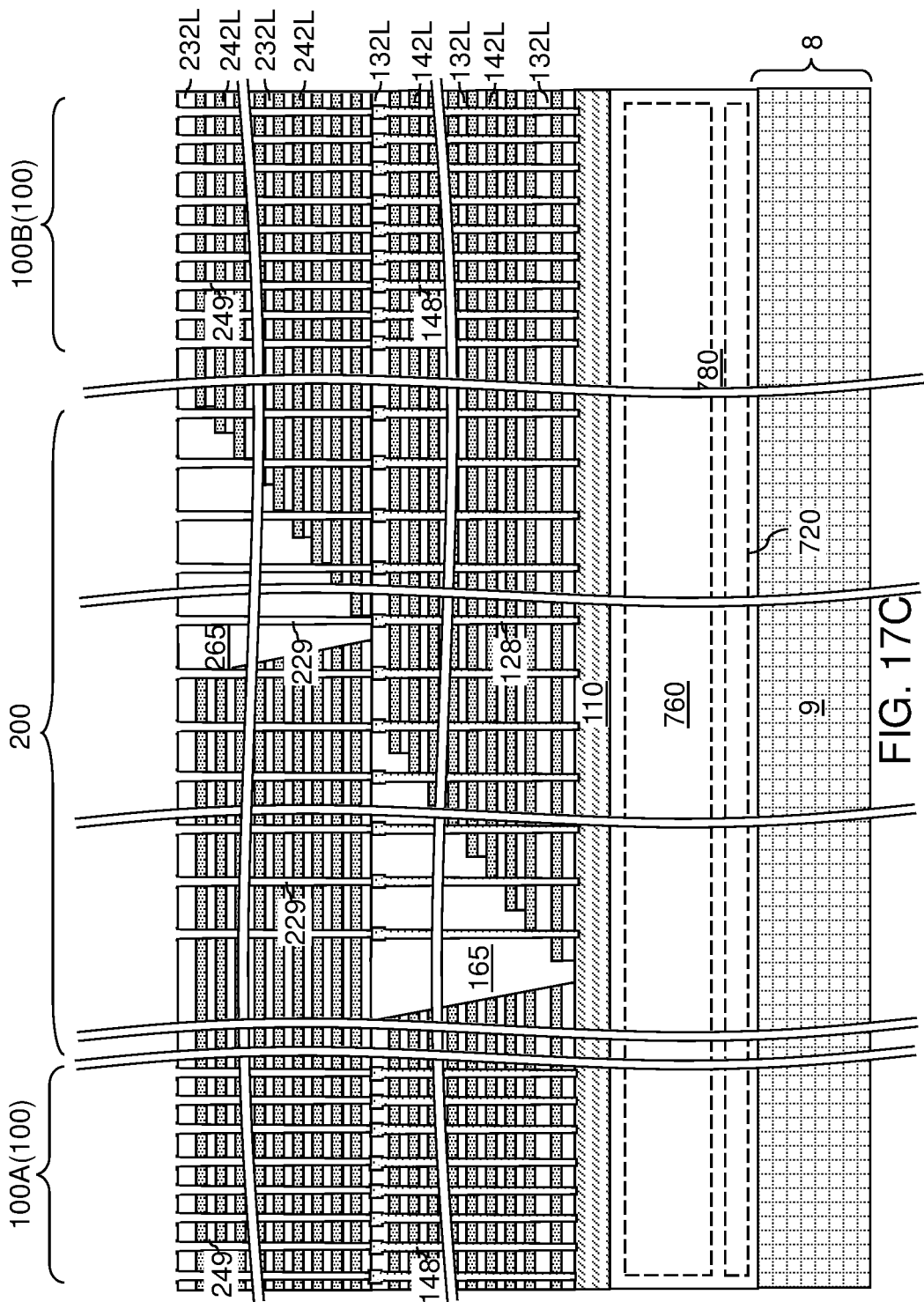
FIG. 17C is a vertical cross-sectional view of the second exemplary structure along the hinged vertical plane C-C' of FIG. 17B.

The second exemplary semiconductor die 2000 of FIGS. 16A-16G can be manufactured employing a sequence of processing steps. Referring to FIGS. 17A-17C, a second exemplary structure for formation of the structure of FIGS. 16A-16G is illustrated in a vertical cross sectional view along the first horizontal direction (e.g., word line direction) hd1 according to a second embodiment of the present disclosure. The structure shown in FIGS. 17A-17C can be derived from the first exemplary structure of FIG. 6.

Specifically, various second-tier openings (249, 229) may be formed through the second vertically alternating sequence (232L, 242L) and over the sacrificial first-tier opening fill portions (148, 128) as provided in the first exemplary structure of FIG. 6 by performing the processing steps of FIGS. 7A-7C. A photoresist layer (not shown) may be applied over the second vertically alternating sequence (232L, 242L), and may be lithographically patterned to form various openings therethrough. The pattern of openings in the photoresist layer may be transferred through the second vertically alternating sequence (232L, 242L) to form the various second-tier openings (249, 229) concurrently, i.e., during the second isotropic etch process.

The various second-tier openings (249, 229) may include second-tier memory openings 249 formed in the memory array regions 100 and second-tier support openings 229 formed in the inter-array region 200. Each second-tier opening (249, 229) may be formed within the area of a respective one of the sacrificial first-tier opening fill portions (148, 128). Thus, a top surface of a sacrificial first-tier opening fill portion (148, 128) can be physically exposed at the bottom of each second-tier opening (249, 229). Specifically, each second-tier memory openings 249 can be formed directly over a respective sacrificial first-tier memory opening fill portion 148, and each second-tier support opening 229 can be formed directly over a respective sacrificial first-tier support opening fill portion 128. Each cluster of second-tier memory openings 249 may be formed as a two-dimensional array of second-tier memory openings 249. The second-tier support openings 229 are openings that are formed in the inter-array region 200, and are subsequently employed to form support pillar structures. A subset of the second-tier support openings may be formed through a respective horizontal surface of the second stepped surfaces.

According to an aspect of the present disclosure, pillar cavities 89 can be formed above each first-tier retro-stepped dielectric material portion 165 through the second vertically alternating sequence (232L, 242L). The photoresist layer may be patterned with an additional pattern of openings for the pillar cavities 89 during patterning of the openings for the second-tier openings (249, 229) in the photoresist layer. The pattern of openings for the pillar cavities 89 can be formed over each area of the first-tier retro-stepped dielectric material portions 165. Each opening for a pillar cavity 89 can be located within the area of a respective horizontal step of first stepped surfaces of the first vertically alternating sequence (132L, 142L). The pillar cavities 89 can be formed through the second vertically alternating sequence (232L, 242L) during the anisotropic etch process that forms the second-tier opening (249, 229). Each pillar cavity 89 can have a respective sidewall, which include sidewalls of the second continuous insulating layers 232L and second continuous sacrificial material layers 242L. A top surface of a first-tier retro-stepped dielectric material portion 165 can be physically exposed at the bottom of each pillar cavity 89. In one embodiment, the entire bottom surface of a pillar cavity 89 can be a portion of a top surface of a respective first-tier retro-stepped dielectric material portion 165.

The photoresist layer can be subsequently removed, for example, by ashing. The set of all structures located between the bottommost surface of the second vertically alternating sequence (232L, 242L) and the topmost surface of the second vertically alternating sequence (232L, 242L) or embedded within the second vertically alternating sequence (232L, 242L) constitutes a second-tier structure.

Figure 18:
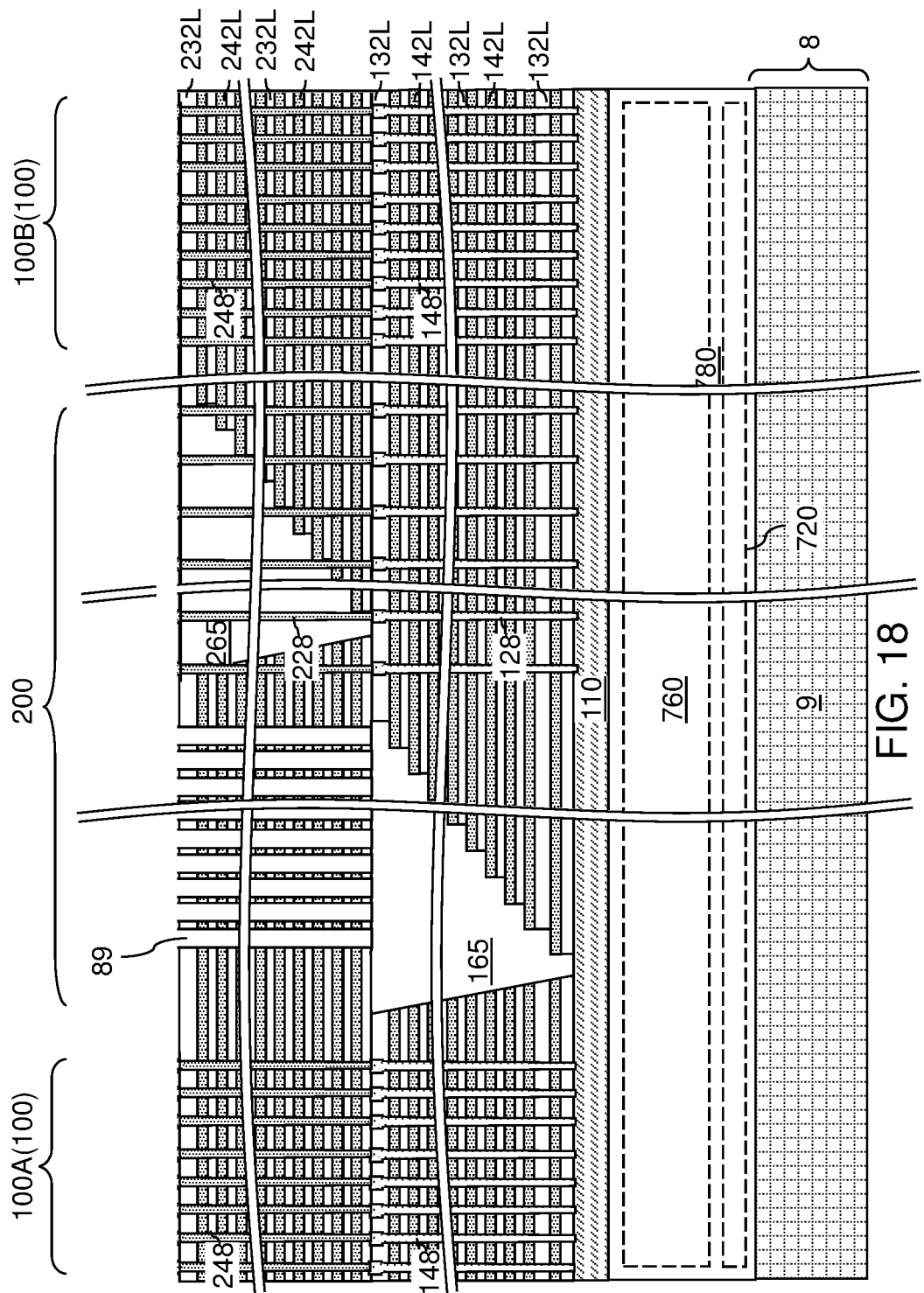
FIG. 18 is a vertical cross-sectional view of the second exemplary structure after formation of sacrificial second-tier opening fill structures according to the second embodiment of the present disclosure.

Referring to FIG. 18, sacrificial second-tier opening fill portions (248, 228) may be formed in the various second-tier openings (249, 229). For example, a sacrificial second-tier fill material is deposited concurrently deposited in each of the second-tier openings (249, 229) and in the pillar cavities 89. The sacrificial second-tier fill material includes a material that may be subsequently removed selective to the materials of the second continuous insulating layers 232L and the second continuous sacrificial material layers 242L. In one embodiment, the sacrificial second-tier fill material may be the same as, or may be different from, the sacrificial first-tier fill material of the sacrificial first-tier opening fill portions (148, 128).

In one embodiment, the sacrificial second-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 2 nm to 3 nm) may be used prior to depositing the sacrificial second-tier fill material. The sacrificial second-tier fill material may be formed by a non-conformal deposition or a conformal deposition method.

In another embodiment, the sacrificial second-tier fill material may include a silicon oxide material having a higher etch rate than the materials of the second continuous insulating layers 232L. For example, the sacrificial second-tier fill material may include borosilicate glass or porous or non-porous organosilicate glass having an etch rate that is at least 200 times higher than the etch rate of densified TEOS oxide (i.e., a silicon oxide material formed by decomposition of tetraethylorthosilicate glass in a chemical vapor deposition process and subsequently densified in an anneal process) in a 200:2 dilute hydrofluoric acid. In this case, a thin etch stop liner (such as a silicon nitride layer having a thickness in a range from 2 nm to 3 nm) may be used prior to depositing the sacrificial second-tier fill material. The sacrificial second-tier fill material may be formed by a non-conformal deposition or a conformal deposition method.

In yet another embodiment, the sacrificial second-tier fill material may include carbon-containing material (such as amorphous carbon or diamond-like carbon) that may be subsequently removed by ashing, or a silicon-based polymer that may be subsequently removed selective to the materials of the second vertically alternating sequence (232L, 242L).

Portions of the deposited sacrificial material may be removed from above the topmost layer of the second vertically alternating sequence (232L, 242L), such as from above the topmost second continuous insulating layer 232L. For example, the sacrificial second-tier fill material may be recessed to a top surface of the topmost second continuous insulating layer 232L using a planarization process. The planarization process may include a recess etch, chemical mechanical planarization (CMP), or a combination thereof. The top surface of the topmost second continuous insulating layer 232L may be used as an etch stop layer or a planarization stop layer.

Remaining portions of the sacrificial second-tier fill material comprise sacrificial second-tier opening fill portions (248, 228). Specifically, each remaining portion of the sacrificial material in a second-tier memory opening constitutes a sacrificial second-tier memory opening fill portion 248. Each remaining portion of the sacrificial material in a second-tier support opening constitutes a sacrificial second-tier support opening fill portion 228. The various sacrificial second-tier opening fill portions (248, 228) are concurrently formed, i.e., during a same set of processes including the deposition process that deposits the sacrificial second-tier fill material and the planarization process that removes the second-tier deposition process from above the second vertically alternating sequence (232L, 242L) (such as from above the top surface of the topmost second continuous insulating layer 232L). The top surfaces of the sacrificial second-tier opening fill portions (248, 228) may be coplanar with the top surface of the topmost second continuous insulating layer 232L. Each of the sacrificial second-tier opening fill portions (248, 228) may, or may not, include cavities therein.

Each pillar cavity 89 can be filled with a respective portion of the sacrificial second-tier fill material. A photoresist layer (not shown) can be applied over the second vertically alternating sequence (232L, 242L), and can be lithographically patterned to form openings over each area of the pillar cavities 89. In one area, an opening in the photoresist layer can include a cluster of pillar cavities 89 overlying a same first-tier retro-stepped dielectric material portion 165. An etch process can be performed to etch the portions of the sacrificial second-tier fill material from the pillar cavities 89 selective to the materials of the second vertically alternating sequence (232L, 242L) and the first-tier retro-stepped dielectric material portion 165. The etch process may include an isotropic etch process (such as a wet etch process) or an anisotropic etch process (such as a reactive ion etch process). Each pillar cavity 89 contains a respective void after removal of the sacrificial second-tier fill material from inside each pillar cavity 89.

The set of all structures located between the bottommost surface of the second vertically alternating sequence (232L, 242L) and the topmost surface of the second vertically alternating sequence (232L, 242L) or embedded within the second vertically alternating sequence (232L, 242L) constitutes a second-tier structure.

Figure 19:
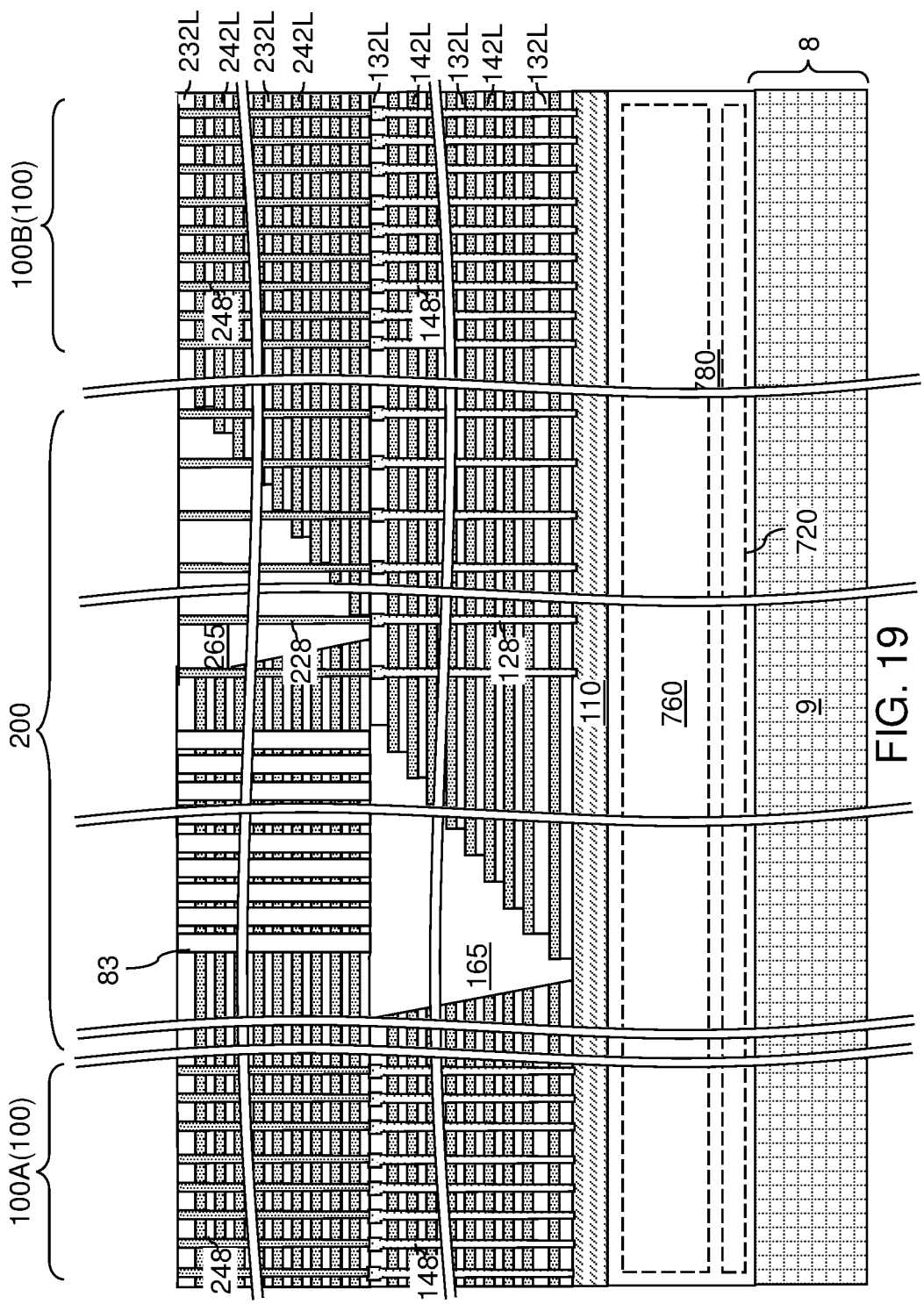
FIG. 19 is a vertical cross-sectional view of the second exemplary structure after formation of dielectric pillar structures according to the second embodiment of the present disclosure.

Referring to FIG. 19, a dielectric fill material such as undoped silicate glass or doped silicate glass can be deposited in the pillar cavities 89. The dielectric fill material may be deposited by chemical vapor deposition or by spin-coating. Excess portions of the dielectric fill material may be removed from above the horizontal plane including the top surface of the second vertically alternating sequence (232L, 242L). Each remaining portion of the dielectric fill material that fills a pillar cavity 89 constitutes a dielectric pillar structure 83.

In one embodiment, each dielectric pillar structure 83 can have a horizontal cross-sectional shape having a closed periphery. The closed periphery can have a shape of a circle, an ellipse, a polygon, a rounded polygon, or a generally curvilinear two-dimensional shape separating an inner area from an outer area. The sidewalls of the dielectric pillar structure 83 may be substantially vertical or vertical, and/or may have a taper angle in a range from 0.1 degree to 10 degrees, such as from 0.5 degrees to 5 degrees (such as from 1 degrees to 3 degrees) with respect to the vertical direction.

Figure 20:
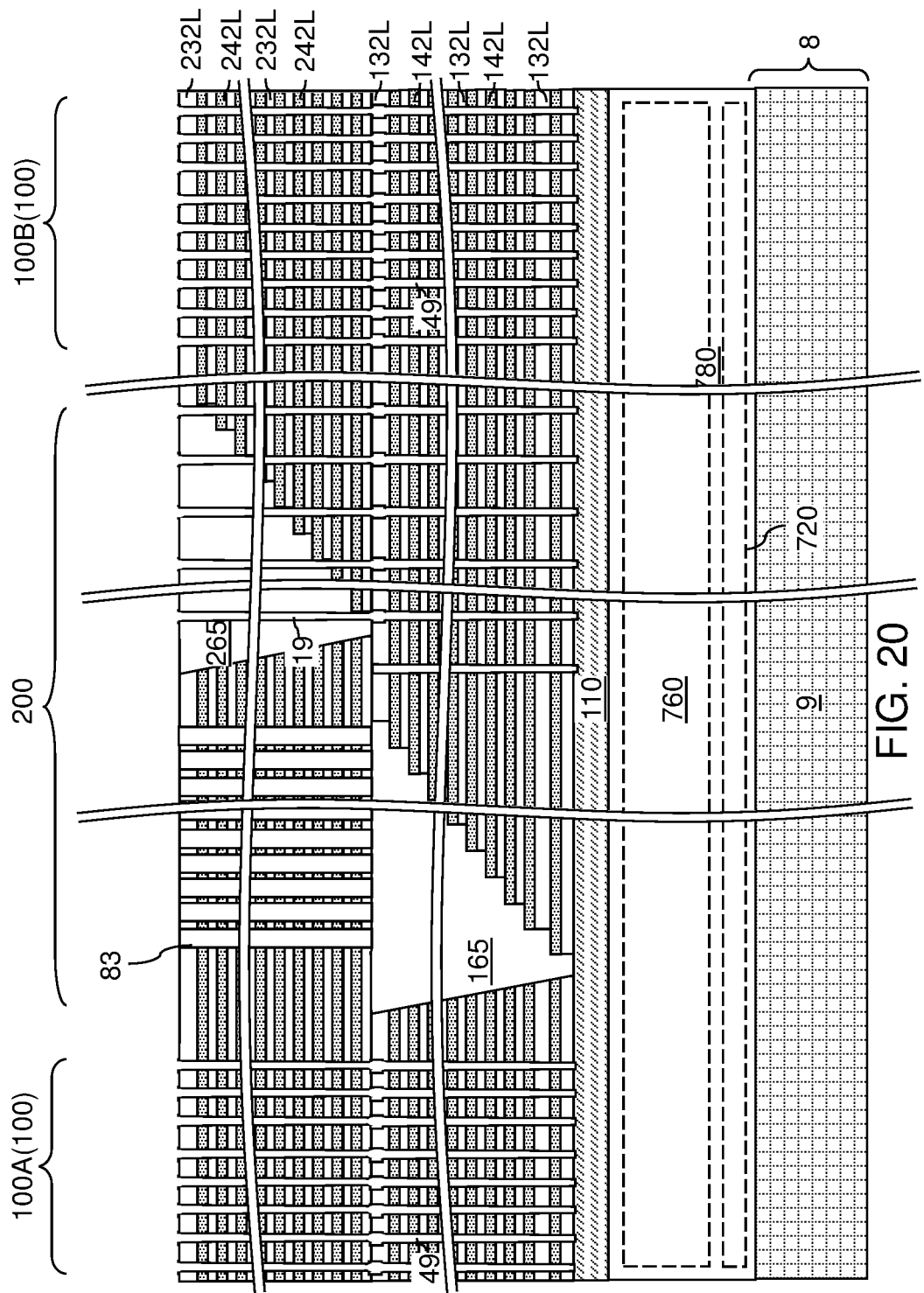
FIG. 20 is a vertical cross-sectional view of the second exemplary structure after formation of inter-tier memory openings and inter-tier support openings according to the second embodiment of the present disclosure.

Referring to FIG. 20, the sacrificial first-tier and second-tier fill material of the sacrificial first-tier opening fill portions (148, 128) and the sacrificial second-tier fill portions (248, 228) may be removed using an etch process that etches the sacrificial fill material selective to the materials of the dielectric pillar structure 83, the first and second continuous insulating layers (132L, 232L) and the first and second continuous sacrificial material layers (142L, 242L). A memory opening, which is also referred to as an inter-tier memory opening 49, is formed in each combination of a second-tier memory openings and a volume from which a sacrificial first-tier and second-tier memory opening fill portions (148, 248) are removed. A support opening, which is also referred to as an inter-tier support opening 19, is formed in each combination of a second-tier support openings and a volume from which a sacrificial first-tier and second-tier support opening fill portions (128, 228) are removed. The inter-tier memory opening 49 extends through the first-tier structure and the second-tier structure. Generally, memory openings 49 can be formed within each memory array region 100, in which each layer of the first vertically alternating sequence (132L, 142L) and each layer within the second vertically alternating sequence (232L, 242L) are present.

In an alternative embodiment, the second-tier openings (249, 229) and the pillar cavities 89 are formed during separate lithography and etching steps. In this alternative embodiment, formation of the sacrificial second-tier opening fill portions (248, 228) may be omitted. For example, the pillar cavities 89 may be formed using a first photoresist layer prior to forming the second-tier openings (249, 229). The first photoresist layer is then removed. Then, the dielectric pillar structures 83 are formed in the respective pillar cavities 89. After forming the dielectric pillar structures 83, the second-tier openings (249, 229) are formed using a second photoresist layer. The respective sacrificial first-tier opening fill portions (148, 128) are exposed at the bottom of the second-tier openings (249, 229). The second photoresist layer is then removed.

Figure 21:
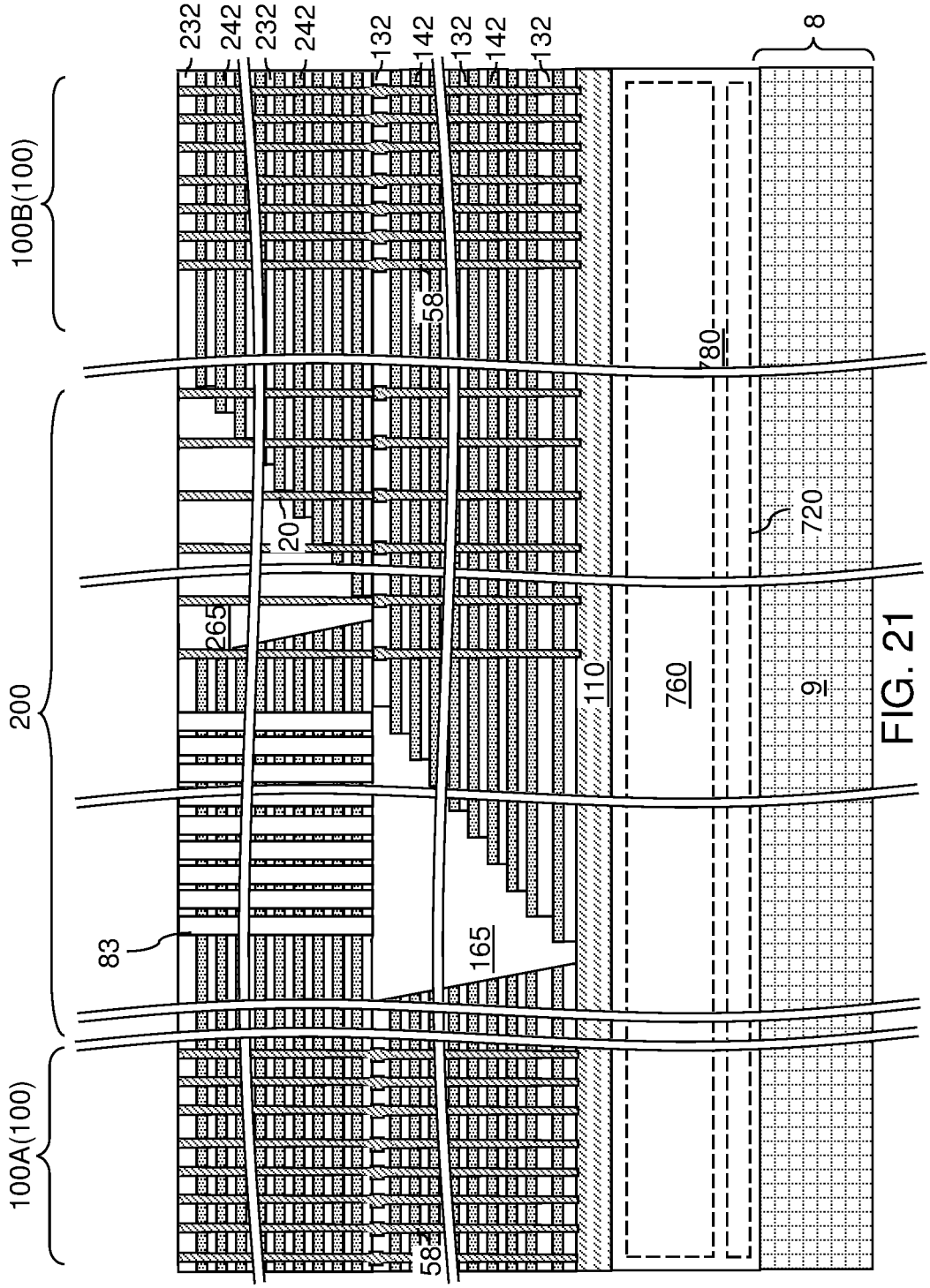
FIG. 21 is a vertical cross-sectional view of the second exemplary structure after formation of memory opening fill structures and support pillar structures according to the second embodiment of the present disclosure.

Referring to FIG. 21, the processing steps of FIGS. 11B, 11C, and 11D can be performed to form a memory opening fill structure 58 in each inter-tier memory opening 49, and to form a support pillar structure 20 in each inter-tier support opening 19. Each memory opening fill structure 58 may have the same structure as the structure of the memory opening fill structure illustrated in FIG. 11D. Each support pillar structure 20 may have the same structure as the structure of the memory opening fill structure illustrated in FIG. 11D. It is noted that memory opening fill structures 58 located in the memory array regions 100 are illustrated in FIGS. 16B-16E, and the support pillar structures 20 are not illustrated in FIGS. 16A-16G for the purpose of clarity. The semiconductor material layer 110, the first-tier structure (132L, 142L, 165), the second-tier structure (232L, 242L, 265, 83), the memory opening fill structures 58, and the support pillar structures 20 collectively constitute a memory-level assembly.

Generally, the support pillar structures 20 are formed in the inter-array region 200. The support pillar structures 20 include first support pillar structures 20 that vertically extend through the second vertically alternating sequence (232L, 242L), a first-tier retro-stepped dielectric material portion 165, and a portion of the first vertically alternating sequence (132L, 142L) that underlies the first-tier retro-stepped dielectric material portion 165. The support pillar structures 20 further include second support pillar structures 20 that vertically extend through a second-tier retro-stepped dielectric material portion 265, a portion of the second vertically alternating sequence (232L, 242L) that underlies the second-tier retro-stepped dielectric material portion 265, and each layer within the first vertically alternating sequence (132L, 142L).

Figure 22A:
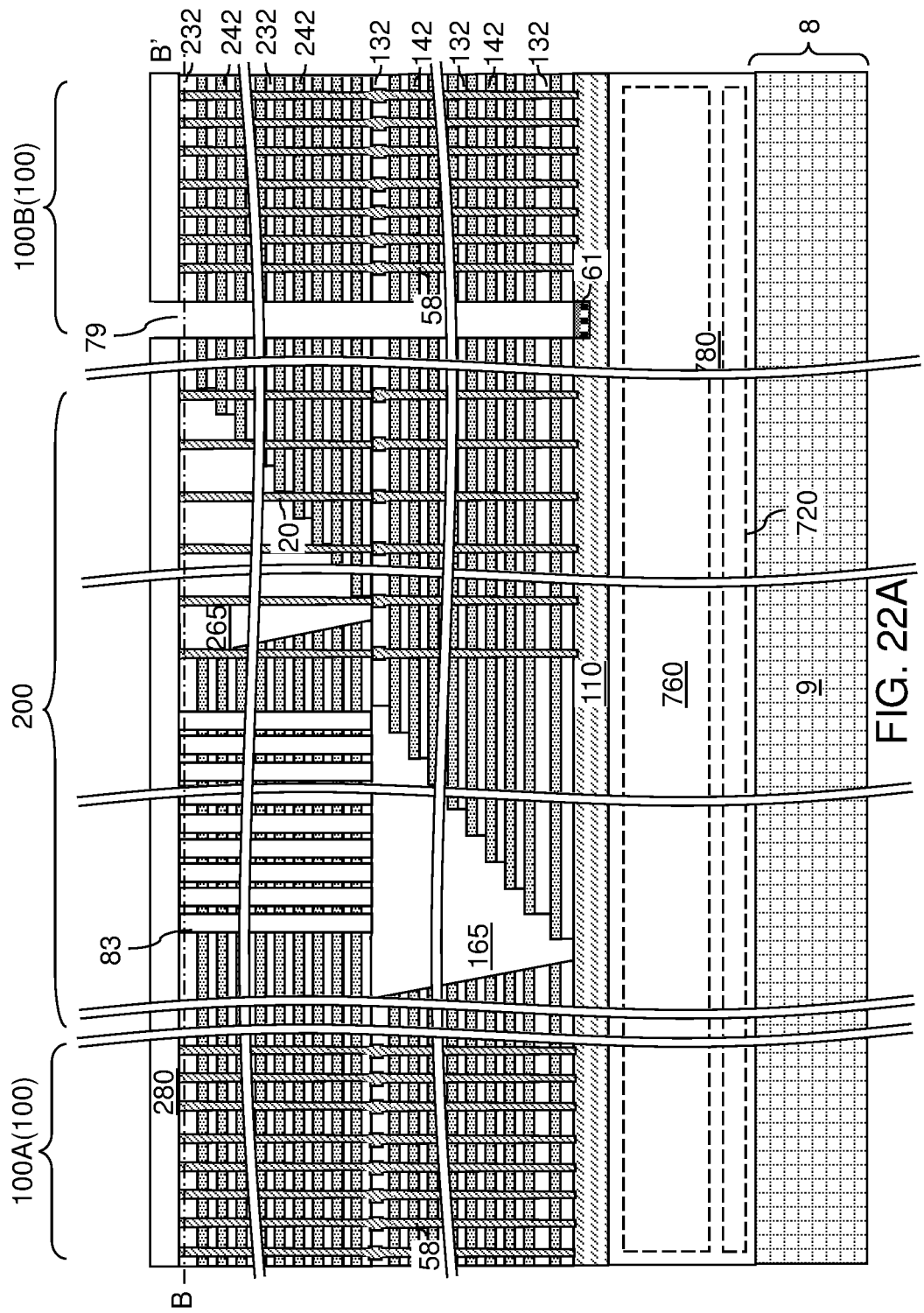
FIG. 22A is a vertical cross-sectional view of the second exemplary structure after formation of a contact-level dielectric layer, backside trenches, and source regions according to the second embodiment of the present disclosure.
Figure 22B:
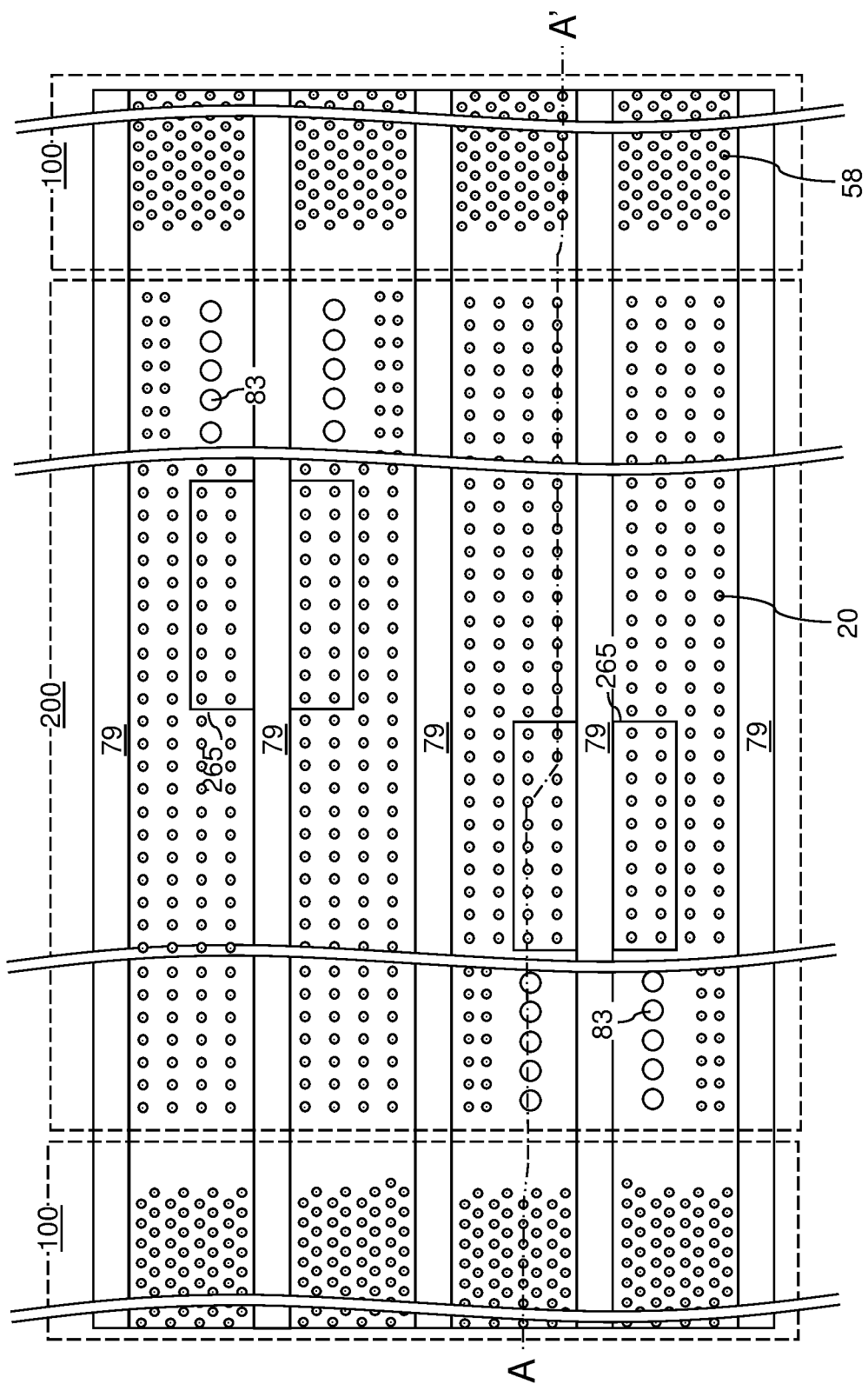
FIG. 22B is a horizontal cross-sectional view along the horizontal plane B-B' of the second exemplary structure of FIG. 22A.

Referring to FIGS. 22A and 22B, a contact-level dielectric layer 280 may be formed over the second vertically alternating sequence (232L, 242L). The contact-level dielectric layer 280 includes a dielectric material such as silicon oxide, and may be formed by a conformal or non-conformal deposition process. For example, the contact-level dielectric layer 280 may include undoped silicate glass and may have a thickness in a range from 100 nm to 600 nm, although lesser and greater thicknesses may also be used.

A photoresist layer (not shown) may be applied over the contact-level dielectric layer 280, and may be lithographically patterned to form linear openings laterally extending along the first horizontal direction hd1 and laterally spaced apart along the second horizontal direction hd2. The pattern of the linear openings in the photoresist layer can be identical to the pattern of the backside trench fill structures 76 illustrated in FIGS. 16B-16G. The linear openings in the photoresist layer can be formed within areas in which memory opening fill structures 58 or the support pillar structures 20 are not present.

Backside trenches 79 be formed by transferring the pattern in the photoresist layer (not shown) through the contact-level dielectric layer 280, the second-tier structure (232L, 242L, 265, 83), and the first-tier structure (132L, 142L, 165), and into the semiconductor material layer 110. The pattern of the backside trenches 79 can be identical to the pattern of the backside trench fill structures 76 illustrated in FIGS. 16B-16G. Portions of the contact-level dielectric layer 280, the second-tier structure (232L, 242L, 265, 83), the first-tier structure (132L, 142L, 165), and the semiconductor material layer 110 that underlie the linear openings in the photoresist layer may be removed by an anisotropic etch process to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

The backside trenches 79 can be formed as a periodic one-dimensional array with a periodicity along the second horizontal direction hd2. The backside trenches 79 can be sequentially numerically numbered with positive integers from one side to another along the second horizontal direction hd2. In one embodiment, every odd-numbered backside trench 79 can extend through the second vertically alternating sequence (232L, 242L) and the first vertically alternating sequence (132L, 142L) without etching through the first-tier retro-stepped dielectric material portions 165, the second-tier retro-stepped dielectric material portions 265 and the dielectric pillar structures 83. Every even-numbered backside trench 79 can extend through the second vertically alternating sequence (232L, 242L) and the first vertically alternating sequence (132L, 142L) and cut through a respective first-tier retro-stepped dielectric material portion 165, and a respective second-tier retro-stepped dielectric material portion 265 without etching through the dielectric pillar structures 83.

Each vertically alternating sequence {(132L, 142L), (232L, 242L)} is divided into a plurality of alternating stacks of insulating layers (132 or 232) and sacrificial material layers (142, 242) (which correspond to volumes of memory blocks) by the backside trenches 79. Each backside trench 79 can laterally extend along the first horizontal direction hd1 through am inter-array region 200 and a pair of memory array regions 100 that are adjoined to inter-array region 200. Further, each backside trench 79 can vertically extend through an entire thickness of the vertically alternating sequences {(132L, 142L), (232L, 242L)}. Each patterned portion of the first vertically alternating sequence (132L, 142L) located between a neighboring pair of backside trenches 79 constitutes a first-tier alternating stack of first insulating layers 132 and first sacrificial material layers 142. Each patterned portion of the second vertically alternating sequence located between a neighboring pair of backside trenches 79 constitutes a second-tier alternating stack of second insulating layers 232L and second sacrificial material layers 242. A plurality of alternating stacks of insulating layers (132 or 232) and sacrificial material layers (142 or 242) can be formed.

Each first-tier retro-stepped dielectric material portion 165 may be divided into two disjoined first-tier retro-stepped dielectric material portions 165 by a backside trench 79. Each second-tier retro-stepped dielectric material portion 265 may be divided into two disjoined second-tier retro-stepped dielectric material portions 265 by a backside trench 79. Each contiguous combination of a first-tier alternating stack (132, 142) and a second-tier alternating stack (232, 242) can be laterally bounded by a neighboring pair of backside trenches 79. One of the neighboring pair of backside trenches 79 can divide a first-tier retro-stepped dielectric material portion 165 into two discrete dielectric material portions, such as a first portion of the first-tier retro-stepped dielectric material portion 165 and a second portion of the first-tier retro-stepped dielectric material portion 165. Further, one of the neighboring pair of backside trenches 79 can divide a second-tier retro-stepped dielectric material portion 265 into two discrete dielectric material portions, such as a first portion of the second-tier retro-stepped dielectric material portion 265 and a second portion of the second-tier retro-stepped dielectric material portion 265.

In one embodiment, the semiconductor material layer 110 can have a doping of the same conductivity type as the vertical semiconductor channels 60, i.e., a first conductivity type, and a source region 61 having a doping of a second conductivity type (which is the same conductivity type as the doping of the drain regions 63) can be formed underneath each backside trench 79 by implantation of dopants of the second conductivity type.

Referring to FIG. 23, the sacrificial material layers (142, 242) are removed selective to the insulating layers (132, 232), the contact-level dielectric layer 280, and the semiconductor material layer 110. For example, an etchant that selectively etches the materials of the sacrificial material layers (142, 242) with respect to the materials of the insulating layers (132, 232), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the second exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess. A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Generally, the backside recesses (143, 243) can be formed by removing the patterned portions of the first continuous sacrificial material layers 142L and the second sacrificial material layers 242L selective to patterned portions of the first continuous insulating layers 132L and the second continuous insulating layers 232L after formation of the backside trenches 79. The backside recesses (143, 243) can be formed by performing an isotropic etch process that supplies an isotropic etchant that etches the patterned portions of the first continuous sacrificial material layers 142L and the second continuous sacrificial material layers 242L selective to patterned portions of the first continuous insulating layers 132L and the second continuous insulating layers 232L and selective to the dielectric pillar structures 83. Surfaces of the dielectric pillar structures 83 are physically exposed to a subset of the backside recesses, i.e., the second backside recesses 243, after the isotropic etch process.

An optional backside blocking dielectric layer (not shown) may be optionally deposited in the backside recesses (143, 243) and the backside trenches 79 and over the contact-level dielectric layer 280. The backside blocking dielectric layer includes a dielectric material such as a dielectric metal oxide (e.g., aluminum oxide), silicon oxide, or a combination thereof.

At least one conductive material may be deposited in the plurality of backside recesses (143, 243), on the sidewalls of the backside trenches 79, and over the contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with a portion of an optional backside blocking dielectric layer (if present) and a first electrically conductive layer 146, and each second sacrificial material layer 242 may be replaced with a portion of the optional backside blocking dielectric layer (if present) and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive layers 146 and the second electrically conductive layers may be physically exposed to a respective backside trench 79. The backside trenches 79 may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. A third subset of the openings through each electrically conductive layer (146, 246) may be filled with the dielectric pillar structures 83.

A subset of the electrically conductive layers (146, 246) may comprise word lines for the memory elements. The semiconductor devices in the underlying semiconductor devices 720 may comprise word line switch devices configured to control a bias voltage to respective word lines, and/or bit line driver devices, such as sense amplifiers. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the memory stack structures 55 comprises a vertical stack of memory elements located at each level of the electrically conductive layers (146, 246).

Generally, the patterned portions of the first continuous sacrificial material layers 142L and the second continuous sacrificial material layers 242L are replaced with the electrically conductive layers (146, 246). A first-tier alternating stack of first insulating layers 132 and first electrically conductive layers 146 can be formed between each neighboring pair of backside trenches 79 among the backside trenches 79. The first insulating layers 132 comprise patterned portions of the first continuous insulating layers 132L, and the first electrically conductive layers 146 comprise the first subset of the electrically conductive layers (146, 246) and are interlaced with the first insulating layers 132. A second-tier alternating stack of second insulating layers 232 and second electrically conductive layers 246 is formed between the neighboring pair of backside trenches 79. The second insulating layers 232 comprise patterned portions of the second continuous insulating layers 232L, and the second electrically conductive layers 246 comprise a second subset of the electrically conductive layers (146, 246) that is interlaced with the second insulating layers 246.

Figure 24:
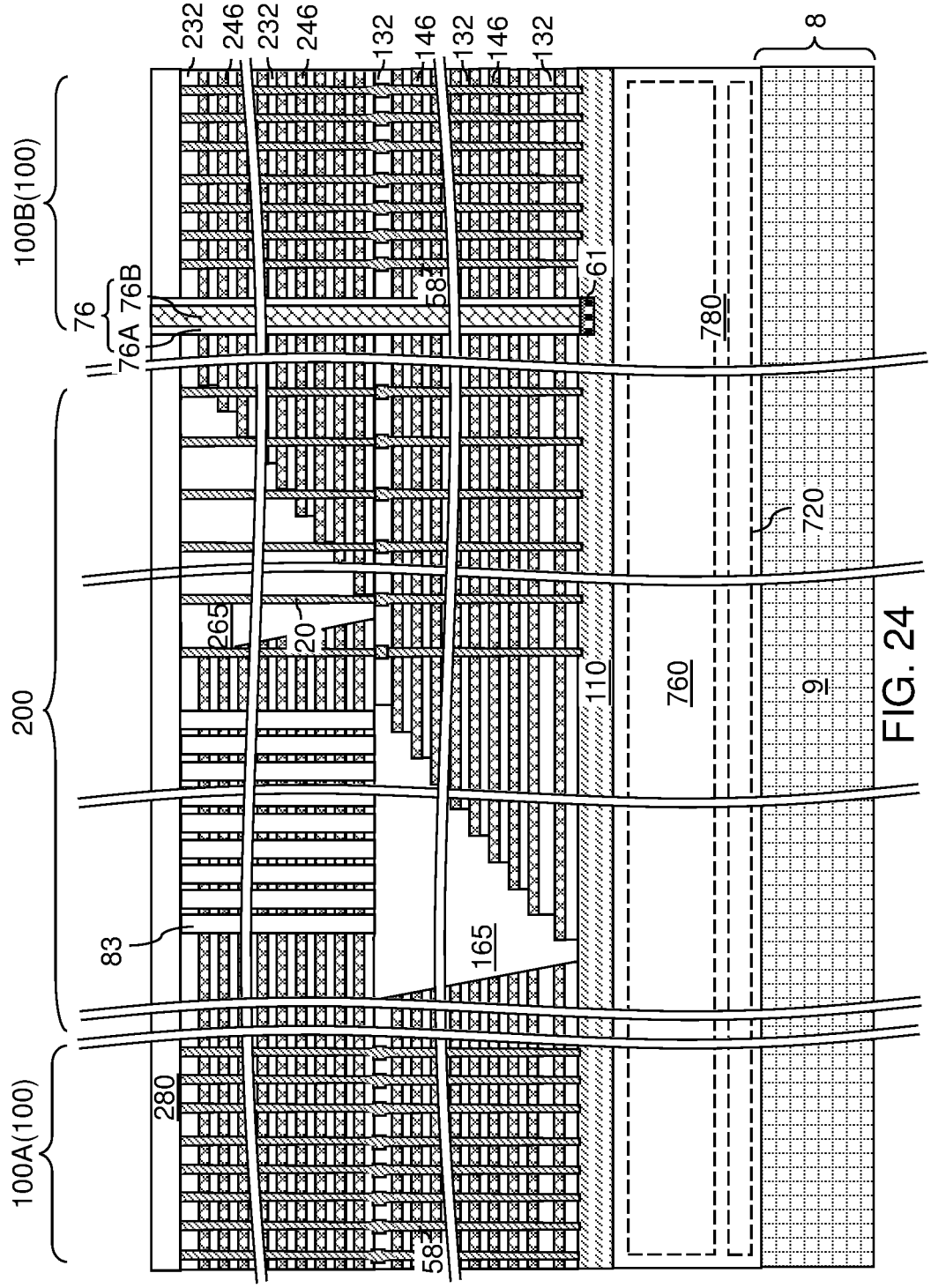
FIG. 24 is a vertical cross-sectional view of the second exemplary structure after formation of electrically conductive layers and backside trench fill structures according to the second embodiment of the present disclosure.

Referring to FIG. 24, a backside trench fill structure 76 can be formed in each backside trench 79. In one embodiment, a dielectric liner layer including a dielectric material (such as silicon oxide) can be conformally deposited at a periphery of each backside trench 79, and can be anisotropically etched to form a dielectric spacer 76A within each backside trench 79. At least one conductive material can be deposited in remaining volumes of the backside trenches 79, and excess portions of the at least one conductive material can be removed from above the top surface of the contact-level dielectric layer 280 by a planarization process. Each remaining portion of the at least one conductive material contacting a source region 61 and laterally surrounded by a respective dielectric spacer 76A constitutes a backside contact via structure 76B, which laterally extends along the first horizontal direction hd1. Each contiguous combination of a dielectric spacer 76A and a backside contact via structure 76B that fills a backside trench 79 constitutes a backside trench fill structure 76.

Alternatively, at least one dielectric material, such as silicon oxide, may be conformally deposited in the backside trenches 79 by a conformal deposition process. Each portion of the deposited dielectric material that fills a backside trench 79 constitutes a backside trench fill structure 76. In this case, each backside trench fill structure may fill the entire volume of a backside trench 79 and may consist essentially of at least one dielectric material. In this alternative embodiment, the source region 61 may be omitted, and a horizontal source line (e.g., a direct strap contact layer) may contact a side of the lower portion of the semiconductor channel 60.

The backside trench fill structures 76 can be arranged in a configuration illustrated in FIGS. 16B-16G. In one embodiment, each first-tier retro-stepped dielectric material portion 165, each second-tier retro-stepped dielectric material portion 265, and each dielectric pillar structure 83 can be located between a neighboring pair of the backside trench fill structures 76.

Figure 25:
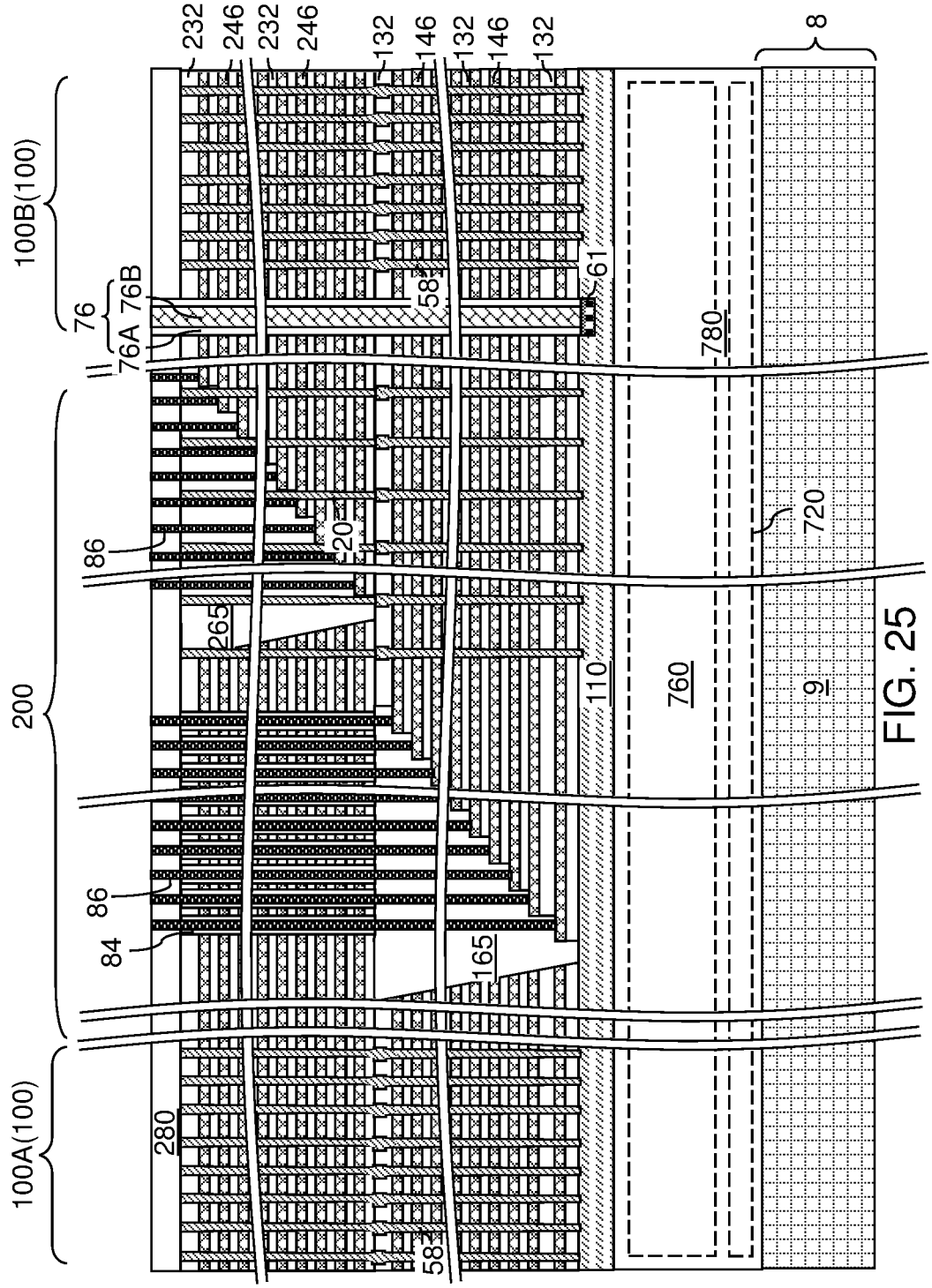
FIG. 25 is a vertical cross-sectional view of the second exemplary structure after formation of various contact via structures according to the second embodiment of the present disclosure.

Referring to FIG. 25, various contact via structures (88, 86A, 86B, 486) can be formed through the contact-level dielectric layer 280 and optionally through underlying material portions onto a respective underlying conductive structure. The various contact via structures (88, 86A, 86B, 486) can include drain contact via structures (e.g., drain electrodes) 88 that are formed in the memory array regions 100 through the contact-level dielectric layer 280 on a top surface of a respective drain region 63. The various contact via structures (88, 86A, 86B, 486) can include layer contact via structures (86A, 86B) that are formed in the inter-array region 200. The layer contact via structures (86A, 86B) can include first contact via structures 86A that contact a respective first electrically conductive layer 146 and second contact via structures 86B that contact a respective second electrically conductive layer 246.

For example, a photoresist layer (not shown) can be applied over the second-tier alternating stacks (232, 246), and can be lithographically patterned to form openings within areas of the memory opening fill structures 58, areas of the dielectric pillar structures 83, and horizontal surfaces of the second stepped surfaces of the second-tier alternating stacks (232, 246). An anisotropic etch process can be performed to transfer the pattern of the openings in the photoresist layer through the contact-level dielectric layer 280, the dielectric pillar structures 83, the first-tier retro-stepped dielectric material portions 165, and the second-tier retro-stepped dielectric material portions 265.

First contact via cavities can be formed through each dielectric pillar structure 83 and through underlying portions of the first-tier retro-stepped dielectric material portions 165 and directly on a respective horizontal surface of the first stepped surfaces of the first-tier alternating stacks (132, 146). Each remaining tubular portion of the dielectric pillar structures 83 comprises a tubular insulating liner 84. The inner sidewall of each tubular insulating liner 84 and the outer sidewall of each tubular insulating liner 84 may be concentric or off-centered. For example, a first vertical axis can be defined for each tubular insulating liner 84 such that the first vertical axis passes through a geometrical center of a volume defined by an inner sidewall of the tubular insulating liner, a horizontal plane including an upper periphery of the inner sidewall, and a horizontal plane including a lower periphery of the inner sidewall. A second vertical axis can be defined for each tubular insulating liner 84 such that the second vertical axis passes through a geometrical center of a volume defined by an outer sidewall of the tubular insulating liner, a horizontal plane including an upper periphery of the outer sidewall, and a horizontal plane including a lower periphery of the outer sidewall. The first vertical axis may coincide with, or may be laterally offset from, the second sidewall. This is because the location of the outer sidewall of each tubular insulating liner 84 is defined by a lithographic process that defines the pattern of the pillar cavities 89, and the location of the inner sidewall of each tubular insulating liner 84 is defined by a lithographic process that defines the opening for forming the first contact via cavities that forms the inner sidewall of the tubular insulating liner 84.

Each of the first contact via cavities comprises an upper sidewall that is an inner sidewall of a tubular insulating liner 84, and a lower sidewall including a cylindrical surface of a first-tier retro-stepped dielectric material portion 165. Second contact via cavities can be formed through each second-tier retro-stepped dielectric material portion 265 and directly on a respective horizontal surface of the second stepped surfaces of the second-tier alternating stacks (232, 246). The first electrically conductive layers 146 and the second electrically conductive layers 246 can be employed as etch stop structures during the anisotropic etch process. The photoresist layer can be subsequently removed, for example, by ashing.

Drain contact via cavities can be formed over each memory opening fill structure 58. Top portions of the memory opening fill structures 58, such as the drain regions 63, may be employed as etch stop structures during the anisotropic etch process. In one embodiment, the drain contact via cavities may be formed concurrently with formation of the first contact via cavities and the second contact via cavities. Alternatively, the drain contact via cavities may be formed prior to, or after, formation of the first contact via cavities and the second contact via cavities employing an additional lithographic patterning process and an additional anisotropic etch process.

At least one conductive material can be deposited in each of the first contact via cavities, the second contact via cavities, and the drain contact via cavities. The at least one conductive material can include, for example, a metallic barrier material (such as TiN, TaN, and/or WN) and a metallic fill material (such as W, Cu, Mo, Co, Ru, etc.). Excess portions of the at least one conductive material can be removed from above the horizontal plane including the top surface of the contact-level dielectric layer employing a planarization process (such as a chemical mechanical planarization process). Each remaining portion of the at least one conductive material filling the first contact via cavities comprises a first contact via structure 86A, Each remaining portion of the at least one conductive material filling the second contact via cavities comprise a second contact via structure 86B. Each remaining portion of the at least one conductive material filling the drain contact via cavities comprises drain contact via structures 88.

Generally, the first contact via cavities can be formed through the dielectric pillar structures 83 and through the first-tier retro-stepped dielectric material portions 165 after formation of the electrically conductive layers (146, 246). Each of the first contact via cavities comprises an upper sidewall formed by etching through a respective one of the dielectric pillar structures 83 and a lower sidewall including a respective cylindrical surface of a first portion of the first-tier retro-stepped dielectric material portion 165 (i.e., one of the two portions formed by dividing a first-tier retro-stepped dielectric material portion 165 as divided by a backside trench 79). The first contact via structures 86A are formed in the first contact via cavities by depositing at least one conductive material in the first contact via cavities. Each first contact via structures 86A can be formed through a respective dielectric pillar structure 83 and a first portion of a respective first retro-stepped dielectric material portion 165, and directly on a first subset of the electrically conductive layers (146, 246), i.e., first electrically conductive layers 146.

The second contact via structures 86B can be formed through a portion of a respective second retro-stepped dielectric material portion 265 and directly on a second subset of the electrically conductive layers (i.e., the second electrically conductive layers 246) that is located over a horizontal plane including top surfaces of the first-tier retro-stepped dielectric material portions 165.

Further, laterally-isolated vertical interconnection structures (484, 486) can be formed through the alternating stacks (132, 146, 232, 246) in the array interconnection region 240. Each laterally-isolated vertical interconnection structures (484, 486) can include a through-memory-level conductive via structure 486 and a tubular insulating spacer 484 that laterally surrounds the conductive via structure 486. Each through-memory-level conductive via structure 486 can contact a respective one of the lower-level metal interconnect structure 780 embedded within the lower-level dielectric material layers 760.

Bit lines (not shown) are then formed in a manner that provides electrical contact with the drain contact via structures 88. The bit lines may directly contact top surfaces of a respective subset of the drain contact via structures 88, or intermediate contact via structures (not shown) may be employed between the drain contact via structures 88 and the bit lines.

The various structures of embodiments of the present disclosure can be employed to form first contact via structures 86A that reduces the length of the narrow strip portions of the second electrically conductive layers 246 in the inter-array region 200 (i.e., in the array interconnection region 240 (which is also referred to as a "bridge" region) between a connected pair of memory array regions (100A, 100B). By reducing the length of the strip portions of the second electrically conductive layers 246 in the bridge region, their resistance is also reduced. Thus, RC delay in the second electrically conductive layers 246 in the second-tier alternating stack (232, 246) can reduced, and performance of the three-dimensional memory array device can be enhanced. Furthermore, the staircase area filled by the second retro-stepped dielectric region 265 is reduced in the first and second embodiments. This improves the planarity of the top of the second retro-stepped dielectric region 265 and simplifies its planarization process.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
a first-tier alternating stack of first insulating layers and first electrically conductive layers located over a substrate;
a first-tier retro-stepped dielectric material portion overlying first stepped surfaces of the first-tier alternating stack;
a second-tier alternating stack of second insulating layers and second electrically conductive layers;
first memory stack structures located in a first memory region in which each layer of the first-tier alternating stack and each layer of the second-tier alternating stack are present, wherein each of the first memory stack structures comprises a respective memory film and a respective vertical semiconductor channel;
a combination of a vertically alternating stack of insulating plates and dielectric material plates and a dielectric wall structure that at least partially laterally surrounds the vertically alternating stack, wherein the combination is located within a contact via region which overlies the first-tier retro-stepped dielectric material portion and which is laterally surrounded by the second-tier alternating stack; and
first contact via structures vertically extending through the vertically alternating stack and through the first-tier retro-stepped dielectric material portion, wherein each of the first contact via structures contacts a corresponding one of the first electrically conductive layers.

2. The three-dimensional memory device of claim 1, wherein each of the first contact via structures contacts sidewalls of the insulating plates and sidewalls of the dielectric material plates.

3. The three-dimensional memory device of claim 1, wherein each of the first contact via structures contacts a respective sidewall of the first retro-stepped dielectric material portion.

4. The three-dimensional memory device of claim 1, wherein a bottommost surface of the vertically alternating stack of the insulating plates and the dielectric material plates contacts a top surface of the first-tier retro-stepped dielectric material portion.

5. The three-dimensional memory device of claim 1, wherein a bottom surface of the dielectric wall structure contacts a top surface of the first-tier retro-stepped dielectric material portion.

6. The three-dimensional memory device of claim 1, wherein:
an entirety of each inner sidewall of the dielectric wall structure is in contact with the vertically alternating stack of the insulating plates and the dielectric material plates; and
an entirety of each outer sidewall of the dielectric wall structure is in contact with the second-tier alternating stack.

7. The three-dimensional memory device of claim 1, further comprising:
a second-tier retro-stepped dielectric material portion overlying second stepped surfaces of the second-tier alternating stack; and
second contact via structures vertically extending through the second-tier retro-stepped dielectric material portion, wherein each of the second contact via structures contacts a corresponding one of the second electrically conductive layers.

8. The three-dimensional memory device of claim 1, further comprising second memory stack structures located in a second memory region in which each layer of the first-tier alternating stack and each layer of the second-tier alternating stack are present, wherein the first memory region and the second memory region are laterally spaced from each other by an inter-array region in which the first-tier retro-stepped dielectric material portion and the dielectric wall structure are located.

9. The three-dimensional memory device of claim 8, wherein each layer within the first-tier alternating stack and the second-tier alternating stack comprises a respective strip portion located within the inter-array region and laterally extending continuously from the first memory array region to the second memory array region.

10. The three-dimensional memory device of claim 9, further comprising:
lower-level metal interconnect structures embedded in lower-level dielectric material layers that are located between the first-tier alternating stack and the substrate; and
laterally-isolated vertical interconnection structures vertically extending through the strip portions of the first-tier alternating stack and the second-tier alternating stack and contacting a respective one of the lower-level metal interconnect structures.

11. The three-dimensional memory device of claim 1, wherein:
the first stepped surfaces comprise vertical steps of the first-tier alternating stack that are laterally spaced apart along a first horizontal direction and vertically offset from each other; and
the three-dimensional memory device further comprises a first backside trench fill structure that laterally extends along the first horizontal direction and contacts each layer within the first-tier alternating stack and the second-tier alternating stack and contacting a sidewall of the first-tier retro-stepped dielectric material portion.

12. The three-dimensional memory device of claim 11, further comprising a second backside trench fill structure that laterally extends along the first horizontal direction, contacting each layer within the first-tier alternating stack and the second-tier alternating stack, and laterally spaced from the first-tier retro-stepped dielectric material portion, wherein the dielectric wall structure is laterally offset from each of the first backside trench fill structure and the second backside trench fill structure.

13. The three-dimensional memory device of claim 1, wherein:
each of the insulating plates has a horizontal surface within a same horizontal plane including a horizontal surface of a respective second insulating layer within the second-tier alternating stack; and
the insulating plates and the second insulating layers have a same material composition.

* * * * *